United States Patent
Pschirer et al.

(10) Patent No.: US 9,595,678 B2
(45) Date of Patent: Mar. 14, 2017

(54) DYE SOLAR CELL WITH IMPROVED STABILITY

(75) Inventors: Neil Gregory Pschirer, Mainz (DE); Ingmar Bruder, Harthausen (DE); Rüdiger Sens, Ludwigshafen (DE); Peter Erk, Frankenthal (DE)

(73) Assignee: BASF SE, Ludwigshafen (DE)

( * ) Notice: Subject to any disclaimer, the term of this patent is extended or adjusted under 35 U.S.C. 154(b) by 778 days.

(21) Appl. No.: 13/183,631

(22) Filed: Jul. 15, 2011

(65) Prior Publication Data

US 2012/0017995 A1 Jan. 26, 2012

Related U.S. Application Data

(60) Provisional application No. 61/366,976, filed on Jul. 23, 2010.

(51) Int. Cl.
| | |
|---|---|
| *H01L 51/46* | (2006.01) |
| *H01L 51/48* | (2006.01) |
| *H01L 51/44* | (2006.01) |
| *H01L 51/00* | (2006.01) |
| *H01L 51/42* | (2006.01) |

(52) U.S. Cl.
CPC ...... *H01L 51/0059* (2013.01); *H01L 51/0061* (2013.01); *H01L 51/0072* (2013.01); *H01L 51/422* (2013.01); *Y02E 10/549* (2013.01)

(58) Field of Classification Search
CPC .............................. Y02E 10/549; Y02E 10/542
See application file for complete search history.

(56) References Cited

U.S. PATENT DOCUMENTS

| | | | | |
|---|---|---|---|---|
| 3,856,586 | A * | 12/1974 | Borchert et al. | 438/133 |
| 4,927,721 | A | 5/1990 | Gratzel et al. | |
| 5,350,644 | A | 9/1994 | Graetzel et al. | |
| 6,288,325 | B1 * | 9/2001 | Jansen et al. | 136/249 |
| 6,359,211 | B1 | 3/2002 | Spitler et al. | |
| 8,563,855 | B2 * | 10/2013 | Pschirer et al. | 136/263 |
| 2006/0008740 | A1 | 1/2006 | Kido et al. | |
| 2006/0049397 | A1 | 3/2006 | Pfeiffer et al. | |
| 2010/0207104 | A1 * | 8/2010 | Schmid et al. | 257/40 |

FOREIGN PATENT DOCUMENTS

| | | |
|---|---|---|
| CN | 101383400 A | 3/2009 |
| DE | 10 2005 053 995 | 5/2007 |

(Continued)

OTHER PUBLICATIONS

Hamwi et al, "p-type doming efficiency of MoO3 in organic hole transport materials," Appl. Phys. Lett., 94, 253307 (2009).*

(Continued)

*Primary Examiner* — Catherine S Branch
(74) *Attorney, Agent, or Firm* — Oblon, McClelland, Maier & Neustadt, L.L.P.

(57) ABSTRACT

A photovoltaic element (110) is proposed for conversion of electromagnetic radiation to electrical energy. The photovoltaic element (110) may especially be a dye solar cell (112). The photovoltaic element (110) has at least one first electrode (116), at least one n-semiconductive metal oxide (120), at least one electromagnetic radiation-absorbing dye (122), at least one solid organic p-semiconductor (126) and at least one second electrode (132). The p-semiconductor (126) comprises at least one metal oxide (130).

20 Claims, 3 Drawing Sheets

(56) References Cited

FOREIGN PATENT DOCUMENTS

| DE | 10 2007 023 876 | | 9/2008 |
|---|---|---|---|
| DE | 10 2007 024 153 | | 10/2008 |
| EP | 1 176 646 | | 1/2002 |
| EP | 1 530 245 | A2 | 5/2005 |
| EP | 1 617 493 | A2 | 1/2006 |
| JP | 2006-24791 | A | 1/2006 |
| JP | 2006-114521 | A | 4/2006 |
| JP | 2009-76929 | A | 4/2009 |
| WO | WO 02/101838 | | 12/2002 |
| WO | WO 2005/031798 | A2 | 4/2005 |
| WO | WO 2007/054470 | | 5/2007 |
| WO | WO 2008128503 | A1 * | 10/2008 |
| WO | WO 2009013282 | A1 * | 1/2009 |
| WO | WO 2009/070534 | A1 | 6/2009 |
| WO | WO 2010/031833 | A1 | 3/2010 |

OTHER PUBLICATIONS

Machine translation of JP 2006-114521. (original submitted by Applicant).*
U.S. Appl. No. 13/331,647, filed Dec. 20, 2011, Pschirer, et al.
Michael Graetzel; "Dye-sensitized solar cells"; Journal of Photochemistry and Photobiology C: Photochemistry Reviews, 2003, 4, pp. 145-153.
Yasuo Chiba et al.; "Dye-Sensitized Solar Cells with Conversion Efficiency of 11.1%"; 2006, Japanese Journal of Applied Physics, vol. 45, No. 25, pp. L638-L640.
Henry J. Snaith et al.; "Ion-Coordinating Sensitizer in Solid-State Hybrid Solar Cells"; Angewandte Chem. Int. Ed., 2005, 44, pp. 6413-6417.
Changneng Zhang et al.; "Improved performance of solid-state dye-sensitized solar cells with p/p-type nanocomposite electrolyte"; Journal of Photochemistry and Photobiology A: Chemistry, 2007, 189, pp. 329-333.
Jessica Krueger et al.; "High efficiency solid-state photovoltaic device due to inhibition of interface charge recombination"; Applied Physics Letters, 2001, vol. 79, No. 13, pp. 2085-2087.
Lukas Schmidt-Mende et al.; "Organic Dye for Highly Efficient Solid-State Dye-Sensitized Solar Cells"; Advanced Materials, 2005, 17, No. 7, pp. 813-815.
K. Peter et al.; "Dual-functional materials for interface modifications in solid-state dye-sensitised TiO$_2$ solar cells"; Appl. Phys. A, 2004, 79, pp. 65-71.
Jessica E. Kroeze et al.; "Parameters Influencing Charge Separation in Solid-State Dye-Sensitized Solar Cells Using Novel Hole Conductors"; Adv. Funct. Mater., 2006, 16, pp. 1832-1838.
Udo Bach; "Solid-State Dye-Sensitized Mesoporous TiO$_2$ Solar Cells"; EPFL Lausanne Thèse N° 2187, 2000, pp. 1-158.
Francisco Fabregat-Santiago et al.; "Electron Transport and Recombination in Solid-State Dye Solar Cell with Spiro-OMeTAD as Hole Conductor"; J. Am. Chem. Soc., 2009, 131, pp. 558-562.
Nathalie Rossier-Iten; "Solid Hybrid Dye-Sensitized Solar Cells: New Organic Materials, Charge Recombination and Stability"; EPFL Lausanne Thèse N° 3457, 2006, pp. 1-113.
Henry J. Snaith et al.; "Enhanced charge mobility in a molecular hole transporter via addition of redox inactive ionic dopant: Implication to dye-sensitized solar cells"; Applied Physics Letters, 2006, 89, pp. 262114-1-262114-3.
Keng-Hoong Yim et al.; "Controlling Electrical Properties of Conjugated Polymers via a Solution-Based p-Type Doping"; Advanced Materials, 2008, 20, pp. 3319-3324.
Yuan Zhang et al.; "Controllable Molecular Doping and Charge Transport in Solution-Processed Polymer Semiconducting Layers"; Advanced Functional Materials, 2009, 19, pp. 1901-1905.

Chi Yueh Kao et al.; "Doping of Conjugated Polythiophenes with Alkyl Silanes"; Advanced Functional Materials, 2009, 19, pp. 1906-1911.
Jiangbin Xia et al.; "Influence of Doped Anions on Poly(3,4-ethylenedioxythiophene) as Hole Conductors for Iodine-Free Solid-State Dye-Sensitized Solar Cells"; J. Am. Chem. Soc., 2008, 130, pp. 1258-1263.
Dong-Seok Leem et al.; "Low driving voltage and high stability organic light-emitting diodes with rhenium oxide-doped hole transporting layer"; Applied Physics Letters, 2007, 91, pp. 011113-1~011113-3.
Jae-Hyun Lee et al.; "High performance top-emitting organic light-emitting diodes with copper iodide-doped hole injection layer"; Organic Elements, 2008, 9, pp. 805-808.
Jae-Hyun Lee et al.; "Effectiveness of p-dopants in an organic hole transporting material"; Applied Physics Letters, 2009, 94, pp. 123306 (1-3).
Yabing Qi et al.; "A Molybdenum Dithiolene Complex as p-Dopant for Hole-Transport Materials: A Multitechnique Experimental and Theoretical Investigation"; Chem. Mater., 2010, 22, pp. 524-531.
Michael Kroeger et al.; "P-type doping of organic wide band gap materials by transition metal oxides: A case-study on Molybdenum trioxide"; Organic Electronics, 2009, 10, pp. 932-938.
Kaname Kanai et al.; "Electronic structure of anode interface with molybdenum oxide buffer layer"; Organic Electronics, 2010, 11, pp. 188-194.
Vishal Shrotriya et al.; "Transition metal oxides as the buffer layer for polymer photovoltaic cells"; Applied Physics Letters, 2006, 88, pp. 073508-1~073508-3.
Fengmin Liu et al.; "Efficient polymer photovoltaic cells using solution-processed MoO$_3$ as anode buffer layer"; Solar Energy Materials & Solar Cells, 2010, 94, pp. 842-845.
Sami Hamwi et al.; "The Role of Transition Metal Oxides in Charge-Generation Layers for Stacked Organic Light-Emitting Diodes"; Advanced Functional Materials, 2010, 20, pp. 1762-1766.
Bin Peng et al.; "Systematic investigation of the role of compact TiO$_2$ layer in solid state dye-sensitized TiO$_2$ solar cells"; Coordination Chemistry Reviews; 2004, 248, pp. 1479-1489.
Brian O'Regan et al.; "A low-cost, high-efficiency solar cell based on dye-sensitized colloidal TiO$_2$ films"; Nature, 1991, vol. 353, No. 6346, pp. 737-740.
U. Bach et al.; "Solid-state dye-sensitized mesoporous TiO$_2$ solar cells with high photon-to-electron conversion efficiencies"; Nature, 1998, vol. 395, pp. 683-686.
Guangliang Zhang et al.; "High efficiency and stable dye-sensitized solar cells with an organic chromophore featuring a binary π-conjugated spacer"; Chem. Commun., 2009, pp. 2198-2200.
Ute B. Cappel et al.; "A Broadly Absorbing Perylene Dye for Solid-State Dye-Sensitized Solar Cells"; The Journal of Physical Chemistry C Letters, 2009, 113, pp. 14595-14597.
V.P.S. Perera et al.; "Dye-Sensitized Solid-State Photovoltaic Cells Based on Dye Multilayer-Semiconductor Nanostructures"; J. Phys. Chem. B, 2003, 107, pp. 13758-13761.
G.R.A. Kumara et al.; "Fabrication of Dye-Sensitized Solar Cells Using Triethylamine Hydrothiocyanate as a CuI Crystal Growth Inhibitor"; Langmuir, 2002, 18, pp. 10493-10495.
Tobat P.I. Saragi et al.; "Comparison of Charge-Carrier Transport in Thin Films of Spiro-Linked Compounds and Their Corresponding Parent Compounds"; Adv. Funct. Mater., 2006, 16, pp. 966-974.
U.S. Appl. No. 13/357,233, filed Jan. 24, 2012, Kuhn, et al.
Office Action issued Mar. 2, 2015 in Japanese Patent Application No. 2013-521255 (submitting English translation only).
Second Office Action issued Dec. 28, 2015 in Chinese Patent Application No. 201180035997.9 with English translation.
Patent Examination Report No. 2 issued Mar. 10, 2016 in Australian Patent Application No. 2011281207.
Extended European Search Report issued May 18, 2016 in Patent Application No. 11809352.5.

* cited by examiner

DYE SOLAR CELL WITH IMPROVED STABILITY

FIELD OF THE INVENTION

The invention relates to a photovoltaic element, to a process for production of a solid organic p-semiconductor for use in an organic component, and to a process for production of a photovoltaic element. Such photovoltaic elements and processes are used to convert electromagnetic radiation, especially sunlight, to electrical energy. More particularly, the invention can be applied to dye solar cells.

STATE OF THE ART

The direct conversion of solar energy to electrical energy in solar cells is based generally on what is called the "internal photo effect" of a semiconductor material, i.e. the production of electron-hole pairs by absorption of photons and the separation of the negative and positive charge carriers at a p-n junction or a Schottky contact. In this way, a photovoltage is generated, which, in an external circuit, can cause a photocurrent through which the solar cell releases its power. The semiconductor can generally only absorb those photons which have an energy greater than the bandgap thereof. The size of the semiconductor bandgap thus generally determines the proportion of sunlight which can be converted to electrical energy.

Solar cells based on crystalline silicon were produced as early as the 1950s. The technology at that time was supported by use in space satellites. Even though silicon-based solar cells now dominate the market on Earth, this technology still remains costly. Attempts are therefore being made to develop new approaches which are less expensive. Some of these approaches will be outlined hereinafter, which constitute the basis of the present invention.

An important approach to the development of new solar cells is that of organic solar cells, i.e. solar cells which comprise at least one organic semiconductor material, or solar cells which, instead of solid inorganic semiconductors, comprise other materials, especially organic dyes or even liquid electrolytes and semiconductors. A special case among the innovative solar cells is that of dye solar cells. The dye solar cell (DSC) is one of the most efficient alternative solar cell technologies to date. In a liquid variant of this technology, efficiencies of up to 11% are currently being achieved (see, for example, Grätzel M. et al., J. Photochem. Photobio. C, 2003, 4, 145; Chiba et al., Japanese Journal of Appl. Phys., 2006, 45, L638-L640).

Dye solar cells, of which there are now several variants, generally have two electrodes, at least one of which is transparent. According to their function, the two electrodes are referred to as "working electrode" (also "anode", generation of electrons) and "counterelectrode" (also "cathode"). On the working electrode or in the vicinity thereof, an n-conductive metal oxide has generally been applied, especially as a porous, for example nanoporous, layer, for example a nanoporous titanium dioxide ($TiO_2$) layer of thickness approx. 10-20 μm. Between the layer of the n-conductive metal oxide and the working electrode, it is additionally possible for at least one blocking layer to be provided, for example an impervious layer of a metal oxide, for example $TiO_2$. The n-conductive metal oxide generally has an added light-sensitive dye. For example, on the surface of the n-conductive metal oxide, a monolayer of a light-sensitive dye (for example a ruthenium complex) may be adsorbed, which can be converted to an excited state by absorption of light. At or on the counterelectrode, it is frequently a catalytic layer of a few μm in thickness, for example platinum. The area between the two electrodes in the conventional dye solar cell is generally filled with a redox electrolyte, for example a solution of iodine ($I_2$) and/or potassium iodide (KI).

The function of the dye solar cell is based on absorption of light by the dye. From the excited dye, electrons are transferred to the n-semiconductive metal oxide semiconductor and migrate thereon to the anode, whereas the electrolyte ensures charge balance via the cathode. The n-semiconductive metal oxide, the dye and the electrolyte are thus the essential constituents of the dye solar cell.

However, the dye solar cell produced with liquid electrolyte in many cases suffers from nonoptimal sealing, which can lead to stability problems. The liquid redox electrolyte can especially be replaced by a solid p-semiconductor. Such solid dye solar cells are also referred to as sDSCs (solid DSCs). The efficiency of the solid variant of the dye solar cell is currently approx. 4.6-4.7% (Snaith, H., Angew. Chem. Int. Ed., 2005, 44, 6413-6417).

Various inorganic p-semiconductors such as CuI, CuBr.3 ($S(C_4H_9)_2$) or CuSCN have been used to date in dye solar cells in place of the redox electrolyte. It is also possible, for example, to apply findings from photosynthesis. In nature too, it is the Cu(I) enzyme plastocyanine which, in photosystem I, reduces the oxidized chlorophyll dimer again. Such p-semiconductors can be processed by means of at least three different methods, namely: from a solution, by electrodeposition or by laser deposition.

Organic polymers have also already been used as solid p-semiconductors. Examples thereof include polypyrrole, poly(3,4-ethylenedioxythiophene), carbazole-based polymers, polyaniline, poly(4-undecyl-2,2'-bithiophene), poly(3-octylthiophene), poly(triphenyldiamine) and poly(N-vinylcarbazole). In the case of poly(N-vinylcarbazole), the efficiencies extend up to 2%. PEDOT (poly(3,4-ethylenedioxythiophene) polymerized in situ also showed an efficiency of 0.53%. The polymers described here are typically not used in pure form, but rather with additives.

Inorganic-organic mixed systems have also already been used in place of the redox electrolyte in dye solar cells. For example, CuI was used together with PEDOT:PSS as a hole conductor in sDSC (Zhang J. Photochem: Photobio., 2007, 189, 329).

It is also possible to use low molecular weight organic p-semiconductors, i.e. nonpolymerized, for example monomeric or else oligomeric, organic p-semiconductors. The first use of a low molecular weight p-semiconductor in solid dye solar cells replaced the liquid electrolyte with a vapor-deposited layer of triphenylamine (TPD). The use of the organic compound 2,2',7,7'-tetrakis(N,N-di-p-methoxyphenylamine)-9,9'-spiro-bifluorene (spiro-MeOTAD) in dye solar cells was reported in 1998. It can be introduced from a solution and has a relatively high glass transition temperature, which prevents unwanted crystallization and poor contact to the dye. The methoxy groups adjust the oxidation potential of spiro-MeOTAD such that the Ru complex can be regenerated efficiently. In the case of use of spiro-MeOTAD alone as a p-semiconductor, a maximum IPCE (incident photon to current conversion efficiency, external photon conversion efficiency) of 5% was found. When $N(PhBr)_3$ $SbCl_6$ as a dopant, and $Li[CF_3SO_2)_2N]$ were also used, the IPCE rose to 33%, and the efficiency was 0.74%. The use of tert-butylpyridine as a solid p-semiconductor increased the efficiency to 2.56%, with an open-circuit voltage ($V_{oc}$) of approx. 910 mV and a short-circuit current $I_{SC}$ of approx. 5 mA at an active area of approx. 1.07 cm² (see Krüger et al., Appl. Phys. Lett., 2001, 79, 2085). Dyes which achieved better coverage of the TiO₂ layer and which have good wetting on spiro-MeOTAD show efficiencies of more than 4%. Even better efficiencies (approx. 4.6%) were reported when the ruthenium complex was equipped with oxyethylene side chains.

L. Schmidt-Mende et al, Adv. Mater. 17, p. 813-815 (2005) proposed an indoline dye for dye solar cells with spirobifluorenes as the amorphous organic p-conductor. This organic dye, which has an extinction coefficient four times higher than a ruthenium complex, exhibits a high efficiency (4.1% at one sun) in solid dye solar cells. In addition, a concept was presented, in which polymeric p-semiconductors are bonded directly to an Ru dye (Peter, K., Appl. Phys. A. 2004, 79, 65). Durrant et al. Adv. Munc. Mater. 2006, 16, 1832-1838 state that, in many cases, the photocurrent is directly dependent on the yield at the hole transition from the oxidized dye to the solid p-conductor. This depends on two factors: firstly on the degree of penetration of the p-semiconductor into the oxide pores, and secondly on the thermodynamic driving force for the charge transfer (i.e. especially the difference in the free enthalpy AG between dye and p-conductor).

One disadvantage of the dye solar cell is that the proportion of light which can be used by the dye is generally limited by the energetic distance between the Fermi energies of the n- and p-conductors used. The photovoltage is generally also limited by this distance. In addition, dye solar cells generally have to be comparatively thin due to the charge transport required (for example 1-2.5 micrometers), such that the exploitation of the incident light is generally not optimal.

The electric and photoelectric properties of dye solar cells with different low molecular weight p-semiconductors has been examined in various further studies. One example thereof can be found in U. Bach, thesis, EPFL Lausanne, 2000 (Thesis No. 2187), and therein especially at pages 139-149. One feature examined here is the conductivity of spiro-MeOTAD, which is very low. For instance, in films with a layer thickness of approx. 2 micrometers, resistivities of MΩ/cm² were measured. The conductivity κ is defined by $$\kappa = \mu N_h e \qquad (1)$$

In this formula, $e=1.6022 \times 10^{-19}$ C, the elementary charge of an electron or hole. $\mu$ denotes the charge carrier mobility, and $N_h$ the charge density, in this case of the holes. Assuming that the mobility does not change, in the case of a p-material, the conductivity rises as a result of the addition of further holes, i.e. in the case of p-doping. The result of this is that the fill factors of sDSCs are not very high, in particular at light intensities which are not low. The fill factor in photovoltaics generally refers to the quotient of the maximum power of a solar cell at the point of maximum power and the product of the open-circuit voltage and the short-circuit current. In the current-voltage diagram, the fill factor can frequently be described as the area ratio of a maximum rectangle inscribed below the current-voltage curve to a minimum rectangle which encloses the curve. The fill factor is unitless. A low fill factor generally indicates that some of the power generated is being lost because of the internal resistance of the cell. In the above-described case of spiro-MeOTAD, the comparatively low fill factors are thus explained especially by the high specific resistivity of the spiro-MeOTAD, as also described, for example, in F. Fabregat-Santiago et al., J. Am. Chem. Soc., 2009, 131 (2), 558-562, especially at an illumination of one sun.

The prior art also discloses doping of low molecular weight organic p-semiconductors. For example, in U. Bach, thesis, EPFL Lansanne, 2000 (Thesis No. 2187), p. 37-50, antimony salts are used as dopants for spiro-MeOTAD. The doping operation can be described chemically as follows:

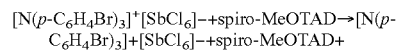

A concentration of 0.26-0.33 mM Sb was used, with a proportion of 0.17-0.18 M of Spiro compounds. Even though the conductivity rises, the hole mobility was reduced as a result of the addition of the anions, which worsen the charge transport. In addition, the stability of such antimony salts in the cells was questioned.

N. Rossier-Iten, thesis, EPFL Lausanne, 2006 Thesis No. 3457), especially p. 56-75 and p. 91-113, also examined various doped hole conductor materials. The dopants used for an amorphous hole conductor in sDSCs therein included I₂, 2,3-dichloro-5,6-dicyano-1,4-benzoquinone, NOBF₄, and also a doped spiro diradical cation (spiro-MeOTAD++ [PF₆—]₂ (0.1-0.7%). However, a decisive improvement in the sDSC cells was not achieved.

In Snaith et al., Appl. Phys. Lett. 2006, 89, 262114-262116, it was found that the mobilities of holes in sDSCs are greatly improved by the addition of lithium bis(trifluoromethylsulfonyl)amine (Li-TFSI). Thus, it was possible to increase the mobilities from $1.6 \times 10^{-4}$ cm²/Vs to $1.6 \times 10^{-3}$ cm²/Vs, even though no oxidation of spiro-MeOTAD is observed here, i.e. no actual doping effect. It was found that the conductivity of spiro-MeOTAD is influenced to a lesser extent by the antimony salt, and that the best sDSC cells are even achieved without such a salt, since the anions act as what are called Coulomb traps (charge carrier traps).

Typically, an amount of more than 1 mol % of dopant is required in order to improve the charge mobility of an amorphous p-conductor.

Organic p-dopants, for example F4-TCNQ (tetrafluorotetracyanoquinodimethane) have also already been used with organic polymers of the p type (see, for example, R. Friend et al., Adv. Mater., 2008, 20, 3319-3324, Zhang et al., Adv. Funct. Mater., 2009, 19, 1901-1905). What is called protic doping of polythiophene by alkylsilanes has also been reported (see Podzorov et al., Advanced Functional Materials 2009, 19, 1906-1911). Components with organic dopants, however, have comparatively low lifetimes in many cases.

It is additionally known that SnCl₅ and FeCl₃ are also usable as p-dopants. In addition, polymers, such as PEDOT, doped with LiCF₃SO₃, LiBF₄, LiTFSI and LiClO₄, for example, have also been used as hole conductors in sDSCs. In the case of such components too, however, comparatively low external power efficiencies of up to 2.85% were recorded (Yanagida et al., JACS, 2008, 130, 1258-1263).

In addition, the use of metal oxides as dopants is also known from the prior art, for example from DE 10 2007 024 153 A1 or DE 10 2007 023 876 A1. Metal oxides are vapor-deposited in organic layers and serve as dopants therein. An example mentioned is that of phenanthroline derivatives as a complex-forming matrix material, which are doped, for example, with rhenium oxides.

In addition, studies on the doping of organic p-transport materials for organic light-emitting diodes by means of vapor-deposited inorganic compounds are also known, for example from Kim et al., Appl. Phys. Lett. 2007, 91, 011113(1-3). Here, for example, NPB was doped with ReO₃ (8-25%), which led to lower use voltages (turn-on voltages) and higher power efficiencies. The stability of the OLEDs was likewise improved. Kim et al, Org. Elec. 2008, 805-808 state that hole injection layers have been doped with CuI. This doping too led to higher current efficiencies and energy efficiencies. Kim et al., Appl. Phys. Lett. 2009, 94, 123306 (1-3) compare CuI, $MoO_3$ and $ReO_3$ as dopants for organic light-emitting diodes (OLEDs) A trend is found here to the effect that the energy difference between the HOMO (highest occupied molecular orbital) of the organic p-semiconductor and the Fermi level of the dopants plays an important role. Overall, it was found that the dopants increase the charge carrier densities and hence the conductivities in the transport layers, which is equivalent to p-doping.

Kahn et al., Chem. Mater. 2010, 22, 524-531 also discloses that molybdenum dithiolene $(Mo(tfd)_3)$ in a concentration of 0-3.8 mol % can dope various hole conductors. By means of UPS experiments (UV photoelectron spectroscopy), it was shown that the Fermi level of the hole conductor has been shifted in the direction of the HOMO, which is an indication of p-doping.

Kowalsky et al., Org. Elec. 2009, 10, 932-938 report that $Mo_3O_9$ clusters of vapor-deposited $MoO_3$ probably arise, and can also play a role in doping. In addition, the Fermi level (6.86 eV) and the electron affinity (6.7 eV) were measured at a much lower level that previously assumed. It was also speculated (cf. Kanai et al., Organic Electronics 2010, 11, 188-194) that $MoO_3$ layers can readily be n-doped by oxygen defect sites, which leads to an improved alignment of the bands with respect to one another.

The use of pure layers of metal oxides, for example $MoO_3$ and $V_2O_5$, is also described for OLEDs and for organic solar cells, in order to improve hole injection or hole extraction from the/into the electrode. For example, Y. Yang et al, Appl. Phys. Lett. 2006, 88, 073508 examine the use of $V_2O_5$, $MoO_3$ and PEDOT:PSS as an intermediate layer between ITO (indium tin oxide) and a p-type polymer. In what are called inverted polymer cells too, in which holes should migrate from the p-type polymer into the cathode (in this case generally Ag), a $VO_x$ layer was vapor-deposited between the polymer and the silver, which led to an improvement in the properties of the cell.

In addition, the production of metal oxide buffer layers from an aqueous solution is also known. For example, Liu SESMC, 2010, 842-845, vol. 94 states that $MoO_3$ layers have been used successfully as a buffer layer on the anode in polymer solar cells. Such layers have also been used as part of a charge recombination layer in what are called organic tandem solar cells (see, for example, Kowalsky et al., Adv. Func. Mater. 2010, 20, 1762-1766).

Since no efficient, soluble and stable p-dopant for hole transport materials is yet known in general terms, in the last few years, dye solar cells have in practice been stored under air (ambient conditions) in many cases. Oxygen which penetrates into the sDSCs in the course thereof dopes the sDSC. The storage of cells in an ambient atmosphere or in a controlled $O_2$ atmosphere is, however, less reproducible and comparatively problematic with regard to commercial production of solar modules. In addition, sDSCs doped with oxygen in this way are typically comparatively unstable, even in the sealed state.

OBJECT OF THE INVENTION

It is therefore an object of the present invention to provide a photovoltaic element and a process for producing a photovoltaic element, which at least substantially avoid the disadvantages of known photovoltaic elements and production processes. More particularly, a photovoltaic element will be specified, which has a p-semiconductor with a high conductivity, as will a process for doping p-semiconductors and a stable p-dopant which, even with exclusion of oxygen, brings about stable p-doping of organic materials for dye solar cells. At the same time, a dye solar cell which is stable even in the encapsulated state and has a high efficiency and a high fill factor would be desirable, nevertheless being simple to produce.

DISCLOSURE OF THE INVENTION

This object is achieved by the invention with the features of the independent claims. Advantageous developments, which can be implemented individually or in any combination, are described in the dependent claims.

It has been found in the context of the present invention that, surprisingly, p-doping, especially in dye solar cells, can be achieved particularly efficiently by the use of metal oxides. These can be applied especially in a liquid phase by means of one or more organic solvents, together with a p-semiconductive matrix material and optionally one or more organic salts. In this way, it is possible to achieve photovoltaic elements with high fill factors and a high long-term stability.

In a first aspect of the present invention, a photovoltaic element for conversion of electromagnetic radiation to electrical energy is proposed. The photovoltaic element may especially comprise one or more photovoltaic cells. The photovoltaic element may especially comprise at least one layer structure which may be applied, for example, to a substrate. The photovoltaic element may especially comprise at least one dye solar cell and/or be configured as a dye solar cell.

The photovoltaic element has at least one first electrode, at least one n-semiconductive metal oxide, at least one electromagnetic radiation-absorbing dye, at least one solid organic p-semiconductor and at least one second electrode. It is proposed that the p-semiconductor comprises at least one metal oxide.

The elements described may be provided especially in the sequence described. For example, the photovoltaic element may comprise, in the sequence described, the at least one first electrode, the at least one n-semiconductive metal oxide, the at least one electromagnetic radiation-absorbing dye, the at least one solid organic p-semiconductor and the at least one second electrode. However, the dye and the n-semiconductive metal oxide may also be completely or partially combined, as is customary in dye solar cells. For example, the n-semiconductive metal oxide may be completely or partially impregnated with the at least one dye, or mixed with this dye in some other way. In this way and/or in some other way, the n-semiconductive metal oxide can especially be sensitized with the dye, such that, for example, dye molecules can be applied as a monolayer to particles of the n-semiconductive metal oxide. For example, a direct contact may exist between the dye molecules and the n-semiconductive metal oxide, such that transfer of charge carriers is possible. The photovoltaic element may especially comprise at least one layer of the n-semiconductive metal oxide, optionally with the dye, and at least one layer of the solid organic p-semiconductor. This layer structure may be embedded between the electrodes. In addition, the photovoltaic element may comprise one or more further layers. For example, one or more further layers may be introduced between the first electrode and the n-semiconductive metal oxide, for example one or more buffer layers, for example layers of a metal oxide. While the buffer layer is preferably impervious, the n-semiconductive metal oxide may especially be porous and/or particulate. More particularly, the n-semiconductive metal oxide, as will be described in detail hereinafter, may be configured as a nanoparticulate layer. In addition, it is also possible for one or more further layers to be provided between the n-semiconductive metal oxide and the solid organic p-semiconductor, and also optionally for one or more further layers to be provided between the p-semiconductor and the second electrode.

The p-semiconductor may especially be p-doped by the metal oxide. This means that the p-conductive properties of the p-semiconductor are obtained or enhanced by the metal oxide. More particularly, the metal oxide may be set up to dope the p-semiconductor or a matrix material present in this p-semiconductor. For example, the p-semiconductor may comprise at least one organic matrix material, in which case the metal oxide has been mixed into the matrix material. This mixing can especially be effected in the form of a dispersion. Alternatively or additionally, the metal oxide may also be present dissolved in the matrix material, which shall likewise be encompassed by the term "mixing". The metal oxide may be present in the p-semiconductor in a ratio especially of 0.1% to 15%, especially in a ratio of 0.5% to 5%, especially in a ratio of 1% to 5% and more preferably in a ratio of 2 to 3%, for example 2.5%. These ratios are based on the proportion by weight of the matrix material. The metal oxide is preferably distributed homogeneously or at least essentially homogeneously within the matrix material. An essentially homogeneous distribution may be understood, for example, to mean a distribution of the metal oxide in which different regions of the p-semiconductor have concentrations of the metal oxide which differ from one another by not more than 50%, especially by not more than 30% and more preferably by not more than 10%. In other words, the homogeneous distribution of the metal oxide in the matrix material should preferably have variations which do not exceed the concentration variations mentioned.

The matrix material may in principle comprise one or more p-semiconductive monomeric, oligomeric or polymeric organic materials. More particularly, the matrix material may have at least one low molecular weight organic p-semiconductor. A low molecular weight material is generally understood to mean a material which is present in monomeric, nonpolymerized or nonoligomerized form. For example, the low molecular weight substances may have molecular weights of 500-2000 g/mol. These low molecular weight organic p-semiconductors may especially form the abovementioned matrix material and may intrinsically have p-semiconductive properties. In general, in the context of the present invention, p-semiconductive properties are understood to mean the property of materials, especially of organic molecules, to form holes and to transport these holes and to pass them on to adjacent molecules. More particularly, stable oxidation of these molecules should be possible. In addition, the low molecular weight organic p-semiconductors mentioned may especially have an extensive π-electron system. More particularly, the at least one low molecular weight p-semiconductor may be processable from a solution. The low molecular weight p-semiconductor may especially comprise at least one triphenylamine. It is particularly preferred when the low molecular weight organic p-semiconductor comprises at least one spiro compound. A spiro compound is understood to mean polycyclic organic compounds whose rings are joined only at one atom, which is also referred to as the spiro atom. More particularly, the spiro atom may be spa-hybridized, such that the constituents of the Spiro compound connected to one another via the Spiro atom are, for example, arranged in different planes with respect to one another.

It is particularly preferred when the low molecular weight organic p-semiconductor or the matrix material thereof comprises at least one spiro compound, for example spiro-MeOTAD and/or at least one Spiro derivative. Alternatively or additionally, it is also possible to use other p-semiconductive compounds, especially low molecular weight and/or oligomeric and/or polymeric p-semiconductive compounds, for example one or more of the following compounds:

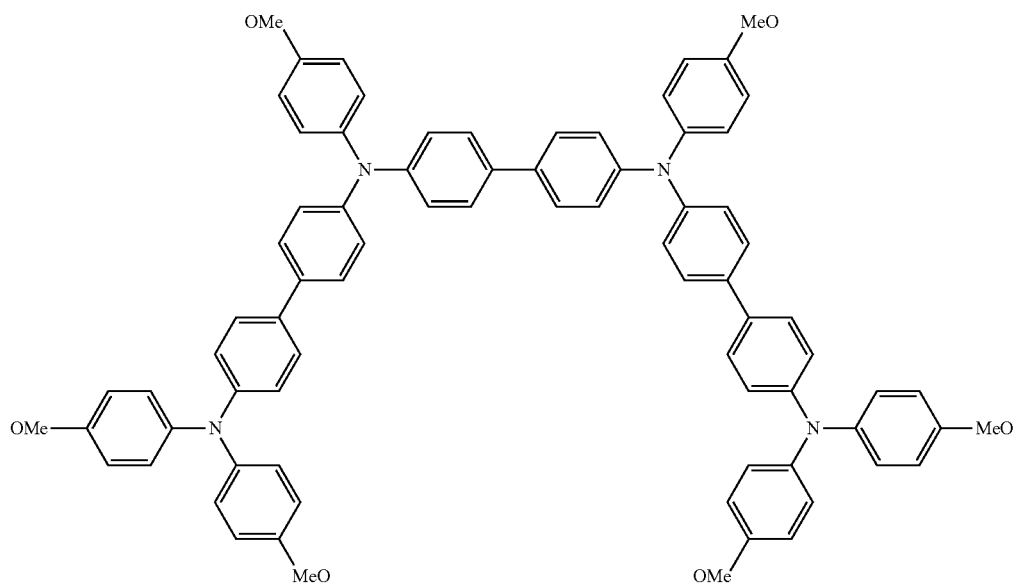

-continued

ID522

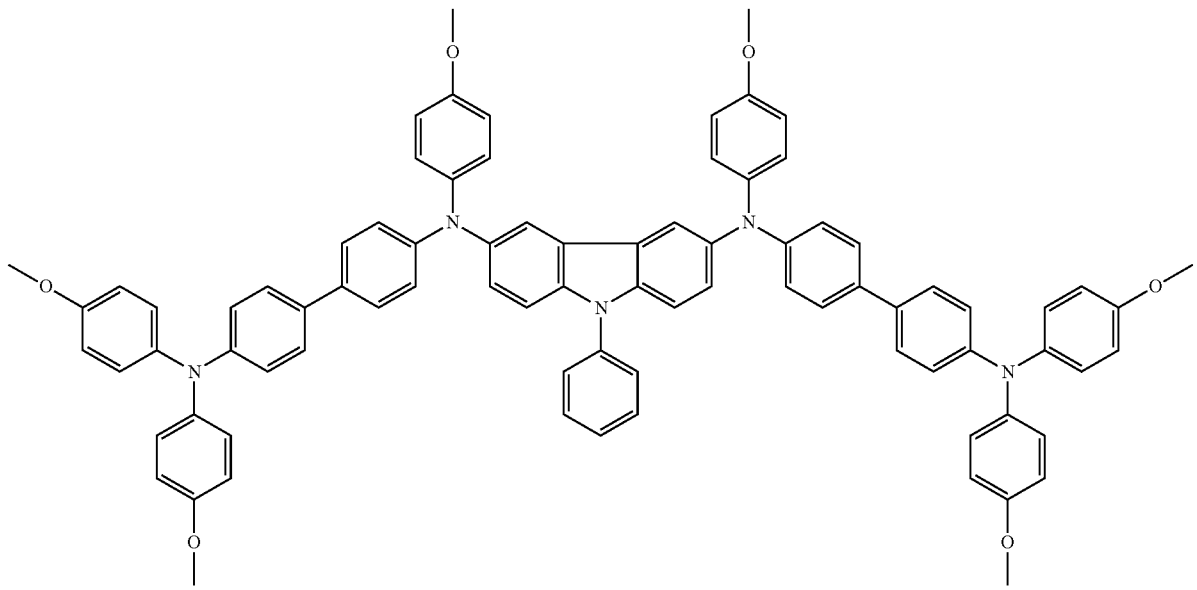

Again alternatively or additionally, the low molecular weight organic p-semiconductor or the matrix material may comprise one or more compounds of the general formula I, for which reference may be made, for example, to PCT application number PCT/EP2010/051826, which will be published after the priority date of the present application:

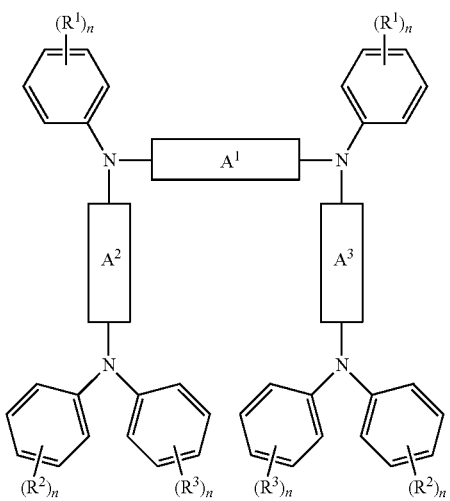

(I)

in which
$A^1$, $A^2$, $A^3$ are each independently divalent organic units which may comprise one, two or three optionally substituted aromatic or heteroaromatic groups, where, in the case of two or three aromatic or heteroaromatic groups, two of these groups in each case are joined to one another by a chemical bond and/or via a divalent alkyl radical,
$R^1$, $R^2$, $R^3$ are each independently R, OR, $NR_2$, $A^3$-OR or $A^3$-$NR_2$ substituents,
R is alkyl, aryl or a monovalent organic radical which may comprise one, two or three optionally substituted aromatic or heteroaromatic groups, where, in the case of two or three aromatic or heteroaromatic groups, two of these groups in each case are joined to one another by a chemical bond and/or via a divalent alkyl or NR' radical,
R" is alkyl, aryl or a monovalent organic radical which may comprise one, two or three optionally substituted aromatic or heteroaromatic groups, where, in the case of two or three aromatic or heteroaromatic groups, two of these groups in each case are joined to one another by a chemical bond and/or via a divalent alkyl radical,
and
n at each instance in formula I is independently 0, 1, 2 or 3, with the proviso that the sum of the individual values n is at least 2 and at least two of the $R^1$, $R^2$ and $R^3$ radicals are OR and/or $NR_2$ substituents.

Alkyl is understood to mean substituted or unsubstituted $C_1$-$C_{20}$-alkyl radicals. Preference is given to $C_1$- to $C_{10}$-alkyl radicals, particular preference to $C_1$- to $C_8$-alkyl radicals. The alkyl radicals may be either straight-chain or branched. In addition, the alkyl radicals may be substituted by one or more substituents selected from the group consisting of $C_1$-$C_{20}$-alkoxy, halogen, preferably F, and $C_6$-$C_{30}$-aryl which may in turn be substituted or unsubstituted. Examples of suitable alkyl groups are methyl, ethyl, propyl, butyl, pentyl, hexyl, heptyl and octyl, and also derivatives of the alkyl groups mentioned substituted by $C_6$-$C_{30}$-aryl, $C_1$-$C_{20}$-alkoxy and/or halogen, especially F, for example $CF_3$. Examples of linear and branched alkyl radicals are methyl, ethyl, propyl, butyl, pentyl, hexyl, heptyl and octyl, and also isopropyl, isobutyl, isopentyl, sec-butyl, tert-butyl, neopentyl, 3,3-dimethylbutyl, 2-ethylhexyl.

Divalent alkyl radicals in the $A^1$, $A^2$, $A^3$, R, R', $R^4$, $R^5$, $R^6$, $R^7$, $R^8$ and $R^9$ units derive from the aforementioned alkyl by formal removal of a further hydrogen atom.

Suitable aryls are $C_6$-$C_{30}$-aryl radicals which are derived from monocyclic, bicyclic or tricyclic aromatics and do not comprise any ring heteroatoms. When the aryls are not monocyclic systems, in the case of the term "aryl" for the second ring, the saturated form (perhydro form) or the partly unsaturated form (for example the dihydro form or tetrahydro form), provided the particular forms are known and stable, is also possible. The term "aryl" in the context of the present invention thus comprises, for example, also bicyclic or tricyclic radicals in which either both or all three radicals are aromatic, and also bicyclic or tricyclic radicals in which only one ring is aromatic, and also tricyclic radicals in which two rings are aromatic. Examples of aryl are: phenyl, naphthyl, indanyl, 1,2-dihydronaphthenyl, 1,4-dihydronaphthenyl, fluorenyl, indenyl, anthracenyl, phenanthrenyl or 1,2,3,4-tetrahydronaphthyl. Particular preference is given to $C_6$-$C_{10}$-aryl radicals, for example phenyl or naphthyl, very particular preference to $C_6$-aryl radicals, for example phenyl.

Aromatic groups in the $A^1$, $A^2$, $A^3$, R, R', $R^4$, $R^5$, $R^6$, $R^7$, $R^8$ and $R^9$ units derive from the aforementioned aryl by formal removal of one or more further hydrogen atoms.

Heteroaromatic groups in the $A^1$, $A^2$, $A^3$, R, R', $R^4$, $R^5$, $R^6$, $R^7$, $R^8$ and $R^9$ units derive from hetaryl radicals by formal removal of one or more further hydrogen atoms.

The parent hetaryl radicals here are unsubstituted or substituted and comprise 5 to 30 ring atoms. They may be monocyclic, bicyclic or tricyclic, and some can be derived from the aforementioned aryl by replacing at least one carbon atom in the aryl base skeleton with a heteroatom. Preferred heteroatoms are N, O and S. The hetaryl radicals more preferably have 5 to 13 ring atoms. The base skeleton of the heteroaryl radicals is especially preferably selected from systems such as pyridine and five-membered heteroaromatics such as thiophene, pyrrole, imidazole or furan. These base skeletons may optionally be fused to one or two six-membered aromatic radicals. Suitable fused heteroaromatics are carbazolyl, benzimidazolyl, benzofuryl, dibenzofuryl or dibenzothiophenyl. The base skeleton may be substituted at one, more than one or all substitutable positions, suitable substituents being the same as have already been specified under the definition of $C_6$-$C_{30}$-aryl. However, the hetaryl radicals are preferably unsubstituted. Suitable hetaryl radicals are, for example, pyridin-2-yl, pyridin-3-yl, pyridin-4-yl, thiophen-2-yl, thiophen-3-yl, pyrrol-2-yl, pyrrol-3-yl, furan-2-yl, furan-3-yl and imidazol-2-yl and the corresponding benzofused radicals, especially carbazolyl, benzimidazolyl, benzofuryl, dibenzofuryl or dibenzothiophenyl.

Possible further substituents of the one, two or three optionally substituted aromatic or heteroaromatic groups include alkyl radicals, for example methyl, ethyl, propyl, butyl, pentyl, hexyl, heptyl and octyl, and also isopropyl, isobutyl, isopentyl, sec-butyl, tert-butyl, neopentyl, 3,3-dimethylbutyl and 2-ethylhexyl, aryl radicals, for example $C_6$-$C_{10}$-aryl radicals, especially phenyl or naphthyl, most preferably $C_6$-aryl radicals, for example phenyl, and hetaryl radicals, for example pyridin-2-yl, pyridin-3-yl, pyridin-4-yl, thiophen-2-yl, thiophen-3-yl, pyrrol-2-yl, pyrrol-3-yl, furan-2-yl, furan-3-yl and imidazol-2-yl, and also the corresponding benzofused radicals, especially carbazolyl, benzimidazolyl, benzofuryl, dibenzofuryl or dibenzothiophenyl. The degree of substitution here may vary from monosubstitution up to the maximum number of possible substituents.

Preferred compounds of the formula I for use in accordance with the invention are notable in that at least two of the $R^1$, $R^2$ and $R^3$ radicals are para-OR and/or —$NR_2$ substituents. The at least two radicals here may be only OR radicals, only $NR_2$ radicals, or at least one OR and at least one $NR_2$ radical.

Particularly preferred compounds of the formula I for use in accordance with the invention are notable in that at least four of the $R^1$, $R^2$ and $R^3$ radicals are para-OR and/or —$NR_2$ substituents. The at least four radicals here may be only OR radicals, only $NR_2$ radicals or a mixture of OR and $NR_2$ radicals.

Very particularly preferred compounds of the formula I for use in accordance with the invention are notable in that all of the $R^1$, $R^2$ and $R^3$ radicals are para-OR and/or —$NR_2$ substituents. They may be only OR radicals, only $NR_2$ radicals or a mixture of OR and $NR^2$ radicals.

In all cases, the two R in the $NR_2$ radicals may be different from one another, but they are preferably the same.

Preferred divalent organic $A^1$, $A^2$ and $A^3$ units are selected from the group consisting of $(CH_2)_m$, $C(R^7)(R^8)$, $N(R^9)$,

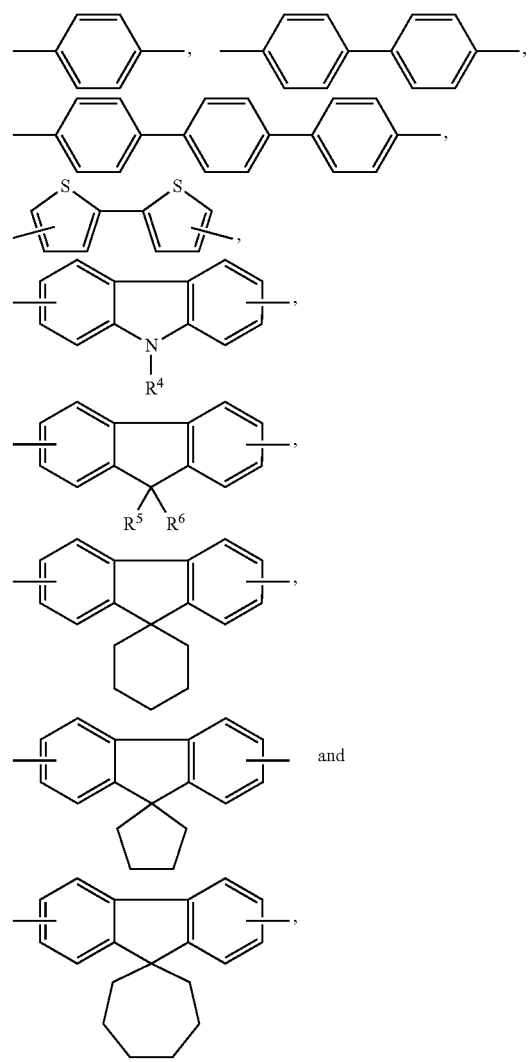

in which m is an integer from 1 to 18, $R^4$, $R^9$ are each alkyl, aryl or a monovalent organic radical which may comprise one, two or three optionally substituted aromatic or heteroaromatic groups, where, in the case of two or three aromatic or heteroaromatic groups, two of these groups in each case are joined to one another by a chemical bond and/or via a divalent alkyl radical, $R^5$, $R^6$, $R^7$, $R^8$ are each independently hydrogen atoms or radicals as defined for $R^4$ and $R^9$, and the aromatic and heteroaromatic rings of the units shown may have further substitution.

The degree of substitution of the aromatic and heteroaromatic rings here may vary from monosubstitution up to the maximum number of possible substituents.

Preferred substituents in the case of further substitution of the aromatic and heteroaromatic rings include the substituents already mentioned above for the one, two or three optionally substituted aromatic or heteroaromatic groups.

The compounds for use in accordance with the invention can be prepared by customary methods of organic synthesis known to those skilled in the art. References to relevant (patent) literature references can additionally be found in the synthesis examples adduced below.

Particular preference is given, as stated above, to the use of what are called spiro compounds, i.e. compounds which comprise at least one Spiro group, especially low molecular weight spiro compounds. More particularly, the p-semiconductor or the matrix material may comprise spiro-MeOTAD or consist of spiro-MeOTAD, i.e. a compound which has now become commercially available and is of the formula:

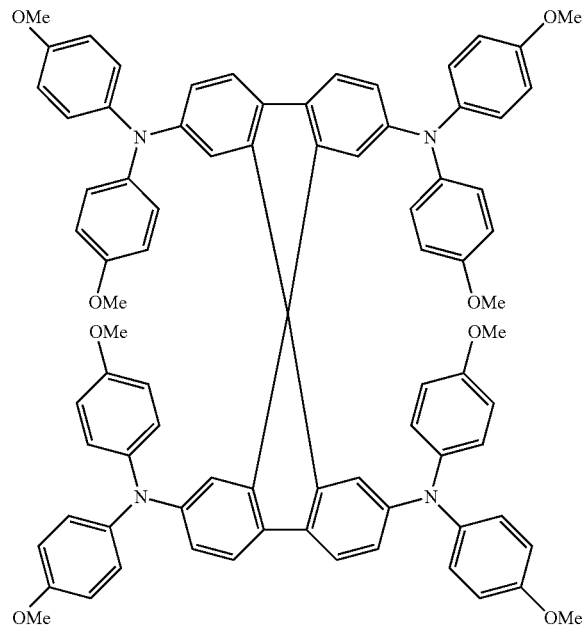 [SMILES: COc1ccc(N(c2ccc(OC)cc2)c2ccc3c(c2)C2(c4cc(N(c5ccc(OC)cc5)c5ccc(OC)cc5)ccc4-3)c3cc(N(c4ccc(OC)cc4)c4ccc(OC)cc4)ccc3-c3ccc(N(c4ccc(OC)cc4)c4ccc(OC)cc4)cc32)cc1]

With regard to the p-semiconductor, a metal oxide in the context of the present invention is understood to mean a compound of at least one metal with at least one oxygen atom, in which the metal or at least one metal is present in oxidized form and the oxygen in reduced form. More particularly, the oxygen in this compound may have the oxidation number—II. Apart from the at least one metal and the at least one oxygen, the compound may especially not comprise any further bonding partners. Alternatively, however, it is also possible for further bonding partners to be present in the compound, for example further metals and/or else non-metal elements. The metal oxide may especially be present in purely inorganic form. Alternatively, however, it is also possible for one or more organic compounds to be present in the metal oxide. In this case, the organic components can frequently function as ligands with solubilizing action, as, for example, in cerium(VI) tert-butoxide.

The metal oxide may in principle comprise any oxide of one or more metals, i.e. an oxidic compound between at least one metal and at least one oxygen atom. More particularly, the metal oxide may be selected from: $V_2O_5$; $Nb_2O_5$; $MoO_3$; $MoO_2$; $MoO_x$; $VO_x$; $WO_3$; $ReO_3$; an oxide of at least one transition group metal, especially $ReO_x$; $WO_x$; $WO_3$; $CeO_2$; $Ce_2O_3$; $Ce_3O_4$; $C_4CeF_{12}O_{12}S^4$; $CeO_2/Gd$; $CeO_2/Y$; $CrO_3$; $Ta_2O_5$; a CeZr oxide; Ce(IV) tert-butoxide; $Ce(MO_4)_3$; $CeO_4C_{10}H_{36}$; $C_4CeF_{12}O_{12}S_4$; $CeVO_4$; $CeO_4Zr$. In these compounds, x in each case is a positive rational number which need not necessarily be an integer, especially in crystals. The metal oxide may especially be present in particle form and/or powder form in the p-semiconductor. Particular preference is given to the use of $V_2O_5$ as the metal oxide.

At least one of the electrodes may be transparent. For example, the first electrode may be the working electrode and the second electrode the counterelectrode, or vice versa. One or both of these electrodes may be transparent. The photovoltaic element may especially comprise at least one layer structure applied to a substrate, in which case the layer structure may comprise the first electrode, the n-semiconductive metal oxide, the dye, the solid organic p-semiconductor with the metal oxide and the at least one second electrode in the sequence mentioned, or in reverse sequence.

The n-semiconductive metal oxide may especially be porous, in which case, at least one buffer layer of a metal oxide may especially be introduced between the n-semiconductive metal oxide and the first electrode. This buffer layer may be, for example, an impervious layer, i.e. a nonparticulate layer. For example, this buffer layer may be applied by means of a PVD process, for example a vapor deposition process and/or a sputtering process. Alternatively or additionally, it is also possible to use other processes, for example CVD processes and/or spray pyrolysis processes. The n-semiconductive metal oxide is, in contrast, preferably applied by means of a paste process, for example by print application, spin-coating application or knife-coating application of a paste of an n-semiconductive metal oxide. This paste can subsequently be sintered by at least one thermal treatment step, for example by heating to more than 200° C., especially to more than 400° C., for example 450° C. This sintering can, for example, remove volatile constituents of the paste, such that preferably only the n-semiconductive metal oxide particles remain.

As described above, the dye can especially be applied to the n-semiconductive metal oxide. This application is preferably effected in such a way that the dye completely or partially penetrates an n-semiconductive metal oxide layer, for example a particulate layer, in order to sensitize the particles of the n-semiconductive metal oxide, for example by virtue of one or more layers of the dye being formed on these particles, for example monomolecular layers. The application of the dye can accordingly be effected, for example, by means of at least one impregnation process, by, for example, immersing a sample comprising the n-semiconductive metal oxide layer into a solution of the dye. Other impregnation processes are also usable.

As a particular advantage of the present invention, the photovoltaic element may especially comprise at least one encapsulation. In contrast to conventional photovoltaic elements, in which solid p-semiconductors are doped by means of oxygen (for example by storage under air), the p-semiconductors doped with the at least one metal oxide may also exist without such an oxygen atmosphere over a prolonged period. Accordingly, it is possible to apply an encapsulation which screens the photovoltaic element, especially the electrodes and/or the p-semiconductor, from a surrounding atmosphere. In this way, in spite of the improvement in properties of the p-semiconductor by virtue of the doping by means of the metal oxide, oxygen can be excluded, which protects, for example, one or more of the electrodes from adverse effects resulting from oxygen and/or other surrounding gases. For example, the electrode degradation can be prevented in this way. The encapsulation may, for example, comprise encapsulation by a solid capsule element, for example a plane or capsule equipped with at least one depression, which is applied to the layer structure, for example, in such a way that it completely or partially surrounds the layer structure. For example, an edge of the encapsulation may completely or partially surround the layer structure and, for example, may be bonded to the substrate by an adhesive bond and/or another bond, preferably a cohesive bond. Alternatively or additionally, the encapsulation may also comprise one or more layers of a material which prevents penetration of harmful environmental influences, for example moisture and/or oxygen. For example, organic and/or inorganic coatings can be applied to the layer structure. Screening from ambient atmosphere can generally be understood to mean slowing of the penetration of gases and/or moisture from the surrounding atmosphere into the layer structure. The slowing can be effected, for example, in such a way that concentration differences within and outside the encapsulation are balanced out only within several hours, preferably several days, especially even several weeks, months extending up to years.

The dye solar cell may additionally have, between the n-semiconductive metal oxide and the p-semiconductor, especially at least one passivation material. The passivation material may especially serve to prevent short circuits, for example between the transparent conductive oxide of the electrode and the p-semiconductive material. This passivation material may especially be set up to at least partly prevent electron transfer between the n-semiconductive metal oxide and the p-semiconductor. The passivation material may especially be selected from: $Al_2O_3$; a silane, especially $CH_3SiCl_3$; an organometallic complex, especially an $Al^{3+}$ complex, a 4-tert-butylpyridine; hexadecylmalonic acid.

In a further aspect of the present invention, a process is proposed for producing a solid organic p-semiconductor for use in an organic component. This organic component may especially be a photovoltaic element, for example a photovoltaic element in one or more of the above-described configurations, especially a dye solar cell. However, other configurations of the organic component are also possible in principle, including the end use in organic light-emitting diodes, organic transistors, and other types of photovoltaic elements, for example organic solar cells.

In the process proposed, at least one p-conductive organic matrix material, for example a matrix material of the type described above, and at least one metal oxide as a p-dopant, are applied together to at least one carrier element from a liquid phase. As described above, a p-conductive organic matrix material is understood to mean an organic material which can preferably be applied from solution and which is capable of transporting positive charges. These positive charges may already be present in the matrix material and merely be increased by the p-doping, or can also actually be obtained as a result of the p-doping by means of the metal oxide. More particularly, the matrix material may be stably and reversibly oxidizable and be set up to pass positive charges ("holes") on to other molecules, for example adjacent molecules of the same type.

In general, it is pointed out in this regard that the effect of the metal oxide as a p-dopant is based merely on observable effects of an increase in the p-conductivity. Accordingly, it is possible, for example, to increase a charge carrier density and/or a mobility of positive charges in the p-semiconductor by addition of the at least one metal oxide. The invention is not limited to the way in which the p-doping is effected at the microscopic level.

The at least one organic matrix material and the at least one metal oxide as a p-dopant are applied together to the at least one carrier element from at least one liquid phase. A carrier element may be understood to mean a pure substrate, for example a glass and/or plastic and/or laminate substrate. Alternatively or additionally, the carrier element may, however, also comprise further elements, for example one or more electrodes and/or one or more layers, which may already be applied to the substrate. For example, the p-semiconductor can be applied from the liquid phase to an already partially or completely finished layer structure, in which case, for example, one or more layers may already be applied to a substrate, and then at least one layer of the p-semiconductor is applied. For example, the at least one first electrode, the at least one n-semiconductive metal oxide and preferably the dye may already be applied to a substrate, as described above with regard to the photovoltaic element, before the p-semiconductor is applied from the at least one liquid phase. "Application together" is understood to mean that the liquid phase comprises both the organic matrix material and the at least one metal oxide. Application from a liquid phase may generally comprise, for example, a wet chemical processing operation, for example a spin-coating, knife-coating, casting, printing or similar wet chemical process. For example, it is possible to use printing processes such as inkjet printing, screen printing, offset printing or the like. The application from the liquid phase may especially be followed by drying of the p-semiconductor, for example in order to remove volatile constituents such as solvents of the liquid phase. This drying can be effected, for example, under thermal action, for example at temperatures of 30° C. to 150° C. Other configurations are, however, also possible in principle.

The matrix material may especially, as described above, comprise at least one low molecular weight organic p-semiconductor. More particularly, it is possible to use one or more of the above-described organic p-semiconductors. More particularly, the low molecular weight organic p-semiconductor may comprise at least one triphenylamine. The low molecular weight organic p-semiconductor may especially comprise at least one spiro compound, for example one or more of the above-described spiro compounds.

The liquid phase may, in addition to the at least one matrix material and the at least one metal oxide, further comprise one or more additional components which may have different end uses. For example, it is known for stabilization purposes and/or for improvement of the electrical properties to use spiro compounds, for example spiro-MeOTAD, in solution with at least one lithium salt. In general, the liquid phase may accordingly further comprise, for example, at least one metal salt. More particularly, this may be an organometallic salt. A combination of different salts is also possible. More particularly, it is possible to use lithium salts, for example organometallic lithium salts, preferably $LiN(SO_2CF_3)_2$.

The at least one liquid phase may especially comprise at least one solvent. The term "solvent" is used here, in the context of the present invention, irrespective of whether all, several or individual constituents present in the liquid phase are actually present in dissolved form or whether they are present in another form, for example as a suspension, dispersion, emulsion or in some other form. More particularly, the at least one metal oxide may be present in dispersed and/or suspended form. Accordingly, the solvent, with regard to this at least one undissolved constituent, may also function, for example, as a dispersant. For example, the at least one matrix material may be present in dissolved or else in dispersed form. The metal oxide may especially be present in dispersed form, but may also in principle be present in another form, for example in dissolved and/or suspended form.

Particular preference is given to the use of at least one organic solvent. More particularly, it is possible to use one or more of the following solvents: cyclohexanone; chlorobenzene; benzofuran; cyclopentanone; toluene; an alcohol. Mixtures of the solvents mentioned and/or others are also possible. Preference is given to the use of at least one organic solvent. More particularly, it is possible to use one or more solvents which find use in the paints industry. Particular preference is given to protic and aprotic solvents having a high dielectric constant (>5) and high refractive index (>1.4).

The proposed process for producing a solid organic p-semiconductor can especially be used to produce the above-described photovoltaic element in one or more of the configurations described. However, other organic components are also producible by means of the process. A combination with other known processes is also conceivable in principle, and so, for example, when a plurality of organic p-semiconductors are provided, one or more of these p-semiconductors are producible by means of the proposed process according to the invention, and one or more of the conventional p-semiconductors by means of other processes.

A particular advantage of the proposed process for producing the solid organic p-semiconductor is that—in contrast to many processes known from the prior art—storage under air is not necessarily required. For instance, the process may especially be performed at least partly in a low-oxygen atmosphere. In the context of the present invention, an organic component is generally understood to mean a component which has one or more organic elements, for example one or more organic layers. It is possible to use entirely organic components, for example components in which the layer structure—optionally with the exception of the electrodes—comprises only organic layers. However, it is also possible to produce hybrid components, for example components which comprise, as well as one or more organic layers, one or more inorganic layers. When the process proposed is used to produce the solid organic p-semiconductor in a multistep production process, it is possible to perform one, more than one or all of the process steps for production of the organic component in a low-oxygen atmosphere. More particularly, the process step of production of the solid organic p-semiconductor can be performed in the low-oxygen atmosphere, in contrast to the above-described known processes. More particularly, the application of the liquid phase to the carrier element can thus be performed in the low-oxygen atmosphere. A low-oxygen atmosphere is generally understood to mean an atmosphere which has a reduced oxygen content compared to the ambient air. For example, the low-oxygen atmosphere may have an oxygen content of less than 1000 ppm, preferably of less than 500 ppm and more preferably of less than 100 ppm, for example 50 ppm or less. It is also possible to perform further processing of the organic component, for example of the dye solar cell, under such a low-oxygen atmosphere. For example, at least after the application of the solid p-semiconductor by means of the process proposed, the low-oxygen atmosphere cannot be interrupted again until after the encapsulation. Complete processing of the entire component in the low-oxygen atmosphere is also possible, without any adverse effect on the electrical properties of the component. Particular preference is given to a low-oxygen atmosphere in the form of an inert gas, for example a nitrogen atmosphere and/or an argon atmosphere. Mixed gases are also usable.

In a third aspect of the present invention, a process is proposed for producing a photovoltaic element. This may especially be a photovoltaic element according to one or more of the above-described configurations, for example a dye solar cell. The proposed process for producing the photovoltaic element may especially be performed using the above-described process for producing a solid organic p-semiconductor, in which case the process for producing the solid organic p-semiconductor can be used once or more than once in the context of the proposed process for producing the photovoltaic element. Use of other processes is, however, also possible in principle.

The process proposed has the process steps described hereinafter, which can preferably, but not necessarily, be performed in the sequence described. Individual or several process steps can also be performed overlapping in time and/or in parallel. In addition, the performance of additional process steps which are not described is possible. In the process proposed, at least one first electrode, at least one n-semiconductive metal oxide, at least one dye which absorbs electromagnetic radiation, at least one solid organic p-semiconductor and at least one second electrode are provided. This provision can be effected, for example, in the sequence mentioned. More particularly, the provision can be effected by producing a layer structure, for example according to the above description. This layer structure can, for example, be built up successively on one or more substrates. In this case, it is also possible to combine one or more of the elements mentioned to give a combined layer, for example the n-semiconductive metal oxide and the dye.

In the process proposed, the p-semiconductor is configured such that it comprises at least one metal oxide. The p-semiconductor may especially comprise at least one organic matrix material which is doped by the metal oxide. For possible configurations of the organic matrix material and/or of the metal oxide, reference may be made to the above description.

The p-semiconductor can especially be produced by a process in which a wet chemical processing operation is used, for example according to the above description of the process for producing the solid organic p-semiconductor. In this wet chemical processing operation, at least one p-conductive organic matrix material and the at least one metal oxide as a p-dopant can be applied together to at least one carrier element from at least one liquid phase.

Alternatively or additionally to the wet chemical processing operation mentioned, the at least one metal oxide can, however, also be introduced into the organic matrix material in another way. For example, it is possible to use at least one penetration process, i.e. a process in which the metal oxide subsequently penetrates into the matrix material, for example into at least one layer of the matrix material, for example diffuses in and/or is introduced in some other way. In the penetration process, at least one p-conductive organic matrix material is applied to a carrier element. Subsequently, the metal oxide is applied to the p-conductive organic matrix material. This application can be effected, for example, by a PVD process, for example by sputtering, vapor deposition or similar PVD processes. Alternatively or additionally, it is also possible to use other processes, for example CVD processes and/or wet chemical processes, for example by spin-coating of a dispersion, suspension or solution of the metal oxide. The process is performed in such a way that the metal oxide at least partly penetrates the organic matrix material. This penetration can be effected, for example, by diffusion. Alternatively or additionally, energy can already be given to the particles of the metal oxide in the course of application to the matrix material, which facilitates penetration. This may, for example, be kinetic energy and/or thermal energy. The penetration can, alternatively or additionally, also be promoted by a thermal treatment.

Hereinafter, optionally implementable configurations of the photovoltaic element and of the processes are described, which are particularly preferred in the context of the invention. However, other configurations are also possible in principle.

The photovoltaic element may especially comprise a layer structure, which may be applied, for example, to a substrate. In this case, for example, the first electrode or the second electrode may face the substrate. At least one of the electrodes should be transparent. A "transparent" electrode in this context should especially be understood to mean that, within the visible spectral range and/or in the range of the solar spectrum (approx. 300 nm to 2000 nm), transmission of at least 50% exists, preferably of at least 80%. When the substrate is a transparent substrate, especially the electrode facing the substrate should be transparent.

The substrate may be or comprise, for example, a glass substrate and/or a plastic substrate. However, other materials, including a combination of different materials, are also usable in principle, for example laminates. The constituents of the photovoltaic element may be applied to the substrate directly or indirectly as layers. In the context of the present invention, the terms "carrier element", "carrier" and "substrate" are used at least substantially synonymously. When a carrier element is being discussed, however, this if anything emphasizes the possibility that a layer is being applied indirectly to the substrate, such that at least one further element, especially at least one further layer, may be present between the layer to be applied and the actual substrate. However, direct application is also possible.

The photovoltaic element may especially be a dye solar cell. Accordingly, the photovoltaic element is also referred to hereinafter in general terms as "cell", without this imposing any restriction to a particular layer structure. A cell may especially comprise the at least one first electrode, the n-conductive metal oxide, the dye, the p-semiconductor and the second electrode. The n-conductive metal oxide, the dye and the p-semiconductor can also be referred to as functional layers, which may be embedded between the electrodes. In addition, the cell may comprise one or more further layers which may, for example, likewise be assigned to the functional layers. One or more cells may be applied directly or indirectly to a substrate. The photovoltaic element may especially comprise one cell or else a plurality of cells. More particularly, a single-cell structure may be selected, or else a multicell structure, for example a tandem cell structure, with a plurality of cells arranged in parallel and/or one on top of another on the substrate.

More particularly, the photovoltaic element according to the present invention may be configured in one or more of the ways which follow. The configurations of the elements of the photovoltaic element can also be combined in virtually any way.

First Electrode and N-Semiconductive Metal Oxide

The n-semiconductive metal oxide used in the dye solar cell may be a single metal oxide or a mixture of different oxides. It is also possible to use mixed oxides. The n-semiconductive metal oxide may especially be porous and/or be used in the form of a nanoparticulate oxide, nanoparticles in this context being understood to mean particles which have an average particle size of less than 0.1 micrometer. A nanoparticulate oxide is typically applied to a conductive substrate (i.e. a carrier with a conductive layer as the first electrode) by a sintering process as a thin porous film with large surface area.

The substrate may be rigid or else flexible. Suitable substrates (also referred to hereinafter as carriers) are, as well as metal foils, in particular plastic sheets or films and especially glass sheets or glass films. Particularly suitable electrode materials, especially for the first electrode according to the above-described, preferred structure, are conductive materials, for example transparent conductive oxides (TCOs), for example fluorine- and/or indium-doped tin oxide (FTO or ITO) and/or aluminum-doped zinc oxide (AZO), carbon nanotubes or metal films. Alternatively or additionally, it would, however, also be possible to use thin metal films which still have a sufficient transparency. The substrate can be covered or coated with these conductive materials. Since generally only a single substrate is required in the structure proposed, the formation of flexible cells is also possible. This enables a multitude of end uses which would be achievable only with difficulty, if at all, with rigid substrates, for example use in bank cards, garments, etc.

The first electrode, especially the TCO layer, may additionally be covered or coated with a solid metal oxide buffer layer (for example of thickness 10 to 200 nm), in order to prevent direct contact of the p-semiconductor with the TCO layer (see Peng et al., Coord. Chem. Rev. 248, 1479 (2004)). The inventive use of solid p-semiconductive electrolytes, in the case of which contact of the electrolyte with the first electrode is greatly reduced compared to liquid or gel-form electrolytes, however, makes this buffer layer unnecessary in many cases, such that it is possible in many cases to dispense with this layer, which also has a current-limiting effect and can also worsen the contact of the n-semiconductive metal oxide with the first electrode. This enhances the efficiency of the components. On the other hand, such a buffer layer can in turn be utilized in a controlled manner in order to match the current component of the dye solar cell to the current component of the organic solar cell. In addition, in the case of cells in which the buffer layer has been dispensed with, especially in solid cells, problems frequently occur with unwanted recombinations of charge carriers. In this respect, buffer layers are advantageous in many cases specifically in solid cells.

As is well known, thin layers or films of metal oxides are generally inexpensive solid semiconductor materials (n-semiconductors), but the absorption thereof, due to large bandgaps, is typically not within the visible region of the electromagnetic spectrum, but rather usually in the ultraviolet spectral region. For use in solar cells, the metal oxides therefore generally, as is the case in the dye solar cells, have to be combined with a dye as a photosensitizer, which absorbs in the wavelength range of sunlight, i.e. at 300 to 2000 nm, and, in the electronically excited state, injects electrons into the conduction band of the semiconductor. With the aid of a solid p-semiconductor used additionally in the cell as an electrolyte, which is in turn reduced at the counterelectrode (or, in the case of a tandem solar cell, at the transition to the second subcell), electrons can be recycled to the sensitizer, such that it is regenerated.

Of particular interest for use in solar cells are the semiconductors zinc oxide, tin dioxide, titanium dioxide or mixtures of these metal oxides. The metal oxides can be used in the form of nanocrystalline porous layers. These layers have a large surface area which is coated with the dye as a sensitizer, such that a high absorption of sunlight is achieved. Metal oxide layers which are structured, for example nanorods, give advantages such as higher electron mobilities or improved pore filling by the dye.

The metal oxide semiconductors can be used alone or in the form of mixtures. It is also possible to coat a metal oxide with one or more other metal oxides. In addition, the metal oxides may also be applied as a coating to another semiconductor, for example GaP, ZnP or ZnS.

Particularly preferred semiconductors are zinc oxide and titanium dioxide in the anatase polymorph, which is preferably used in nanocrystalline form.

In addition, the sensitizers can advantageously be combined with all n-semiconductors which typically find use in these solar cells. Preferred examples include metal oxides used in ceramics, such as titanium dioxide, zinc oxide, tin(IV) oxide, tungsten(VI) oxide, tantalum(V) oxide, niobium(V) oxide, cesium oxide, strontium titanate, zinc stannate, complex oxides of the perovskite type, for example barium titanate, and binary and ternary iron oxides, which may also be present in nanocrystalline or amorphous form.

Due to the strong absorption that customary organic dyes and phthalocyanines and porphyrins have, even thin layers or films of the n-semiconductive metal oxide are sufficient to absorb the required amount of dye. Thin metal oxide films in turn have the advantage that the probability of unwanted recombination processes falls and that the inner resistance of the dye subcell is reduced. For the n-semiconductive metal oxide, it is possible with preference to use layer thicknesses of 100 nm up to 20 micrometers, more preferably in the range between 500 nm and approx. 3 micrometers.

Dye

In the context of the present invention, as usual for DSCs, the terms "dye", "sensitizer dye" and "sensitizer" are used essentially synonymously without any restriction of possible configurations. Numerous dyes which are usable in the context of the present invention are known from the prior art, and so, for possible material examples, reference may also be made to the above description of the prior art regarding dye solar cells. All dyes listed and claimed may in principle also be present as pigments. Dye-sensitized solar cells based on titanium dioxide as a semiconductor material are described, for example, in U.S. Pat. No. 4,927,721, Nature 353, p. 737-740 (1991) and U.S. Pat. No. 5,350,644, and also Nature 395, p. 583-585 (1998) and EP-A-1 176 646. The dyes described in these documents can in principle also be used advantageously in the context of the present invention. These dye solar cells preferably comprise monomolecular films of transition metal complexes, especially ruthenium complexes, which are bonded to the titanium dioxide layer via acid groups as sensitizers.

Not least for reasons of cost, sensitizers which have been proposed repeatedly include metal-free organic dyes, which are likewise also usable in the context of the present invention. High efficiencies of more than 4%, especially in solid dye solar cells, can be achieved, for example, with indoline dyes (see, for example, Schmidt-Mende et al., Adv. Mater. 2005, 17, 813). U.S. Pat. No. 6,359,211 describes the use, also implementable in the context of the present invention, of cyanine, oxazine, thiazine and acridine dyes which have carboxyl groups bonded via an alkylene radical for fixing to the titanium dioxide semiconductor.

Organic dyes now achieve efficiencies of almost 10% in liquid cells (see, for example, Zhang et al., Chem. Comm. 2009, 2198). Pyridinium-containing dyes have also been reported, can be used in the context of the present invention and exhibit promising efficiencies.

Particularly preferred sensitizer dyes in the dye solar cell proposed are the perylene derivatives, terrylene derivatives and quaterrylene derivatives described in DE 10 2005 053 995 A1 or WO 2007/054470 A1. The use of these dyes leads to photovoltaic elements with high efficiencies and simultaneously high stabilities.

The rylenes exhibit strong absorption in the wavelength range of sunlight and can, depending on the length of the conjugated system, cover a range from about 400 nm (perylene derivatives I from DE 10 2005 053 995 A1) up to about 900 nm (quaterrylene derivatives I from DE 10 2005 053 995 A1). Rylene derivatives I based on terrylene absorb, according to the composition thereof, in the solid state adsorbed onto titanium dioxide, within a range from about 400 to 800 nm. In order to achieve very substantial utilization of the incident sunlight from the visible into the near infrared region, it is advantageous to use mixtures of different rylene derivatives I. Occasionally, it may also be advisable also to use different rylene homologs.

The rylene derivatives I can be fixed easily and in a permanent manner to the n-semiconductive metal oxide film. The bonding is effected via the anhydride function (x1) or the carboxyl groups —COOH or —COO— formed in situ, or via the acid groups A present in the imide or condensate radicals ((x2) or (x3)). The rylene derivatives I described in DE 10 2005 053 995 A1 have good suitability for use in dye-sensitized solar cells in the context of the present invention.

Perylene dyes have been found to be particularly efficient. For example, in the context of the present invention, especially a perylene dye (ID176) can be used, which is described in Cappel et al. Phys. Chem C. Lett. 2009, 113, 14595-14597 for solid dye solar cells, and with which efficiencies of 3.2% have been achieved.

It is particularly preferred when the dyes, at one end of the molecule, have an anchor group which enables the fixing thereof to the n-semiconductor film. At the other end of the molecule, the dyes preferably comprise electron donors Y which facilitate the regeneration of the dye after the electron has been released to the n-semiconductor, and also prevents recombination with electrons already released to the semiconductor.

For further details regarding the possible selection of a suitable dye, it is possible, for example, again to refer to DE 10 2005 053 995 A1. For the tandem cells described in the present document, it is possible especially to use ruthenium complexes, porphyrins, other organic sensitizers, and preferably rylenes.

The dyes can be fixed onto or into the n-semiconductive metal oxide films in a simple manner. For example, the n-semiconductive metal oxide films can be contacted in the freshly sintered (still warm) state over a sufficient period (for example about 0.5 to 24 h) with a solution or suspension of the dye in a suitable organic solvent. This can be accomplished, for example, by immersing the metal oxide-coated substrate into the solution of the dye.

If combinations of different dyes are to be used, they may, for example, be applied successively from one or more solutions or suspensions which comprise one or more of the dyes. It is also possible to use two dyes which are separated by a layer of, for example, CuSCN (on this subject see, for example, Tennakone, K. J., Phys. Chem. B. 2003, 107, 13758). The most convenient method can be determined comparatively easily in the individual case.

In the selection of the dye and of the size of the oxide particles of the n-semiconductive metal oxide, the solar cell should be configured such that a maximum amount of light is absorbed. The oxide layers should be structured such that the solid p-semiconductor can efficiently fill the pores. For instance, smaller particles have greater surface areas and are therefore capable of adsorbing a greater amount of dyes. On the other hand, larger particles generally have larger pores which enable better penetration through the p-conductor.

As described above, the concept proposed comprises the use of one or more solid p-semiconductors. In order to prevent recombination of the electrons in the n-semiconductive metal oxide with the solid p-conductor, it is possible to use, between the n-semiconductive metal oxide and the p-semiconductor, at least one passivating layer which has a passivating material. This layer should be very thin and should as far as possible cover only the as yet uncovered sites of the n-semiconductive metal oxide. The passivation material may, under some circumstances, also be applied to the metal oxide before the dye. Preferred passivation materials are especially one or more of the following substances: $Al_2O_3$; silanes, for example $CH_3SiCl_3$; $Al^{3+}$; 4-tert-butylpyridine (TBP); MgO; GBA (4-guanidinobutyric acid) and similar derivatives; alkyl acids; hexadecylmalonic acid (HDMA).

P-Semiconductor

As described above, in the context of the photovoltaic element proposed here, one or more solid organic p-semiconductors are used—alone or else in combination with one or more further p-semiconductors which are organic or inorganic in nature. The at least one solid organic p-semiconductor comprises, as described above, at least one metal oxide. In the context of the present invention, a p-semiconductor is generally understood to mean a material, especially an organic material, which is capable of conducting holes. More particularly, it may be an organic material with an extensive π-electron system which can be oxidized stably at least once, for example to form what is called a free-radical cation. For example, the p-semiconductor may comprise at least one organic matrix material which has the properties mentioned. More particularly, the p-semiconductor may be p-doped by the metal oxide. This means that any p-semiconductive property present in any case in the p-semiconductor or in the matrix material is enhanced or even actually created by the doping with the metal oxide. More particularly, the doping can increase a charge carrier density, especially a hole density. Alternatively or additionally, a mobility of the charge carriers, especially of the holes, can also be influenced by the doping, especially increased.

Solid p-semiconductors doped with one or more metal oxides can be used in the inventive photovoltaic elements even without any great increase in the cell resistance, especially when the dyes absorb strongly and therefore require only thin n-semiconductor layers. More particularly, the p-semiconductor should essentially have a continuous, impervious layer, in order that unwanted recombination reactions which could result from contact between the n-semiconductive metal oxide (especially in nanoporous form) with the second electrode and/or further elements of the photovoltaic element are reduced.

The at least one metal oxide can especially be applied to the carrier element, together with the matrix material from the liquid phase. For example, one or more metal oxides can be processed as a solution, dispersion or suspension, in combination with a p-semiconductive matrix material. Optionally, at least one organic salt can be added to this at least one liquid phase (though it is also possible for several liquid phases to be present), for example for stabilization purposes and/or for improvement of the electrical properties.

A significant parameter influencing the selection of the p-semiconductor is the hole mobility, since this partly determines the hole diffusion length (cf. Kumara, G., Langmuir, 2002, 18, 10493-10495). A comparison of charge carrier mobilities in different Spiro compounds can be found, for example, in T. Saragi, Adv. Funct. Mater. 2006, 16, 966-974.

Preferably, the at least one matrix material, especially at least one p-semiconductive organic matrix material, is present in the p-semiconductor in excess compared to the metal oxide, while the metal oxide merely constitutes a dopant, for example with a proportion by weight of not more than 15%, especially not more than 10%, more preferably not more than 5%, for example 2.5%. Accordingly, the matrix material in the context of the present invention is frequently equated for terminology purposes with the p-semiconductor, whereas the metal oxide is referred to as a dopant. However, matrix material and metal oxide together form the p-semiconductor. In addition, the p-semiconductor may optionally comprise one or more further components. Preferably, in the context of the present invention, organic semiconductors are used (i.e. low molecular weight, oligomeric or polymeric semiconductors or mixtures of such semiconductors). Particular preference is given to p-semiconductors which can be processed from a liquid phase. Examples here are p-semiconductors based on polymers such as polythiophene and polyarylamines, or on amorphous, reversibly oxidizable, nonpolymeric organic compounds, such as the spirobifluorenes mentioned at the outset (cf., for example, US 2006/0049397 and the Spiro compounds disclosed therein as p-semiconductors, which are also usable in the context of the present invention). Preference is given to using low molecular weight organic semiconductors. The solid p-semiconductors can be used in doped form with the at least one metal oxide as a dopant.

In addition, reference may also be made to the remarks regarding the p-semiconductive materials and dopants from the description of the prior art. For the other possible elements and the possible structure of the dye solar cell, reference may also be made substantially to the above description.

Second Electrode

The second electrode may be a bottom electrode facing the substrate or else a top electrode facing away from the substrate. The second electrodes which can be used are especially metal electrodes which may have one or more metals in pure form or as a mixture/alloy, such as especially aluminum or silver. The use of inorganic/organic mixed electrodes or multilayer electrodes is also possible, for example the use of LiF/Al electrodes.

In addition, it is also possible to use electrode designs in which the efficiency of the components is increased by virtue of the photons being forced, by means of appropriate reflections, to pass through the absorbing layers at least twice.

Such layer structures are also referred to as "concentrators" and are likewise described, for example, in WO 02/101838 (especially p. 23-24).

BRIEF DESCRIPTION OF THE FIGURES

Further details and features of the invention are evident from the description of preferred embodiments which follows in conjunction with the dependent claims. In this context, the particular features may be implemented alone or with several in combination. The invention is not restricted to the working examples. The working examples are shown schematically in the figures. Identical reference numerals in the individual figures refer to identical elements or elements with identical function, or elements which correspond to one another with regard to their functions.

The individual figures show.

WORKING EXAMPLES

Figure 1:
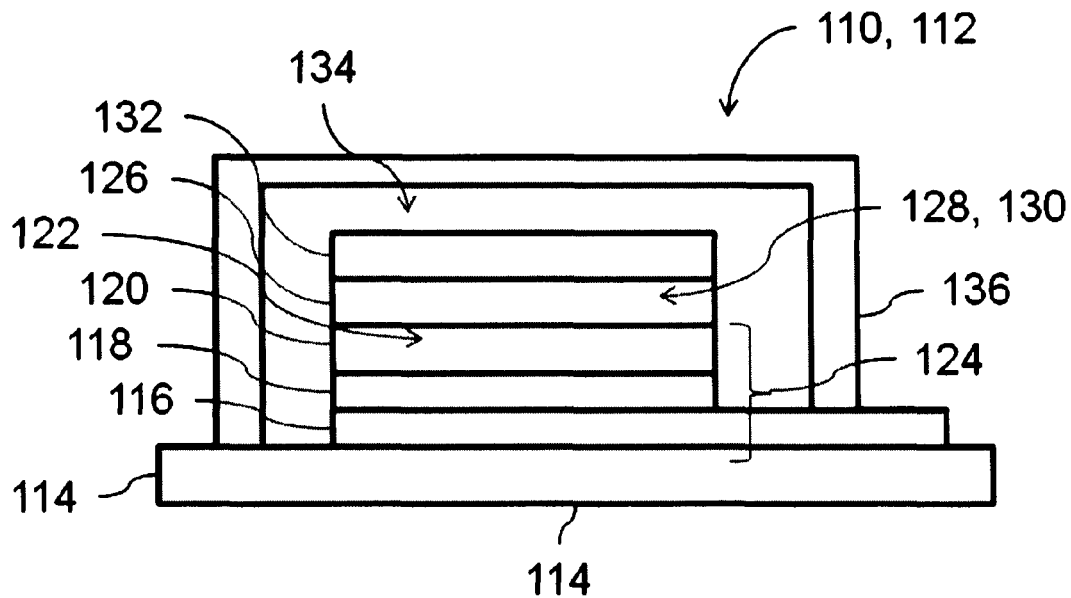
FIG. 1 a schematic layer structure of an inventive organic photovoltaic element in a sectional diagram in side view.

FIG. 1 shows, in a highly schematic sectional diagram, a photovoltaic element 110 which, in this working example, is a dye solar cell 112. The photovoltaic element 110 according to the schematic layer structure in FIG. 1 can be configured in accordance with the invention. The comparative sample according to the prior art may in principle also correspond to the structure shown in FIG. 1, and differ therefrom, for example, merely with regard to the solid organic p-semiconductor. It is pointed out that the present invention, however, is also usable in other layer structures and/or in other constructions.

The photovoltaic element 110 comprises a substrate 114, for example a glass substrate. Other substrates are also usable, as described above. Applied to this substrate 114 is a first electrode 116, which is also referred to as a working electrode and which preferably, as described above, is transparent. Applied to this first electrode 116 in turn is a blocking layer 118 of an optional metal oxide, which is preferably nonporous and/or nonparticulate. Applied to this in turn is an n-semiconductive metal oxide 120 which has been sensitized with a dye 122.

The substrate 114 and the layers 116 to 120 applied thereto form a carrier element 124 for at least one layer, applied thereto, of a solid organic p-semiconductor 126, which in turn may comprise especially at least one p-semiconductive organic matrix material 128 and at least one metal oxide 130. Applied to this p-semiconductor 126 is a second electrode 132, which is also referred to as the counterelectrode. The layers shown in FIG. 1 together form a layer structure 134 which has been shielded from a surrounding atmosphere by an encapsulation 136, for example in order to completely or partially protect the layer structure 134 from oxygen and/or moisture. One or both of the electrodes 116, 132 may, as indicated in FIG. 1 with reference to the first electrode 116, be conducted out of the encapsulation 136, in order to be able to provide one or more contact connection areas outside the encapsulation 136.

Figure 2:
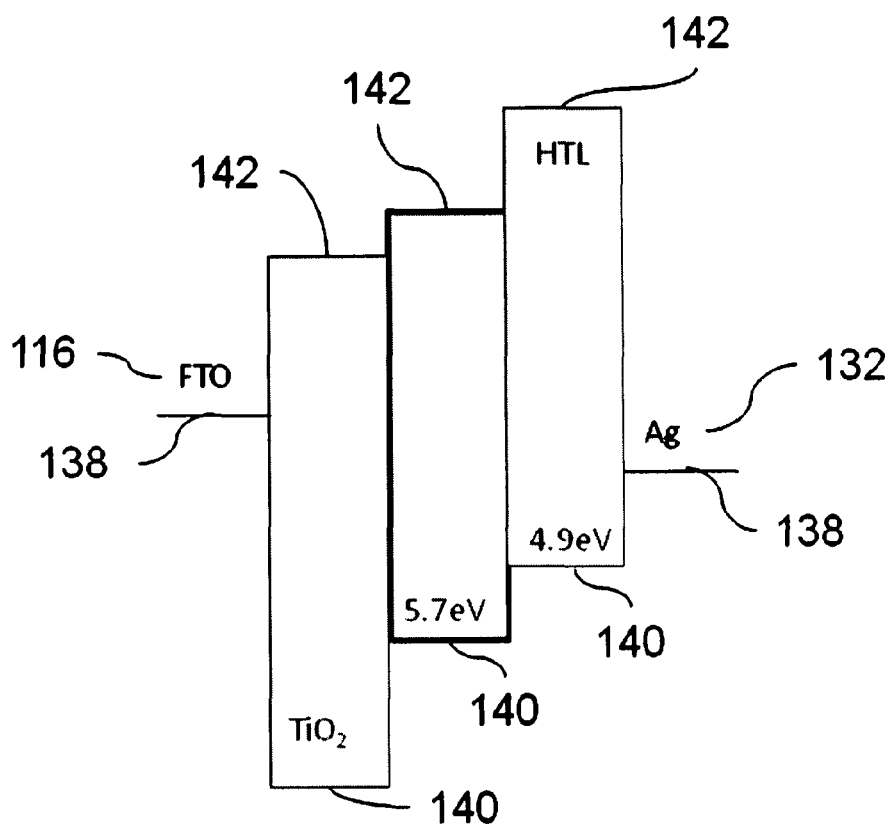
FIG. 2 a schematic arrangement of the energy levels in the layer structure according to FIG. 1.

FIG. 2 shows, by way of example, in a highly schematic manner, an energy level diagram of the photovoltaic element 110, for example according to FIG. 1. What are shown are the Fermi levels 138 of the first electrode 116 and of the second electrode 132, and the HOMOs (highest occupied molecular orbitals) 140 and the LUMOs (lowest unoccupied molecular orbitals) 142 of the layers 118/120 (which may comprise the same material, for example $TiO_2$) of the dye (shown by way of example with a HOMO level of 5.7 eV) and of the p-semiconductor 126 (also referred to as HTL, hole transport layer). The materials specified by way of example for the first electrode 116 and the second electrode 132 are FTO (fluorine-doped tin oxide) and silver.

The photovoltaic elements may additionally optionally comprise further elements. By means of photovoltaic elements 110 with or without encapsulation 136, the working examples described hereinafter were implemented, on the basis of which the effect of the present invention and especially of the p-doping of the p-semiconductor 126 by means of the metal oxide 130 can be demonstrated.

Comparative Sample

As a comparative sample of a photovoltaic element, a dye solar cell with a solid p-semiconductor without metal oxide doping was produced, as known in principle from the prior art.

As the base material and substrate, glass plates which had been coated with fluorine-doped tin oxide (FTO) as the first electrode (working electrode) and were of dimensions 25 mm×25 mm×3 mm (Hartford Glass) were used, which were treated successively in an ultrasound bath with glass cleaner (RBS 35), demineralized water and acetone, for 5 min in each case, then boiled in isopropanol for 10 minutes and dried in a nitrogen stream.

To produce an optional solid $TiO_2$ buffer layer, a spray pyrolysis process was used. Thereon, as an n-semiconductive metal oxide, a $TiO_2$ paste (Dyesol) which comprises $TiO_2$ particles with a diameter of 25 nm in a terpineol/ethylcellulose dispersion was spun on with a spin-coater at 4500 rpm and dried at 90° C. for 30 min. After heating to 450° C. for 45 min and a sintering step at 450° C. for 30 minutes, a $TiO_2$ layer thickness of approximately 1.8 μm was obtained.

After removal from the drying cabinet, the sample was cooled to 80° C. and immersed into a 5 mM solution of an additive ID662 (see below) for 12 h and subsequently into a 0.5 mM solution of a dye in dichloromethane for 1 h. The dye used was the dye ID504 (see below). After removal from the solution, the sample was subsequently rinsed with the same solvent and dried in a nitrogen stream. The samples obtained in this way were subsequently dried at 40° C. under reduced pressure. ID662 and ID504 have the following structural formulae:

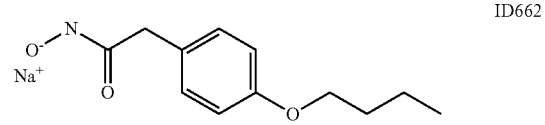

ID662

-continued

ID504

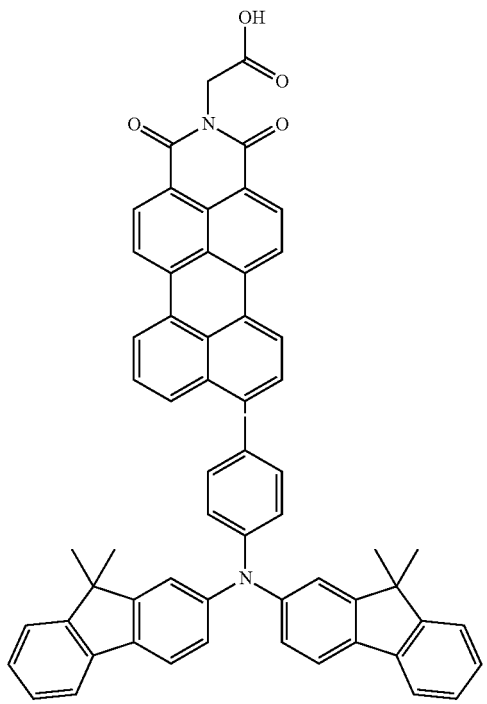

Next, a p-semiconductor solution was spun on under a nitrogen atmosphere. For this purpose, a solution of 0.12 M spiro-MeOTAD (Lumtec) and 20 mM LiN(SO$_2$CF$_3$)$_2$ (Aldrich) in chlorobenzene was made up. 125 µl of this solution were applied to the sample and allowed to act for 60 s. Thereafter, the supernatant solution was spun off at 2000 rpm for 30 s.

Finally, a metal back electrode was applied as a second electrode by thermal metal vaporization under reduced pressure. The metal used was Ag, which was vaporized at a rate of 3 Å/s at a pressure of approx. 2*10$^{-6}$ mbar, so as to give a layer thickness of about 200 nm.

After the production, the component was stored under dry air with a relative air humidity of 8% for 2 days. As stated above, it is suspected that this storage brings about oxygen doping of the p-semiconductor, as a result of which the conductivity of the p-semiconductor is enhanced.

To determine the efficiency η, the particular current/voltage characteristic was recorded with a source meter model 2400 (Keithley Instruments Inc.) under irradiation with a xenon solar simulator (LOT-Oriel 300 W).

Figure 3:
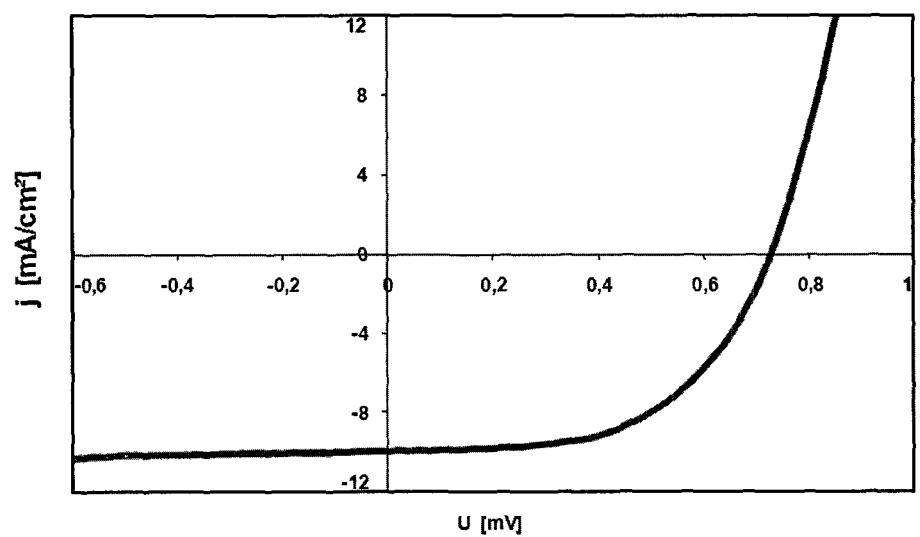
FIG. 3 current-voltage characteristic of a comparative sample without metal oxide, measured 2 days after production.

A current-voltage characteristic of the comparative sample is shown in FIG. 3. The short-circuit current (i.e. the current density at load resistance zero) was 9.99 mA/cm$^2$, the open-circuit voltage V$_{oc}$ (i.e. the load at which the current density has fallen to zero) was 720 mV, the fill factor was 56% and the efficiency was 4%.

Example 1

V$_2$O$_5$ in Chlorobenzene

As the first working example of an inventive photovoltaic element, the above-described comparative sample was modified by doping the p-semiconductor with vanadium pentoxide, using chlorobenzene as a solvent.

The base material, the preparation thereof, the production of the optional solid TiO$_2$ buffer layer, the production of the layer of the n-semiconductive metal oxide and the dye sensitization were effected as for the production of the comparative sample.

Next, a p-semiconductor solution was spun on in a glovebox with inert atmosphere. For this purpose, a 0.16 M spiro-MeOTAD (Lumtec) in chlorobenzene p.A. (Sigma-Aldrich) was made up. This was brought into solution in a screwtop bottle at approx. 80° C. on a hotplate. After cooling to room temperature, a 20 mmolar LiN(SO$_2$CF$_3$)$_2$ solution in cyclohexanone (hole conductor:lithium salt ratio 33:4) was added to the solution. The addition of lithium salt was followed by a wait time of 3 minutes. The spiro-MeOTAD thus formed, in this example 1, the p-semiconductive matrix material of the p-semiconductor.

For further p-doping of the p-semiconductor and especially of the spiro-MeOTAD matrix material therein, 2.5% vanadium pentoxide (based on the proportion by weight of the p-conductor) were subsequently introduced into the mixture, which was homogenized well by tilting. Without any restriction as to which constituents were now actually in solution, this mixture is also referred to hereinafter as p-semiconductor solution. The concentration figure of the metal oxide should be understood such that the ratio of molar mass of V$_2$O$_5$ and spiro-MeOTAD (without additions) is 2.5%. Vanadium oxide was introduced as a powder therein.

After the screwtop bottle had been closed, the p-semiconductor solution was stored in the dark for at least 45 min. This was followed by filtering through a microfilter. 125 µl of the solution were applied to the sample and allowed to act for 60 s. Thereafter, the supernatant solution was spun off at 2000 rpm for 30 s.

Finally, in turn, a metal back electrode as the second electrode was applied by thermal metal vaporization under reduced pressure, analogously to the production of the comparative sample.

After the production of this cell, it was sealed to a second glass plate with two-component epoxy adhesive (UHU). In general, the cells were analyzed immediately after production.

Examples 2 to 41

Variations of the Metal Oxides and of the Solvents

Analogously to example 1, further examples of photovoltaic elements were produced, with modification of the metal oxide used and/or the solvent in which the p-semiconductor was dissolved, with respect to example 1.

The production was in principle effected analogously to the above description of example 1. Again, spiro-MeOTAD (Lumtec) was used in each case in a 0.16 M solution, except that the solvents of this solution were varied. Analogously to example 1, the solutions were each brought completely into solution in screwtop bottles at approx. 80° C. on a hotplate. After cooling to room temperature, a 20 mmolar LiN(SO$_2$CF$_3$)$_2$ solution in cyclohexanone (hole conductor: lithium salt ratio 33:4) was again added to the solution. The addition of lithium salt was again followed by a wait time of 3 minutes. Subsequently, in each example, 2.5% of the particular metal oxide in each case, again based on the proportion by weight of the p-conductor, was introduced into the mixture, which was homogenized well by tilting. The storage, filtration, application to the sample and spinning off were effected analogously to example 1 above.

Subsequently, as in example 1, the metal back electrode was again applied as the second electrode.

For the metal oxides and the solvents, combinations specified below were produced, and current-voltage characteristics were measured for each of the photovoltaic components produced according to the examples. Said combinations are:

Example 1: $V_2O_2$ in chlorobenzene (see above)
Example 2: $V_2O_2$ in cyclohexanone
Example 3: $CeO_2$ in chlorobenzene
Example 4: $CeO_2$ in cyclohexanone
Example 5: $Ce(MoO_4)_3$ in chlorobenzene
Example 6: $Ce(MoO_4)_3$ in cyclohexanone
Example 7: $CeO_4C_{10}H_{36}$ in chlorobenzene
Example 8: $CeO_4C_{10}H_{36}$ in cyclohexanone
Example 9: $CeVO_4$ in chlorobenzene
Example 10: $CeVO_4$ in cyclohexanone
Example 11: $CeO_4Zr$ in chlorobenzene
Example 12: $CeO_4Zr$ in cyclohexanone
Example 13: $ReO_3$ in chlorobenzene
Example 14: $ReO_3$ in cyclohexanone
Example 15: $MoO_3$ in chlorobenzene
Example 16: $MoO_3$ in cyclohexanone
Example 17: $Ta_2O_5$ in chlorobenzene
Example 18: $Ta_2O_5$ in cyclohexanone
Example 19: $Ta_2O_5$ in cyclopentanone
Example 20: $CeO_2/Y$ in chlorobenzene
Example 21: $CeO_2/Gd$ in chlorobenzene
Example 22: $C_4CeF_{12}O_{12}S_4$ in chlorobenzene
Example 23: $CrO_3$ in chlorobenzene
Example 24: $V_2O_5$ in methanol and chlorobenzene In addition, several analyses were carried out on the above-described comparative sample after different times and storage:

Example 25, comparative sample, FIG. 3: chlorobenzene without metal oxide, analyzed 2 days after production
Example 26, comparative sample (no figure): as example 42, analysis after two days in dried air.

The current-voltage curves were used in each case to determine the characteristic parameters of short-circuit current $J_{sc}$, open-circuit voltage $V_{oc}$, fill factor FF and efficiency η. The results of these measurements are shown in table 1. In the first column, the abovementioned number of the examples is noted. In the second column, the metal oxide used for doping in each case is listed, in the third column the solvent, in the fourth column ("color change") the particular visual impression of the color change in the p-semiconductor solution after addition of the metal oxide, in the fifth column the short-circuit current density $J_{sc}$, in the sixth column the open-circuit voltage $V_{oc}$, in the seventh column the fill factor, and in the eighth column the efficiency.

TABLE 1 test results of the evaluation of examples 1 to 26.

| Ex. | Metal oxide | Solvent | Color change | $J_{sc}$ (mA/cm$^2$) | $V_{oc}$ (mV) | FF (%) | η (%) |
|---|---|---|---|---|---|---|---|
| 1 | $V_2O_2$ | chlorobenzene | dark brown | 12 | 780 | 63 | 6.0 |
| 2 | $V_2O_2$ | cyclohexanone | light brown | 9.37 | 780 | 59 | 4.3 |
| 3 | $CeO_2$ | chlorobenzene | none | 10.57 | 760 | 52 | 4.2 |
| 4 | $CeO_2$ | cyclohexanone | none | 9.13 | 800 | 61 | 4.4 |
| 5 | $Ce(MoO_4)_3$ | chlorobenzene | light brown | 10.45 | 740 | 58 | 4.5 |
| 6 | $Ce(MoO_4)_3$ | cyclohexanone | dark brown | 9.22 | 800 | 63 | 4.6 |
| 7 | $CeO_4C_{10}H_{36}$ | chlorobenzene | gold | 10.63 | 760 | 44 | 3.6 |
| 8 | $CeO_4C_{10}H_{36}$ | cyclohexanone | dark brown | 9.25 | 780 | 64 | 4.6 |
| 9 | $CeVO_4$ | chlorobenzene | brown | 10.83 | 740 | 56 | 4.5 |
| 10 | $CeVO_4$ | cyclohexanone | gold | 9.25 | 800 | 60 | 4.5 |
| 11 | $CeO_4Zr$ | chlorobenzene | none | 10.3 | 760 | 47 | 3.7 |
| 12 | $CeO_4Zr$ | cyclohexanone | brown | 8.59 | 820 | 63 | 4.4 |
| 13 | $ReO_3$ | chlorobenzene | dark brown | 8.86 | 760 | 64 | 4.3 |
| 14 | $ReO_3$ | cyclohexanone | dark brown | 9.04 | 800 | 60 | 4.3 |
| 15 | $MoO_3$ | chlorobenzene | none | 10.23 | 740 | 58 | 4.4 |
| 16 | $MoO_3$ | cyclohexanone | light brown | 9.14 | 780 | 53 | 3.8 |
| 17 | $Ta_2O_5$ | chlorobenzene | none | 9.67 | 760 | 61 | 4.5 |
| 18 | $Ta_2O_5$ | cyclohexanone | none | 9.55 | 780 | 58 | 4.3 |
| 19 | $Ta_2O_5$ | cyclopentanone | none | 9.47 | 780 | 47 | 3.5 |
| 20 | $CeO_2/Y$ | chlorobenzene | light brown | 7.6 | 820 | 53 | 3.3 |
| 21 | $CeO_2/Gd$ | chlorobenzene | light brown | 7.6 | 800 | 53 | 3.2 |
| 22 | $C_4CeF_{12}O_{12}S_4$ | chlorobenzene | dark brown | 6.6 | 640 | 63 | 2.7 |
| 23 | $CrO_3$ | chlorobenzene | light brown | 8.1 | 800 | 56 | 3.6 |
| 24 | $V_2O_5$ methanol | chlorobenzene | dark brown | 2.2 | 800 | 61 | 1.1 |

TABLE 1-continued test results of the evaluation of examples 1 to 26.

| Ex. | Metal oxide | Solvent | Color change | $J_{sc}$ (mA/cm$^2$) | $V_{oc}$ (mV) | FF (%) | η (%) |
|---|---|---|---|---|---|---|---|
| 25 | Comparative sample (immediate analysis) | chlorobenzene | — | 4.42 | 740 | 25 | 0.8 |
| 26 | Comparative sample (after storage in dry air for 2 days) | chlorobenzene | — | 9.99 | 720 | 56 | 4 |

The results show that especially the fill factors and efficiencies of the inventive photovoltaic components are at least comparable and in some cases even considerably exceed the corresponding values of the above-described comparative example, especially the values of the comparative example (example 25). Only after the samples of the comparative example have been stored under air for the purpose of p-doping of the p-semiconductor are the comparative samples comparable with inventive examples, in terms of their values. However, this means, conversely, that inventive photovoltaic components can be produced with exclusion of air, for example under inert gas. After the production, encapsulation can be undertaken without the sample to be encapsulated already being contaminated significantly with oxygen or moisture, which could, for example, attack and corrode the counterelectrode later in the encapsulated state. However, the production with exclusion of air and the encapsulation can have a very positive effect on the lifetime of the photovoltaic components.

Figure 4:
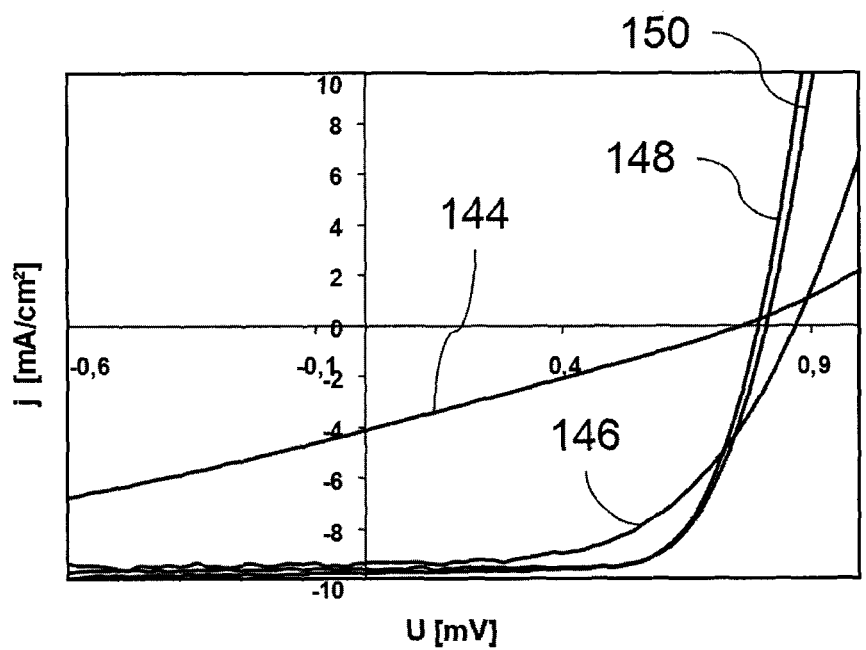
FIG. 4 current-voltage characteristics of samples with and without metal oxide after different times.

FIG. 4 shows current-voltage characteristics of different samples, which have been recorded at different times after the production. Reference numeral 144 denotes a characteristic of a comparative sample analyzed immediately after production. Reference numeral 146 denotes a characteristic of the comparative sample analyzed after two days of storage under air. Reference numeral 148 denotes a sample with V$_2$O$_5$ doping according to example 1 above, analyzed directly after production, and reference numeral 150 an analysis on the sample according to example 1, analyzed after two days of storage under air. The characteristic parameters which have been determined from the curves in FIG. 4 are shown in table 2.

TABLE 2

Characteristic parameters of the inventive samples and of the comparative samples at different times after production

| | Isc [mA/cm$^2$] | $V_{oc}$ [mV] | FF [%] | η [%] |
|---|---|---|---|---|
| without V$_2$O$_5$ t = 0 | 4.13 | 760 | 26 | 0.8 |
| without V$_2$O$_5$, t = 2 days | 9.29 | 860 | 55 | 4.4 |
| with V$_2$O$_5$, t = 0 | 9.71 | 800 | 68 | 5.3 |
| with V$_2$O$_5$, t = 2 days | 9.56 | 800 | 70 | 5.4 |

The analysis results show clearly that the inventive samples barely change over time. The comparative samples, in contrast, are subject to a strong time dependence, which might be attributable to doping effects with oxygen.

Even after storage under air, however, the comparative samples do not reach the fill factors and efficiencies of the inventive samples.

Figure 5:
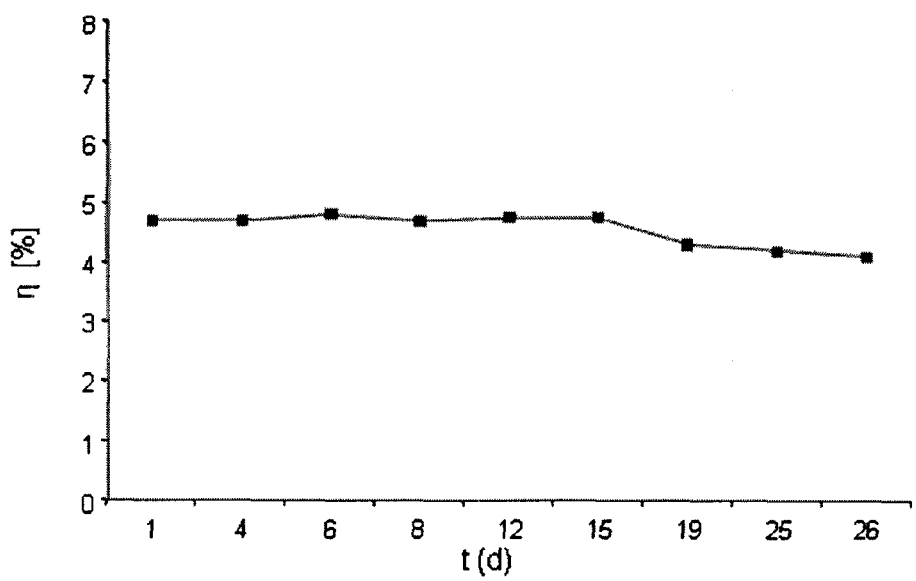
FIG. 5 efficiencies of inventive samples at different times after production.

In order to demonstrate that the high efficiency of the inventive samples produced has a high long-term stability, efficiencies were additionally determined over a prolonged period. For this purpose, samples according to example 1 above were stored under air over a prolonged period, and efficiencies of these samples were determined at regular intervals. The results of these analyses are shown in FIG. 5, with the efficiencies η plotted as a function of time t in days (d). It is evident from these analyses that the efficiencies of the inventive samples virtually do not fall even over a period of nearly one month, and remain at a uniformly high level between 4 and 5%.

As stated above, the p-semiconductor and/or the matrix material thereof can especially be doped by mixing the metal oxide into the p-semiconductor or the matrix material thereof, for example in solution. Alternatively or additionally to the preferred mixing in the liquid phase, the at least one metal oxide, however, can also be introduced into the p-semiconductor in another way. One example is vapor deposition, sputtering or another kind of subsequent or preceding application of the metal oxide to and/or below at least one layer of the p-semiconductor or of the matrix material.

Table 3 shows various tests (examples 27 to 52) in which the method of introduction of the metal oxide and/or the concentration of the metal oxide were altered. In principle, all samples of the examples mentioned in table 3 were produced analogously to example 1 above, with the exception of the introduction of the metal oxide. In the "Comment" column, the special feature of the sample of the particular example is stated in each case. A thickness figure shows in each case that a layer of the metal oxide was applied by vapor deposition. For example, in example 27, after the application of the spiro-MeOTAD as a p-semiconductor or matrix material, 5 nm of vanadium pentoxide were applied by vapor deposition. In the case of sample 28, in contrast, 0.1% vanadium pentoxide was mixed into the solution, but it was not filtered. In the case of sample 29, both mixing of vanadium pentoxide into the spiro-MeOTAD solution and vapor deposition of 5 nm of vanadium pentoxide onto the spiro-MeOTAD layer were effected. In some of the experiments, the solvents were additionally varied in accordance with the information in table 3. In addition, the concentrations of the vanadium pentoxide were varied. Table 3 again reports the characteristic data of the photovoltaic components produced in this way. The last column describes the light intensity at which the analyses were carried out. The values are reported in % sun, where 100% corresponds to a light intensity of one sun, corresponding to 1000 W/m$^2$.

TABLE 3

Comparison of examples with different methods of introduction of the metal oxide and different concentrations of the metal oxide

| Ex. | Comment | $I_{sc}$ [mA/cm$^2$] | $V_{oc}$ [mV] | FF [%] | η [%] | Sun [mW/cm$^2$] |
|---|---|---|---|---|---|---|
| 27 | Spiro-MeOTAD/5 nm V$_2$O$_5$ | −11.56 | 720 | 53 | 4.4 | 99.8 |
| 28 | Spiro-MeOTAD + 0.1% V$_2$O$_5$ not filtered | −8.23 | 860 | 55 | 4.0 | 96 |
| 29 | Spiro-MeOTAD + 0.1% V$_2$O$_5$ not filtered + 5 nm V$_2$O$_5$ | −7.79 | 840 | 62 | 4.2 | 96 |
| 30 | Spiro-MeOTAD + 0.1% V$_2$O$_5$ filtered | −8.02 | 840 | 61 | 4.1 | 101.2 |
| 31 | Spiro-MeOTAD + 0.1% V$_2$O$_5$ filtered + 5 nm V$_2$O$_5$ | −7.92 | 860 | 63 | 4.3 | 99.4 |
| 32 | Spiro-MeOTAD + 0.5% V$_2$O$_5$ not filtered | −7.28 | 840 | 64 | 3.9 | 99.4 |
| 33 | Spiro-MeOTAD + 0.5% V$_2$O$_5$ not filtered + 5 nm V$_2$O$_5$ | −6.8 | 860 | 65 | 3.8 | 99.4 |
| 34 | Spiro-MeOTAD + 0.5% V$_2$O$_5$ filtered | −7.63 | 860 | 64 | 4.2 | 99.4 |
| 35 | Spiro-MeOTAD + 0.5% V$_2$O$_5$ filtered + 5 nm V$_2$O$_5$ | −7.84 | 860 | 64 | 4.3 | 99.4 |
| 36 | Spiro-MeOTAD + 1.0% V$_2$O$_5$ not filtered | −7.98 | 840 | 59 | 3.9 | 101.7 |
| 37 | Spiro-MeOTAD + 1.0% V$_2$O$_5$ not filtered + 5 nm V$_2$O$_5$ | −7.62 | 860 | 62 | 3.9 | 104.2 |
| 38 | Spiro-MeOTAD + 1.0% V$_2$O$_5$ filtered | −7.93 | 800 | 74 | 4.7 | 102.9 |
| 39 | Spiro-MeOTAD + 1.0% V$_2$O$_5$ filtered + 5 nm V$_2$O$_5$ | −7.22 | 840 | 64 | 3.8 | 101.7 |
| 40 | Spiro-MeOTAD + 2.5% V$_2$O$_5$ not filtered | −7.45 | 860 | 66 | 4.1 | 101.7 |
| 41 | Spiro-MeOTAD + 2.5% V$_2$O$_5$ not filtered + 5 nm V$_2$O$_5$ | −7.26 | 860 | 65 | 4.0 | 101.7 |
| 42 | Spiro-MeOTAD in chlorobenzene + 2.5% V$_2$O$_5$ | −9.71 | 800 | 68 | 5.3 | 100 |
| 43 | Spiro-MeOTAD + 2.5% V$_2$O$_5$/5 nm V$_2$O$_5$ | −10.24 | 780 | 62 | 5.0 | 99.2 |
| 44 | Spiro-MeOTAD + 5.0% V$_2$O$_5$ not filtered | −7.91 | 860 | 60 | 4.1 | 101.2 |
| 45 | Spiro-MeOTAD + 5.0% V$_2$O$_5$ not filtered + 5 nm V$_2$O$_5$ | −7.58 | 840 | 62 | 3.9 | 101.2 |
| 46 | Spiro-MeOTAD + 5.0% V$_2$O$_5$ filtered | −8.07 | 860 | 61 | 4.2 | 101.2 |
| 47 | Spiro-MeOTAD + 5.0% V$_2$O$_5$ filtered + 5 nm V$_2$O$_5$ | −7.86 | 860 | 60 | 4.0 | 101.2 |
| 48 | Spiro-MeOTAD + 10.0% V$_2$O$_5$ not filtered | −6.94 | 880 | 66 | 4.0 | 101.2 |
| 49 | Spiro-MeOTAD + 10.0% V$_2$O$_5$ not filtered + 5 nm V$_2$O$_5$ | −6.34 | 880 | 55 | 3.1 | 101.2 |
| 50 | Spiro-MeOTAD + 10.0% V$_2$O$_5$ filtered | −6.6 | 880 | 64 | 3.7 | 101.2 |
| 51 | Spiro-MeOTAD + 100% V$_2$O$_5$ filtered + 5 nm V$_2$O$_5$ | −6.72 | 880 | 67 | 3.9 | 101.2 |
| 52 | Spiro-MeOTAD in toluene/ethanol 10:1 + 1% V$_2$O$_5$ in MeOH | −0.15 | 300 | 36 | 0.0 | 96.7 |

The results in table 3 show that the highest efficiencies are achieved when the metal oxide is mixed directly into the liquid phase of the p-semiconductor or of the matrix material and is applied to the carrier element together with the latter. Application of the metal oxide as a separate layer before or after the application of the p-semiconductor or carrier material, in contrast, leads to lower efficiencies. The highest efficiencies were achieved with spiro-MeOTAD in chlorobenzene with an addition of 2.5% vanadium pentoxide.

As further possible parameters for variation, the selection of the metal oxide was varied in a series of experiments. Compounds used as dopants also included those which comprise metals, but not in form. The results of these experiments are shown in table 4.

TABLE 4

Comparison of examples with different types of metal oxides

| Ex. | Comment | $I_{sc}$ [mA/cm$^2$] | $V_{oc}$ [mV] | FF [%] | η [%] | Sun [mW/cm$^2$] |
|---|---|---|---|---|---|---|
| 53 | Spiro-MeOTAD without dopant | −4.76 | 700 | 25 | 0.8 | 102 |
| 54 | Spiro-MeOTAD/5 nm V$_2$O$_5$ | −11.56 | 720 | 53 | 4.4 | 99.8 |
| 55 | Spiro-MeOTAD + 1% V$_2$O$_5$ | −7.93 | 800 | 74 | 4.7 | 102.9 |
| 56 | Spiro-MeOTAD + 2.5% V$_2$O$_5$/5 nm V$_2$O$_5$ | −10.24 | 780 | 62 | 5.0 | 99.2 |
| 57 | Spiro-MeOTAD in chlorobenzene + 2.5% V$_2$O$_5$ | −9.71 | 800 | 68 | 5.3 | 100 |
| 58 | Spiro-MeOTAD in toluene/ethanol 10:1 + 1% V$_2$O$_5$ in MeOH | −0.15 | 300 | 36 | 0.0 | 96.7 |
| 59 | Spiro-MeOTAD/5 nm ReO$_3$ | −11.75 | 700 | 41 | 3.4 | 99.8 |
| 60 | Spiro-MeOTAD + 1% V$_2$O$_5$/5 nm ReO$_3$ | −10.55 | 740 | 60 | 4.7 | 99.1 |
| 61 | Spiro-MeOTAD + 0.2% ReO$_3$ | −4.81 | 860 | 63 | 2.6 | 100 |
| 62 | Spiro-MeOTAD/5 nm MoO$_3$ | −4.32 | 860 | 64 | 2.4 | 100.3 |
| 63 | Spiro-MeOTAD/10 nm MoO$_3$/spiro-MeOTAD + 0.01% MoO$_3$/5 nm MoO$_3$ | −4.1 | 860 | 61 | 2.1 | 102.2 |
| 64 | Spiro-MeOTAD + 0.2% MoO$_3$/5 nm MoO$_3$ | −5.36 | 840 | 67 | 3.0 | 99.6 |
| 66 | Spiro-MeOTAD + 3.0% cerium(III) tungstate in the spiro-MeOTAD | −10.89 | 760 | 52 | 4.3 | 100 |
| 67 | Spiro-MeOTAD + 1% FeCl$_3$ | −0.4 | 450 | 48 | 0.1 | 97.8 |
| 68 | Spiro-MeOTAD + 1% Cl$_2$Sb | −1.07 | 250 | 31 | 0.1 | 98.4 |

Again, both samples in which the metal oxide or the "dopant" was mixed into the matrix material of the p-semiconductor and samples in which the dopant was applied separately, before or after application of the p-semiconductor or matrix material, were produced. With regard to the nomenclature of the sample production, which again followed example 1 above with the exception of the production of the p-semiconductor, reference may be made to the description of table 3.

The results shown in table 4 again show firstly that combined application of the metal oxide and of the matrix material from a combined liquid phase is particularly advantageous. The highest efficiency was again found for 2.5% vanadium pentoxide in a combined liquid phase with spiro-MeOTAD with use of chlorobenzene as a solvent (example 74). In addition, the results in table 4 also show, however, that metal oxides have considerably higher efficiencies compared to other metallic compounds, as, for example, in examples 83 and 84.

As a further possible parameter for variation, it was examined in a test series whether the positive effect of doping by metal oxides also occurs in other p-semiconductors, more particularly in other matrix materials with p-semiconductive properties. Accordingly, tests were carried out in which, in example 1 above, the spiro-MeOTAD was replaced by other matrix materials. The results are shown in table 5.

TABLE 5
Comparison of examples with different p-semiconductors
| Ex. | Matrix material | $I_{sc}$ [MA/cm$^2$] | $V_{oc}$ [mV] | FF [%] | η [%] |
|---|---|---|---|---|---|
| 69 | ID522, without V$_2$O$_5$ | 8.93 | 855 | 43 | 3.3 |
| 70 | ID522, with V$_2$O$_5$ | −7.9 | 720 | 63 | 3.6 |
| 71 | ID367, without V$_2$O$_5$ | −8.17 | 760 | 32 | 2 |
| 72 | ID367, with V$_2$O$_5$ | −8.88 | 760 | 55 | 3.6 |
ID522 refers to an arylamine with the following structural formula:
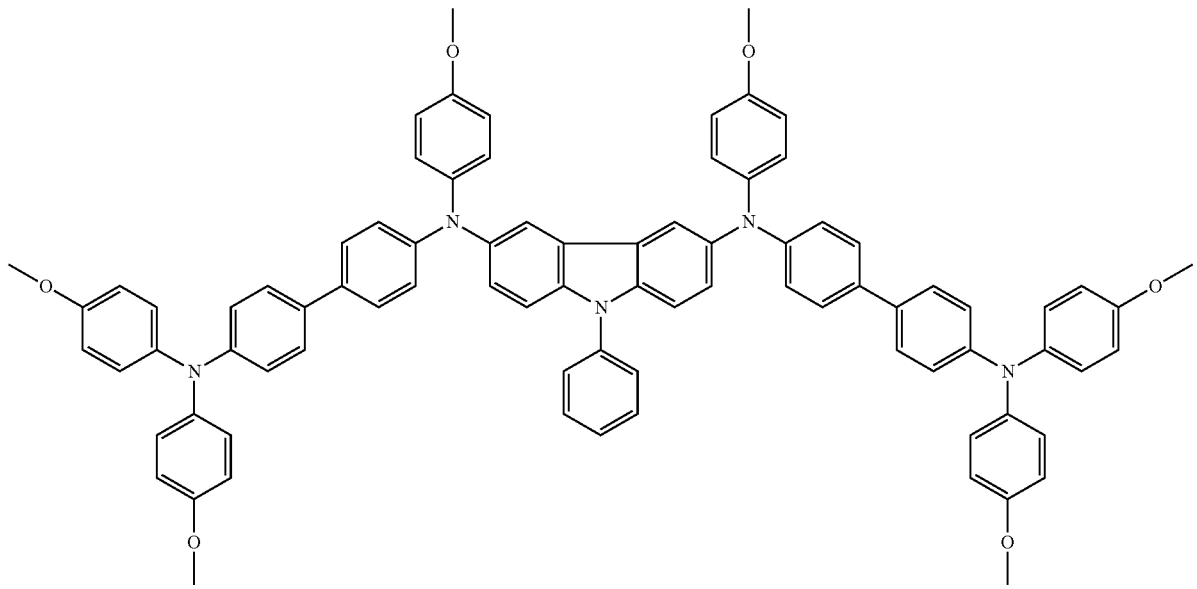
ID522
ID367 likewise refers to an arylamine, but with the following structural formula:
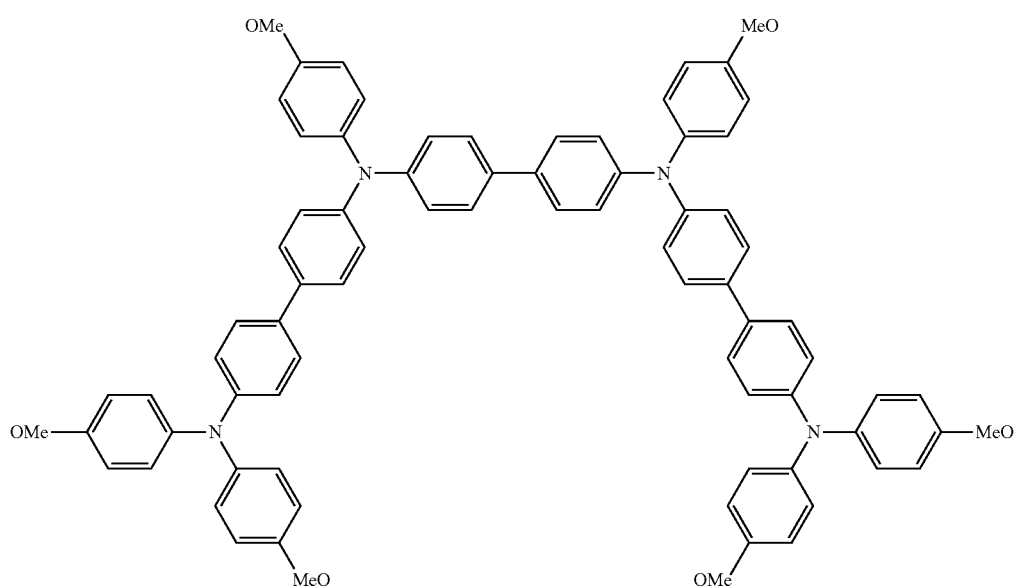
ID367

The results in table 5 show that the positive effect of doping by the metal oxide vanadium pentoxide also occurs in other p-semiconductors or matrix materials. However, the use of spiro compounds appears to be particularly efficient, especially that of spiro-MeOTAD.

Finally, synthesis examples of low molecular weight organic p-semiconductors are also listed hereinafter, which are usable individually or in combination in the context of the present invention and which can, for example, satisfy the formula I given above.

SYNTHESIS EXAMPLES

Synthesis of Compounds of the Formula I

A) Syntheses:
Synthesis Route I:
Synthesis Step I-R1:

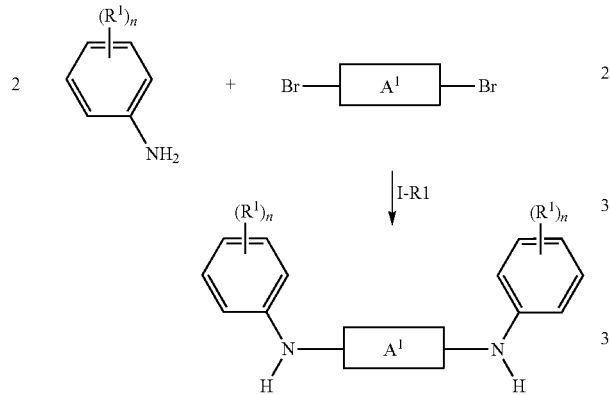

The synthesis in synthesis step I-R1 was based on the references cited below:
a) Liu, Yunqi; Ma, Hong; Jen, Alex K-Y.; CHCOFS; Chem. Commun.; 24; 1998; 2747-2748,
b) Goodson, Felix E.; Hauck, Sheila; Hartwig, John F.; J. Am. Chem. Soc.; 121; 33; 1999; 7527-7539,
c) Shen, Jiun Yi; Lee, Chung Ying; Huang, Tai-Hsiang; Lin, Jiann T.; Tao, Yu-Tai; Chien, Chin-Hsiung; Tsai, Chiitang; J. Mater. Chem.; 15; 25; 2005; 2455-2463,
d) Huang, Ping-Hsin; Shen, Jiun-Yi; Pu, Shin-Chien; Wen, Yuh-Sheng; Lin, Jiann T.; Chou, Pi-Tai; Yeh, Ming-Chang P.; J. Mater. Chem.; 16; 9; 2006; 850-857,
e) Hirata, Narukuni; Kroeze, Jessica E.; Park, Taiho; Jones, David; Hague, Saif A.; Holmes, Andrew B.; Durrant, James R.; Chem. Commun.; 5; 2006; 535-537.

Synthesis Step I-R2:

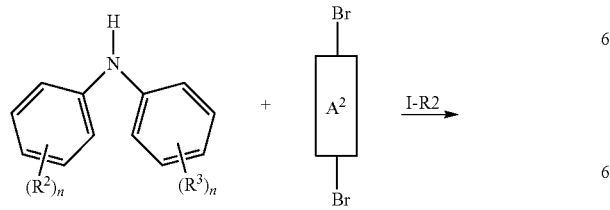

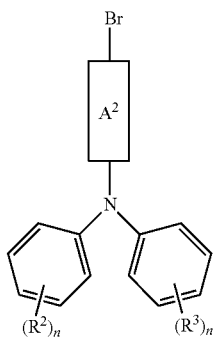

The synthesis in synthesis step I-R2 was based on the references cited below:
a) Huang, Qinglan; Evmenenko, Guennadi; Dutta, Pulak; Marks, Tobin J.; J. Am. Chem. Soc.; 125; 48; 2003; 14704-14705,
b) Bacher, Erwin; Bayerl, Michael; Rudati, Paula; Reckefuss, Nina; Mueller, C. David; Meerholz, Klaus; Nuyken, Oskar; Macromolecules; EN; 38; 5; 2005; 1640-1647,
c) Li, Zhong Hui; Wong, Man Shing; Tao, Ye; D'Iorio, Marie; J. Org. Chem.; EN; 69; 3; 2004; 921-927.

Synthesis Step I-R3:

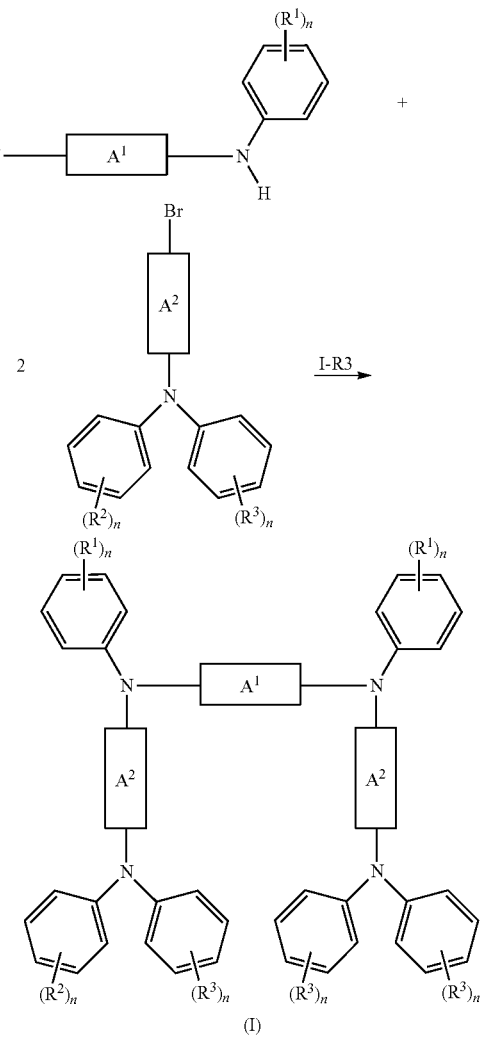

The synthesis in synthesis step I-R3 was based on the reference cited below:

J. Grazulevicius; J. of Photochem. and Photobio., A: Chemistry 2004 162(2-3), 249-252.

The compounds of the formula I can be prepared via the sequence of synthesis steps shown above in synthesis route I. The reactants can be coupled, for example, by Ullmann reaction with copper as a catalyst or under palladium catalysis.

Synthesis Route II:
Synthesis Step II-R1:

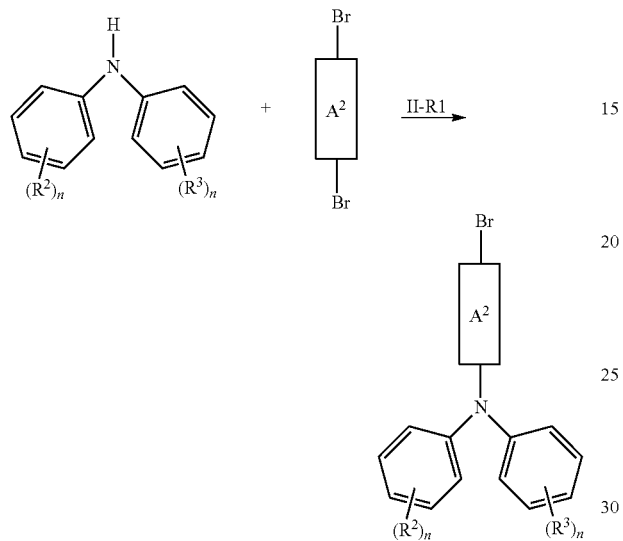

The synthesis in synthesis step II-R1 was based on the references cited under I-R2.

Synthesis Step II-R2:

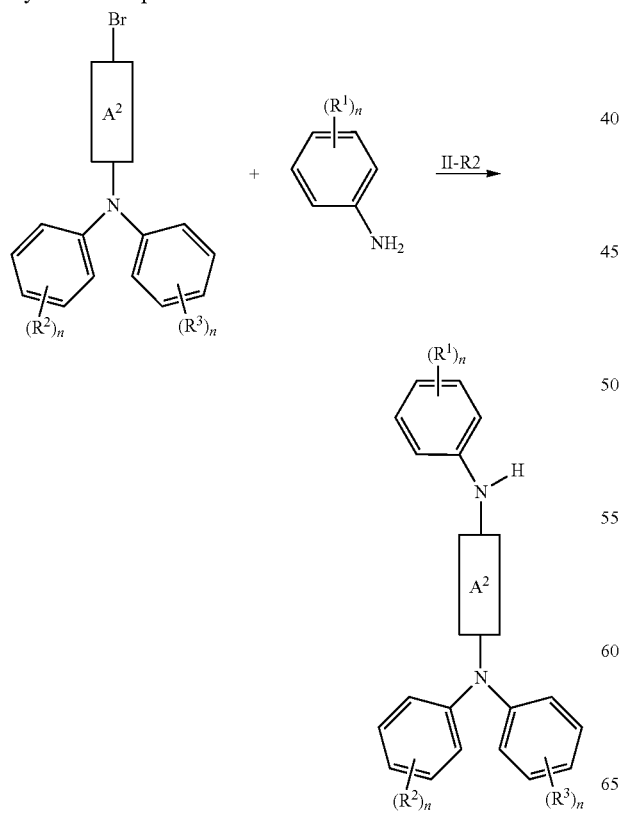

The synthesis in synthesis step II-R2 was based on the references cited below:

a) Bacher, Erwin; Bayerl, Michael; Rudati, Paula; Reckefuss, Nina; Müller, C. David; Meerholz, Klaus; Nuyken, Oskar; Macromolecules; 38; 5; 2005; 1640-1647, b) Goodson, Felix E.; Hauck, Sheila; Hartwig, John F.; J. Am. Chem. Soc.; 121; 33; 1999; 7527-7539; Hauck, Sheila I.; Lakshmi, K. V.; Hartwig, John F.; Org. Lett.; 1; 13; 1999; 2057-2060.

Synthesis Step II-R3:

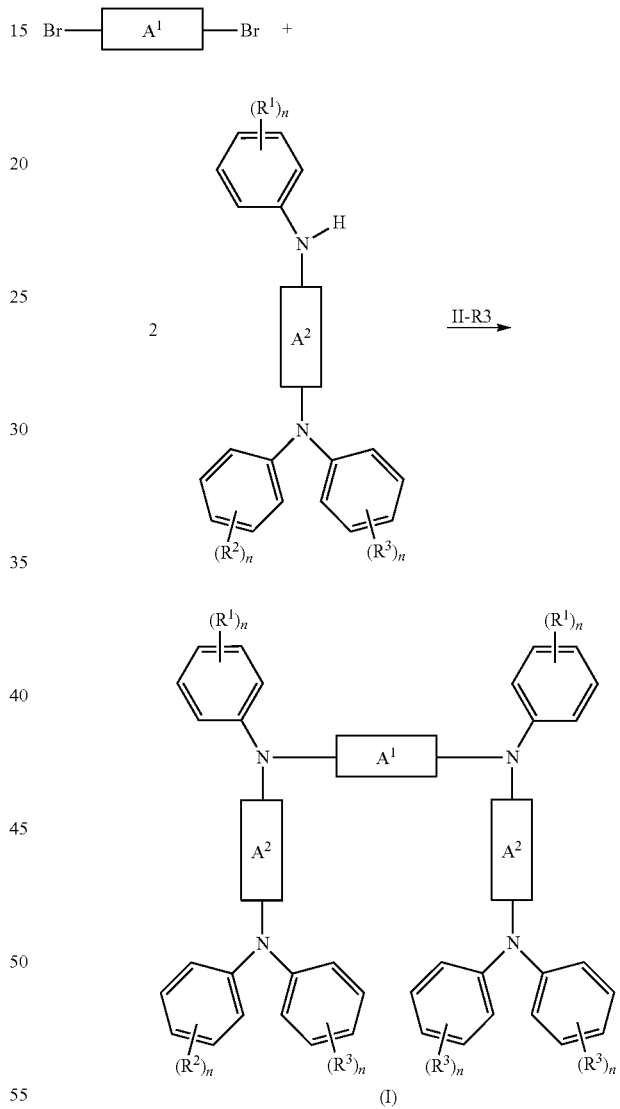

The compounds of the formula I can be prepared via the sequence of synthesis steps shown above in synthesis route II. The reactants can be coupled, as also in synthesis route I, for example, by Ullmann reaction with copper as a catalyst or under palladium catalysis.

Preparation of the Starting Amines:

When the diarylamines in synthesis steps I-R2 and II-R1 of synthesis routes I and II are not commercially available, they can be prepared, for example, by Ullmann reaction with copper as a catalyst or under palladium catalysis, according to the following reaction:

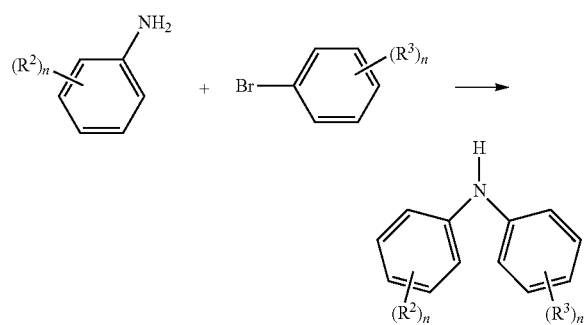

The synthesis was based on the review articles listed below:

Palladium-Catalyzed C—N Coupling Reactions:
a) Yang, Buchwald; J. Organomet. Chem. 1999, 576 (1-2), 125-146,
b) Wolfe, Marcoux, Buchwald; Acc. Chem. Res. 1998, 31, 805-818,
c) Hartwig; Angew. Chem. Int. Ed. Engl. 1998, 37, 2046-2067.

Copper-Catalyzed C—N Coupling Reactions:
a) Goodbrand, Hu; Org. Chem. 1999, 64, 670-674,
b) Lindley; Tetrahedron 1984, 40, 1433-1456.

Synthesis Example 1

Synthesis of the Compound ID367 (Synthesis Route I)

Synthesis Step I-R1:

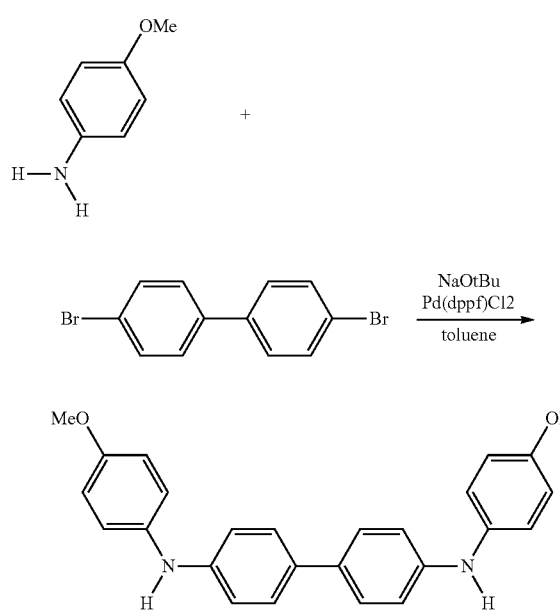

A mixture of 4,4'-dibromobiphenyl (93.6 g; 300 mmol), 4-methoxyaniline (133 g; 1.08 mol), Pd(dppf)Cl$_2$ (Pd(1,1'-bis(diphenylphosphino)ferrocene)Cl$_2$; 21.93 g; 30 mmol) and t-BuONa (sodium tert-butoxide; 109.06 g; 1.136 mol) in toluene (1500 ml) was stirred under a nitrogen atmosphere at 110° C. for 24 hours. After cooling, the mixture was diluted with diethyl ether and filtered through a Celite® pad (from Carl Roth). The filter bed was washed with 1500 ml each of ethyl acetate, methanol and methylene chloride. The product was obtained as a light brown solid (36 g; yield: 30%).

$^1$H NMR (400 MHz, DMSO): δ 7.81 (s, 2H), 7.34-7.32 (m, 4H), 6.99-6.97 (m, 4H), 6.90-6.88 (m, 4H), 6.81-6.79 (m, 4H), 3.64 (s, 6H).

Synthesis Step I-R2:

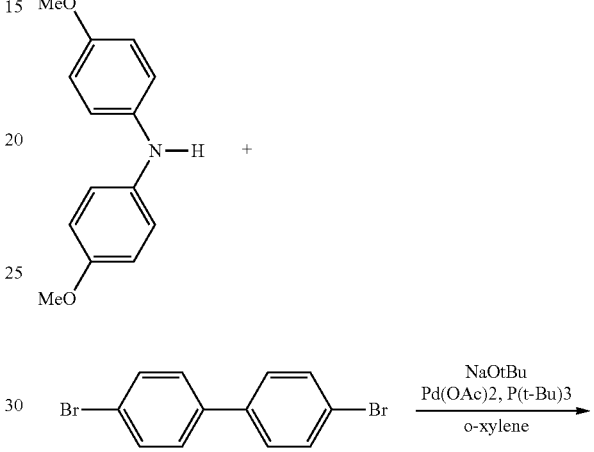

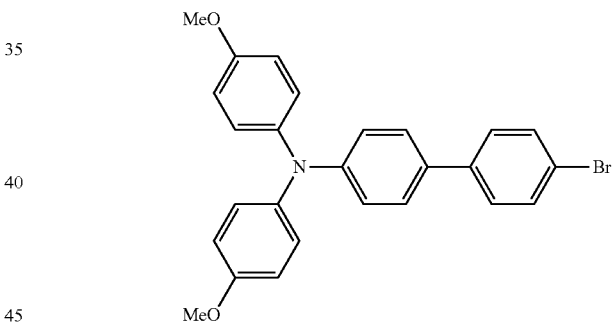

Nitrogen was passed for a period of 10 minutes through a solution of dppf (1,1'-bis(diphenyl-phosphino)ferrocene; 0.19 g; 0.34 mmol) and Pd$_2$(dba)$_3$ (tris(dibenzylideneacetone)-dipalladium(0); 0.15 g; 0.17 mmol) in toluene (220 ml). Subsequently, t-BuONa (2.8 g; 29 mmol) was added and the reaction mixture was stirred for a further 15 minutes. 4,4'-Dibromobiphenyl (25 g; 80 mmol) and 4,4'-dimethoxydiphenylamine (5.52 g; 20 mmol) were then added successively. The reaction mixture was heated at a temperature of 100° C. under a nitrogen atmosphere for 7 hours. After cooling to room temperature, the reaction mixture was quenched with ice-water, and the precipitated solid was filtered off and dissolved in ethyl acetate. The organic layer was washed with water, dried over sodium sulfate and purified by column chromatography (eluent: 5% ethyl acetate/hexane). A pale yellow solid was obtained (7.58 g, yield: 82%).

$^1$H NMR (300 MHz, DMSO-d$_6$): 7.60-7.49 (m, 6H), 7.07-7.04 (m, 4H), 6.94-6.91 (m, 4H), 6.83-6.80 (d, 2H), 3.75 (s, 6H).

Synthesis Step I-R3:

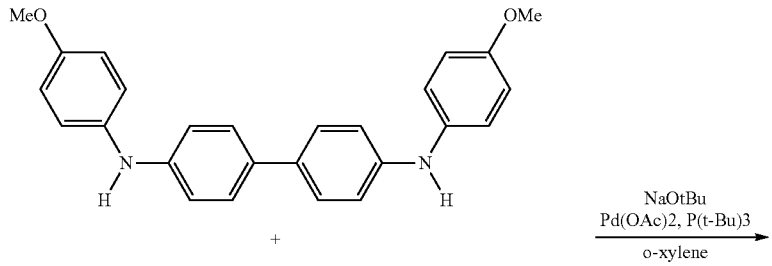

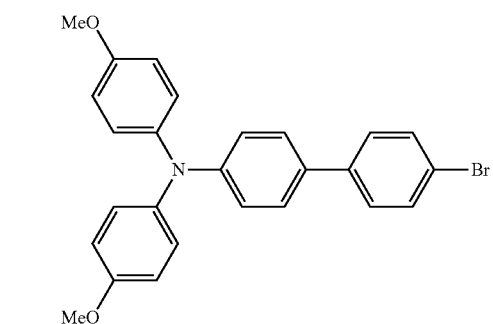

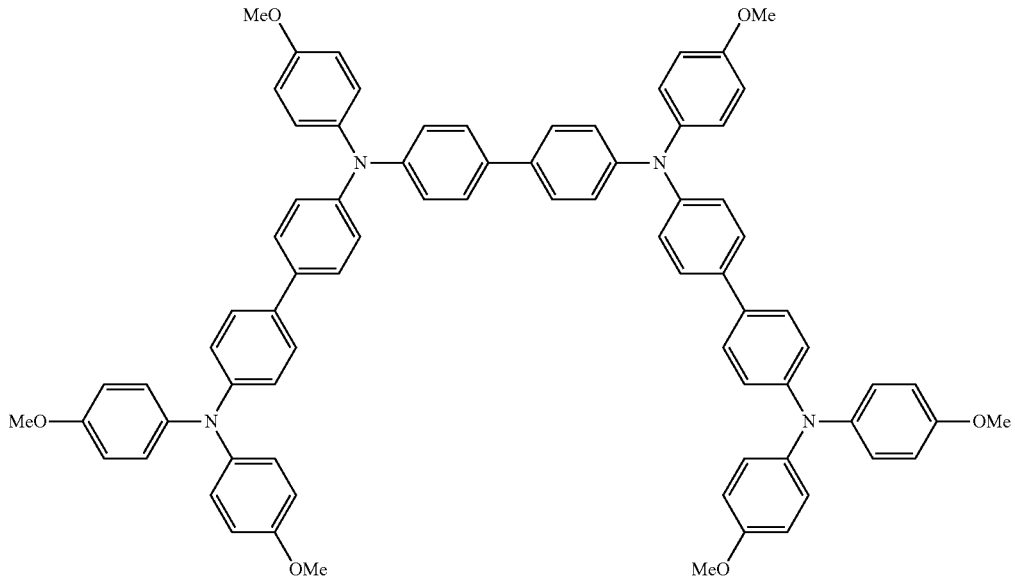

ID367

N⁴,N⁴'-Bis(4-methoxyphenyl)biphenyl-4,4'-diamine (product from synthesis step I-R1; 0.4 g; 1.0 mmol) and product from synthesis step I-R2 (1.0 g; 2.2 mmol) were added under a nitrogen atmosphere to a solution of t-BuONa (0.32 g; 3.3 mmol) in o-xylene (25 ml). Subsequently, palladium acetate (0.03 g; 0.14 mmol) and a solution of 10% by weight of P(t-Bu)$_3$ (tris-t-butylphosphine) in hexane (0.3 ml; 0.1 mmol) were added to the reaction mixture which was stirred at 125° C. for 7 hours. Thereafter, the reaction mixture was diluted with 150 ml of toluene and filtered through Celite®, and the organic layer was dried over Na$_2$SO$_4$. The solvent was removed and the crude product was reprecipitated three times from a mixture of tetrahydrofuran (THF)/methanol. The solid was purified by column chromatography (eluent: 20% ethyl acetate/hexane), followed by a precipitation with THF/methanol and an activated carbon purification. After removing the solvent, the product was obtained as a pale yellow solid (1.0 g, yield: 86%).

$^1$H NMR (400 MHz, DMSO-d$_6$): 7.52-7.40 (m, 8H), 6.88-7.10 (m, 32H), 6.79-6.81 (d, 4H), 3.75 (s, 6H), 3.73 (s, 12H).

Synthesis Example 2

Synthesis of the Compound ID447 (Synthesis Route II)

Synthesis Step I-R1:

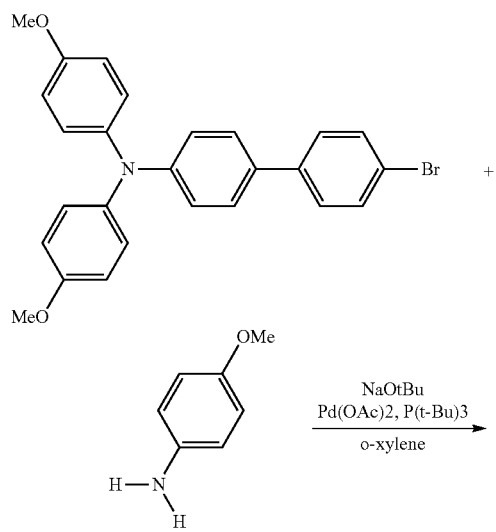

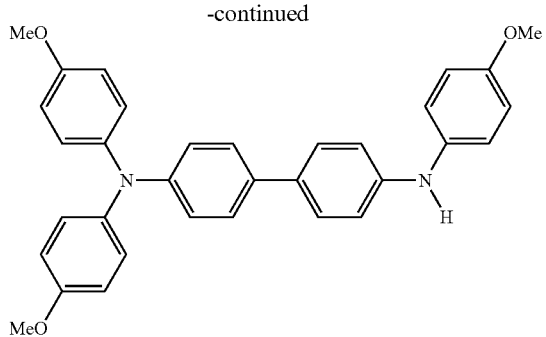

p-Anisidine (5.7 g, 46.1 mmol), t-BuONa (5.5 g, 57.7 mol) and P(t-Bu)$_3$ (0.62 ml, 0.31 mmol) were added to a solution of the product from synthesis step I-R2 (17.7 g, 38.4 mmol) in toluene (150 ml). After nitrogen had been passed through the reaction mixture for 20 minutes, Pd$_2$(dba)$_3$ (0.35 g, 0.38 mmol) was added. The resulting reaction mixture was left to stir under a nitrogen atmosphere at room temperature for 16 hours. Subsequently, it was diluted with ethyl acetate and filtered through Celite®. The filtrate was washed twice with 150 ml each of water and saturated sodium chloride solution. After the organic phase had been dried over Na$_2$SO$_4$ and the solvent had been removed, a black solid was obtained. This solid was purified by column chromatography (eluent: 0-25% ethyl acetate/hexane). This afforded an orange solid (14 g, yield: 75%).

$^1$H NMR (300 MHz, DMSO): 7.91 (s, 1H), 7.43-7.40 (d, 4H), 7.08-6.81 (m, 16H), 3.74 (s, 6H), 3.72 (s, 3H).

Synthesis Step I-R3:

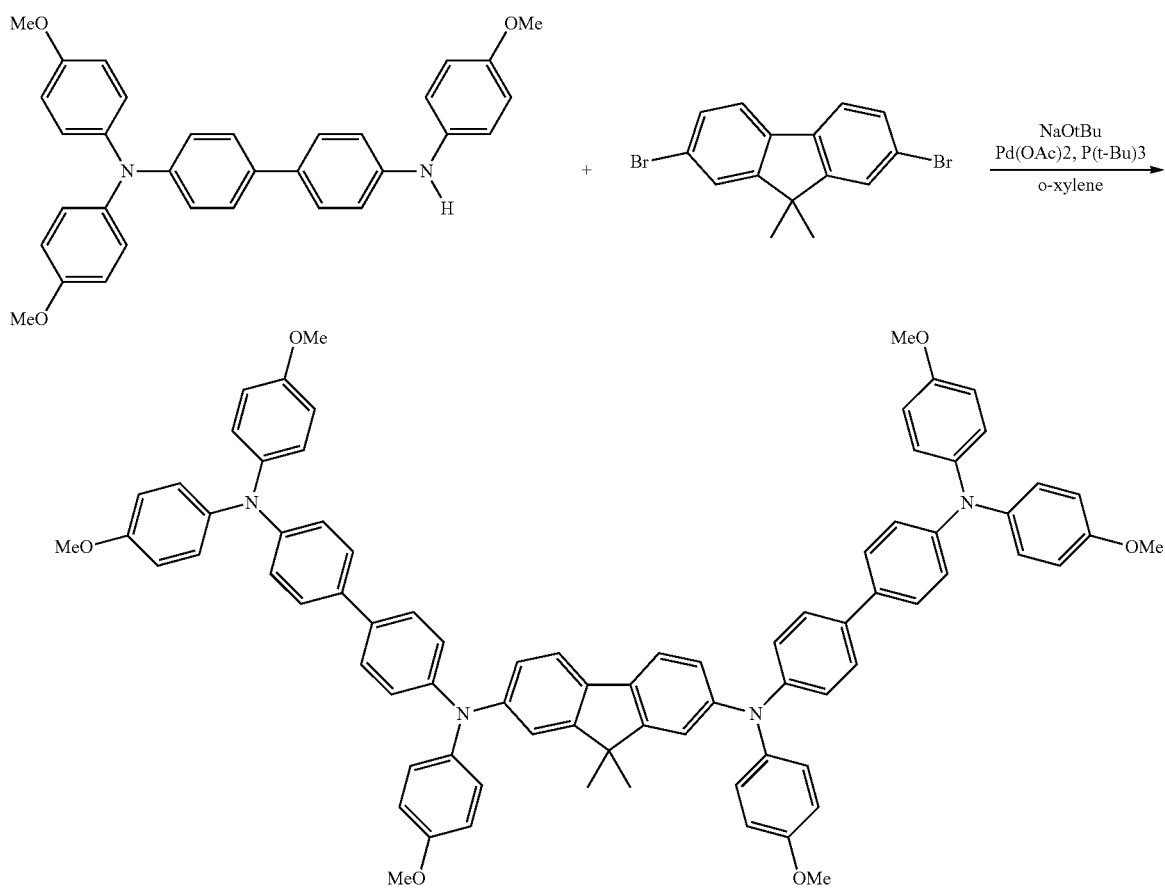

ID447 t-BuONa (686 mg; 7.14 mmol) was heated at 100° C. under reduced pressure, then the reaction flask was purged with nitrogen and allowed to cool to room temperature. 2,7-Dibromo-9,9-dimethylfluorene (420 mg; 1.19 mmol), toluene (40 ml) and Pd[P($^t$Bu)$_3$]$_2$ (20 mg; 0.0714 mmol) were then added, and the reaction mixture was stirred at room temperature for 15 minutes. Subsequently, N,N,N'-p-trimethoxytriphenylbenzidine (1.5 g; 1.27 mmol) was added to the reaction mixture which was stirred at 120° C. for 5 hours. The mixture was filtered through a Celite®/MgSO$_4$ mixture and washed with toluene. The crude product was purified twice by column chromatography (eluent: 30% ethyl acetate/hexane) and, after twice reprecipitating from THF/methanol, a pale yellow solid was obtained (200 mg, yield: 13%).

$^1$H NMR: (400 MHz, DMSO-d$_6$): 7.60-7.37 (m, 8H), 7.02-6.99 (m, 16H), 6.92-6.87 (m, 20H), 6.80-6.77 (d, 2H), 3.73 (s, 6H), 3.71 (s, 12H), 1.25 (s, 6H)

Synthesis Example 3

Synthesis of the Compound ID453 (Synthesis Route I)

a) Preparation of the Starting Amine:
Step 1:

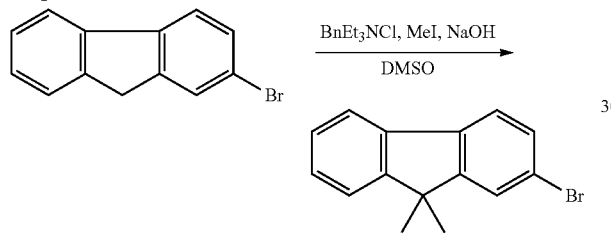

NaOH (78 g; 4 eq) was added to a mixture of 2-bromo-9H-fluorene (120 g; 1 eq) and BnEt$_3$NCl (benzyltriethylammonium chloride; 5.9 g; 0.06 eq) in 580 ml of DMSO (dimethyl sulfoxide). The mixture was cooled with ice-water, and methyl iodide (MeI) (160 g; 2.3 eq) was slowly added dropwise. The reaction mixture was left to stir overnight, then poured into water and subsequently extracted three times with ethyl acetate. The combined organic phases were washed with a saturated sodium chloride solution and dried over Na$_2$SO$_4$, and the solvent was removed. The crude product was purified by column chromatography using silica gel (eluent: petroleum ether). After washing with methanol, the product (2-bromo-9,9'-dimethyl-9H-fluorene) was obtained as a white solid (102 g).

$^1$H NMR (400 MHz, CDCl$_3$): δ 1.46 (s, 6H), 7.32 (m, 2H), 7.43 (m, 2H), 7.55 (m, 2H), 7.68 (m, 1H)
Step 2:

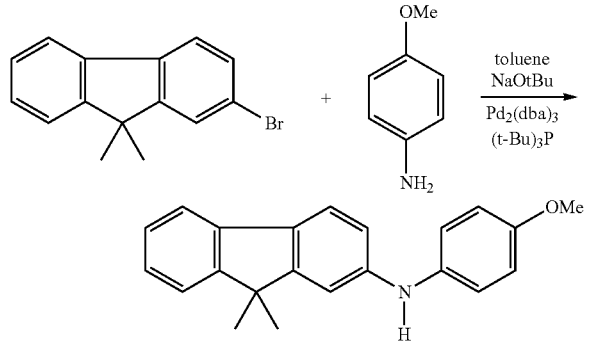

p-Anisidine (1.23 g; 10.0 mmol) and 2-bromo-9,9'-dimethyl-9H-fluorene (3.0 g; 11.0 mmol) were added under a nitrogen atmosphere to a solution of t-BuONa (1.44 g; 15.0 mmol) in 15 ml of toluene (15 ml). Pd$_2$(dba)$_3$ (92 mg; 0.1 mmol) and a 10% by weight solution of P(t-Bu)$_3$ in hexane (0.24 ml; 0.08 mmol) were added, and the reaction mixture was stirred at room temperature for 5 hours. Subsequently, the mixture was quenched with ice-water, and the precipitated solid was filtered off and dissolved in ethyl acetate. The organic phase was washed with water and dried over Na$_2$SO$_4$. After purifying the crude product by column chromatography (eluent: 10% ethyl acetate/hexane), a pale yellow solid was obtained (1.5 g, yield: 48%).

$^1$H NMR (300 MHz, C$_6$D$_6$): 7.59-7.55 (d, 1H), 7.53-7.50 (d, 1H), 7.27-7.22 (t, 2H), 7.19 (s, 1H), 6.99-6.95 (d, 2H), 6.84-6.77 (m, 4H), 4.99 (s, 1H), 3.35 (s, 3H), 1.37 (s, 6H).

b) Preparation of the Compound for Use in Accordance with the Invention

Synthesis Step I-R2:

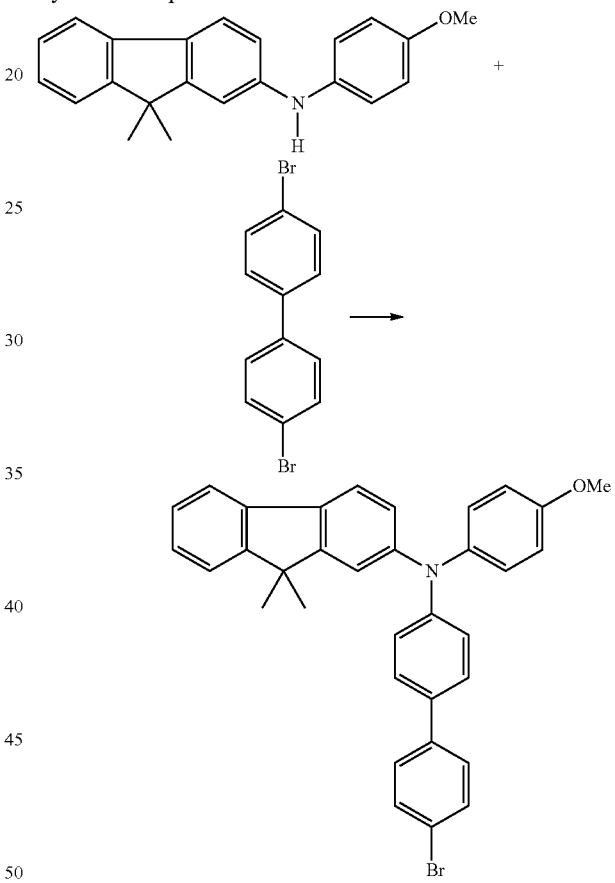

Product from a) (4.70 g; 10.0 mmol) and 4,4'-dibromobiphenyl (7.8 g; 25 mmol) were added to a solution of t-BuONa (1.15 g; 12 mmol) in 50 ml of toluene under nitrogen. Pd$_2$(dba)$_3$ (0.64 g; 0.7 mmol) and DPPF (0.78 g; 1.4 mmol) were added, and the reaction mixture was left to stir at 100° C. for 7 hours. After the reaction mixture had been quenched with ice-water, the precipitated solid was filtered off and it was dissolved in ethyl acetate. The organic phase was washed with water and dried over Na$_2$SO$_4$. After purifying the crude product by column chromatography (eluent: 1% ethyl acetate/hexane), a pale yellow solid was obtained (4.5 g, yield: 82%).

$^1$H NMR (400 MHz, DMSO-d$_6$): 7.70-7.72 (d, 2H), 7.54-7.58 (m, 6H), 7.47-7.48 (d, 1H), 7.21-7.32 (m, 3H), 7.09-7.12 (m, 2H), 6.94-6.99 (m, 4H), 3.76 (s, 3H), 1.36 (s, 6H).

Synthesis Step I-R3:

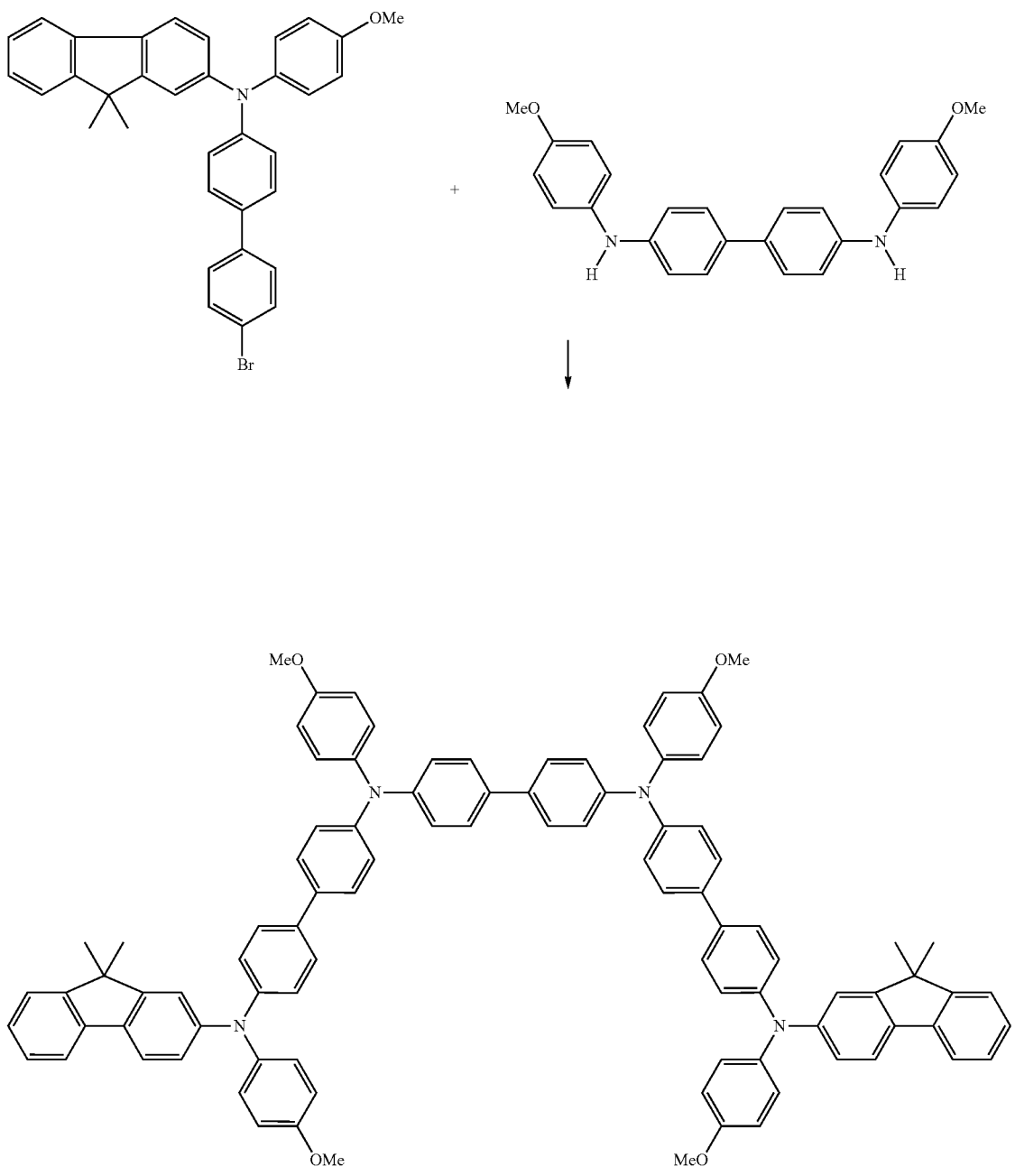

ID453

N[4],N[4']-Bis(4-methoxyphenyl)biphenyl-4,4'-diamine (0.60 g; 1.5 mmol) and product from the preceding synthesis step I-R2 (1.89 g; 3.5 mmol) were added under nitrogen to a solution of t-BuONa (0.48 g; 5.0 mmol) in 30 ml of o-xylene. Palladium acetate (0.04 g; 0.18 mmol) and P(t-Bu)$_3$ in a 10% by weight solution in hexane (0.62 ml; 0.21 mmol) were added, and the reaction mixture was stirred at 125° C. for 6 hours. Subsequently, the mixture was diluted with 100 ml of toluene and filtered through Celite®. The organic phase was dried over Na$_2$SO$_4$ and the resulting solid was purified by column chromatography (eluent: 10% ethyl acetate/hexane). This was followed by reprecipitation from THF/methanol to obtain a pale yellow solid (1.6 g, yield: 80%).

$^1$H NMR (400 MHz, DMSO-d$_6$): 7.67-7.70 (d, 4H), 7.46-7.53 (m, 14H), 7.21-7.31 (m, 4H), 7.17-7.18 (d, 2H), 7.06-7.11 (m, 8H), 6.91-7.01 (m, 22H), 3.75 (s, 12H), 1.35 (s, 12H).

Further compounds of the formula I for use in accordance with the invention:

The compounds listed below were obtained analogously to the syntheses described above:

Synthesis Example 4
Compound ID320
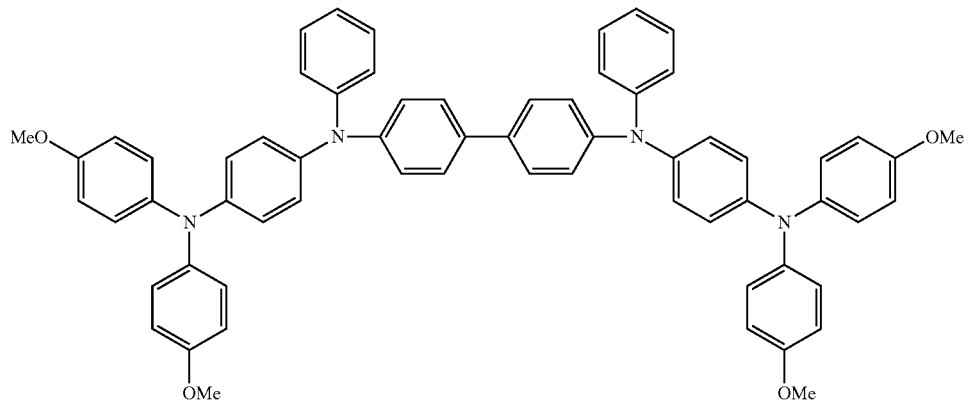 [SMILES: COc1ccc(N(c2ccc(OC)cc2)c2ccc(N(c3ccccc3)c3ccc(-c4ccc(N(c5ccccc5)c5ccc(N(c6ccc(OC)cc6)c6ccc(OC)cc6)cc5)cc4)cc3)cc2)cc1]
$^1$H NMR (300 MHz, THF-$d_8$): δ 7.43-7.46 (d, 4H), 7.18-7.23 (t, 4H), 7.00-7.08 (m, 16H), 6.81-6.96 (m, 18H), 3.74 (s, 12H)
Synthesis Example 5
Compound ID321
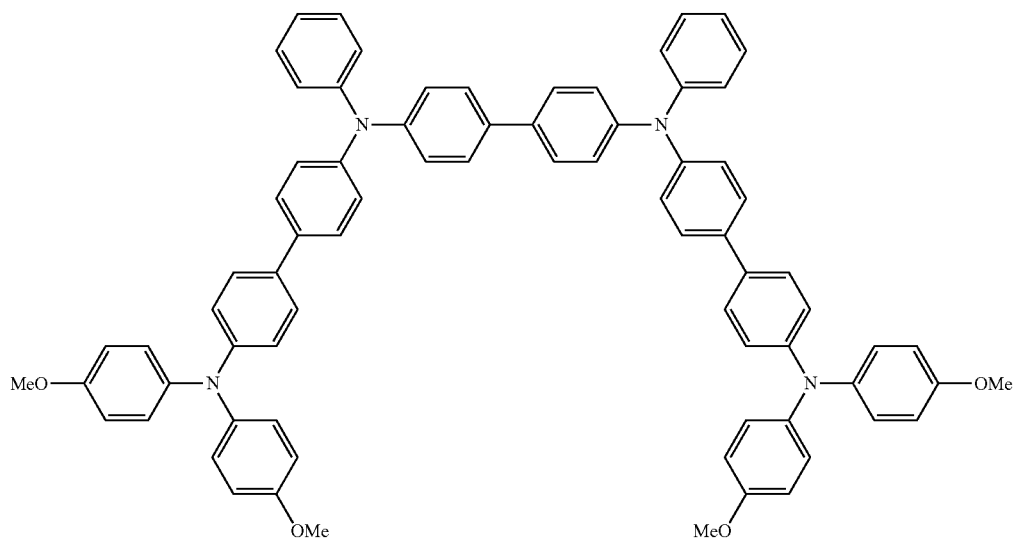 [SMILES: COc1ccc(N(c2ccc(OC)cc2)c2ccc(-c3ccc(N(c4ccccc4)c4ccc(-c5ccc(N(c6ccccc6)c6ccc(-c7ccc(N(c8ccc(OC)cc8)c8ccc(OC)cc8)cc7)cc6)cc5)cc4)cc3)cc2)cc1]
$^1$H NMR (300 MHz, THF-$d_8$): δ 7.37-7.50 (t, 8H) 7.37-7.40 (d, 4H), 7.21-7.26 (d, 4H), 6.96-7.12 (m, 22H), 6.90-6.93 (d, 4H), 6.81-6.84 (d, 8H), 3.74 (s, 12H)

Synthesis Example 6
Compound ID366
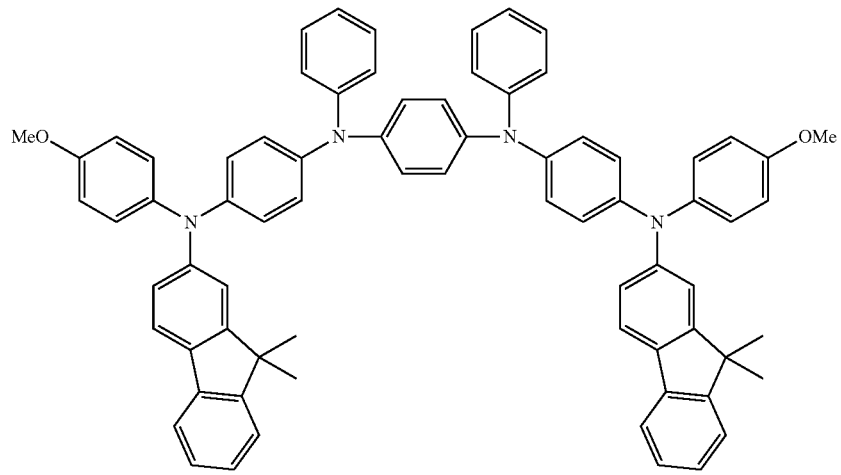 [SMILES: COc1ccc(N(c2ccc(N(c3ccccc3)c3ccc(N(c4ccccc4)c4ccc(N(c5ccc(OC)cc5)c5ccc6c(c5)C(C)(C)c5ccccc5-6)cc4)cc3)cc2)c2ccc3c(c2)C(C)(C)c2ccccc2-3)cc1]
$^1$H NMR (400 MHz, DMSO-d$_6$): δ 7.60-7.70 (t, 4H), 7.40-7.55 (d, 2H), 7.17-7.29 (m, 8H), 7.07-7.09 (t, 4H), 7.06 (s, 2H), 6.86-7.00 (m, 24H), 3.73 (s, 6H), 1.31 (s, 12H)
Synthesis Example 7
Compound ID368
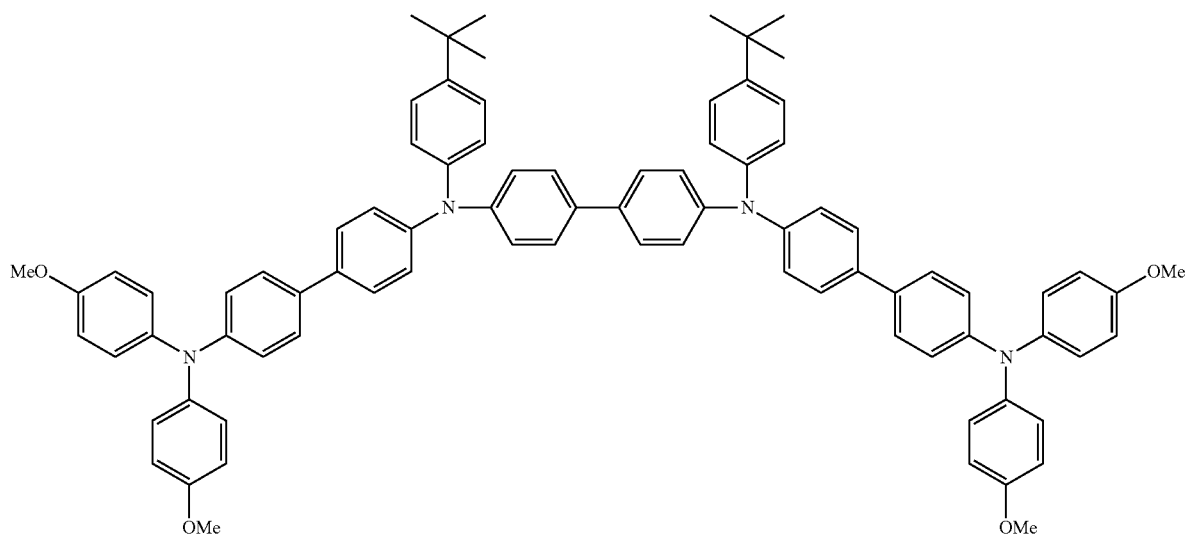 [SMILES: COc1ccc(N(c2ccc(OC)cc2)c2ccc(-c3ccc(N(c4ccc(-c5ccc(N(c6ccc(-c7ccc(N(c8ccc(OC)cc8)c8ccc(OC)cc8)cc7)cc6)c6ccc(C(C)(C)C)cc6)cc5)cc4)c4ccc(C(C)(C)C)cc4)cc3)cc2)cc1]
$^1$H NMR (400 MHz, DMSO-d$_6$): δ 7.48-7.55 (m, 8H), 7.42-7.46 (d, 4H), 7.33-7.28 (d, 4H), 6.98-7.06 (m, 20H), 6.88-6.94 (m, 8H), 6.78-6.84 (d, 4H), 3.73 (s, 12H), 1.27 (s, 18H)

Synthesis Example 8
Compound ID369
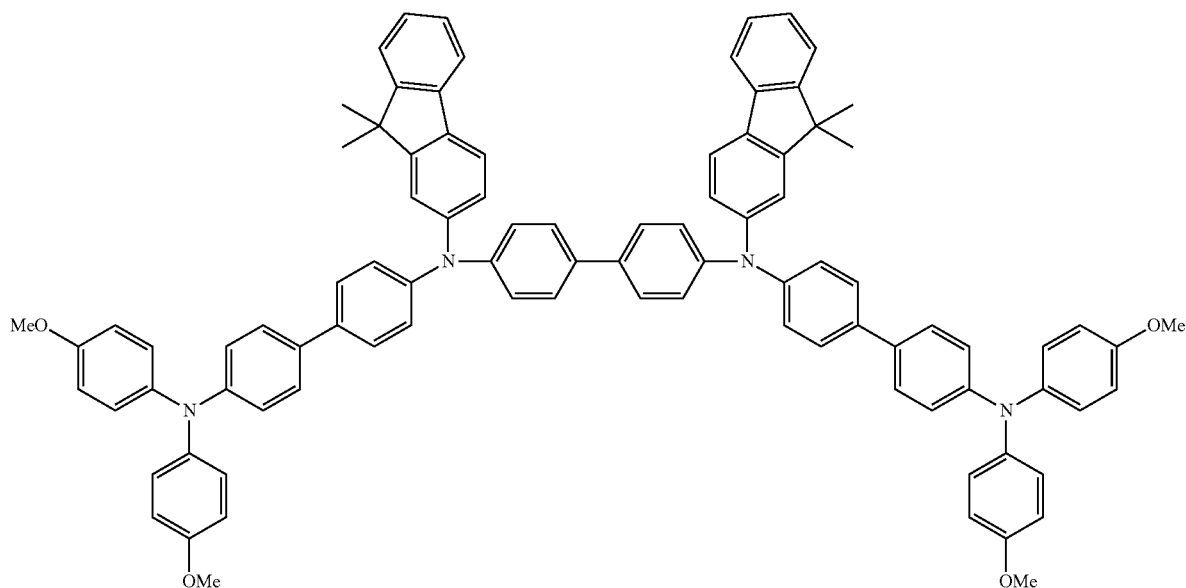 [SMILES: COc1ccc(N(c2ccc(OC)cc2)c2ccc(-c3ccc(N(c4ccc(-c5ccc(N(c6ccc(-c7ccc(N(c8ccc(OC)cc8)c8ccc(OC)cc8)cc7)cc6)c6ccc7c(c6)C(C)(C)c6ccccc6-7)cc5)cc4)c4ccc5c(c4)C(C)(C)c4ccccc4-5)cc3)cc2)cc1]
$^1$H NMR (400 MHz, THF-d$_8$): δ 7.60-7.70 (t, 4H), 7.57-7.54 (d, 4H), 7.48-7.51 (d, 4H), 7.39-7.44 (t, 6H), 7.32-7.33 (d, 2H), 7.14-7.27 (m, 12H), 7.00-7.10 (m, 10H), 6.90-6.96 (m, 4H), 6.80-6.87 (m, 8H), 3.75 (s, 12H), 1.42 (s, 12H)
Synthesis Example 9
Compound ID446
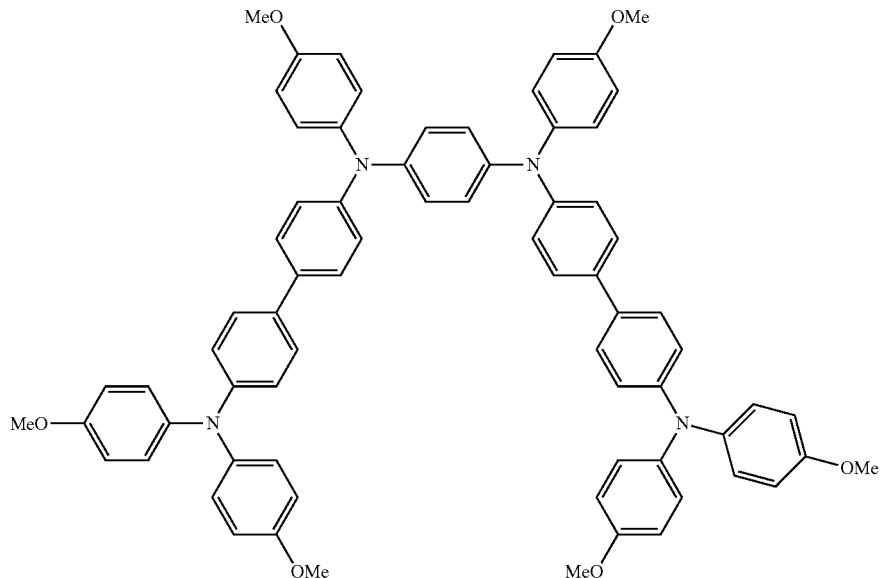 [SMILES: COc1ccc(N(c2ccc(OC)cc2)c2ccc(-c3ccc(N(c4ccc(OC)cc4)c4ccc(N(c5ccc(OC)cc5)c5ccc(-c6ccc(N(c7ccc(OC)cc7)c7ccc(OC)cc7)cc6)cc5)cc4)cc3)cc2)cc1]
$^1$H NMR (400 MHz, dmso-d$_6$): δ 7.39-7.44 (m, 8H), 7.00-7.07 (m, 13H), 6.89-6.94 (m, 19H), 6.79-6.81 (d, 4H), 3.73 (s, 18H)

Synthesis Example 10
Compound ID450
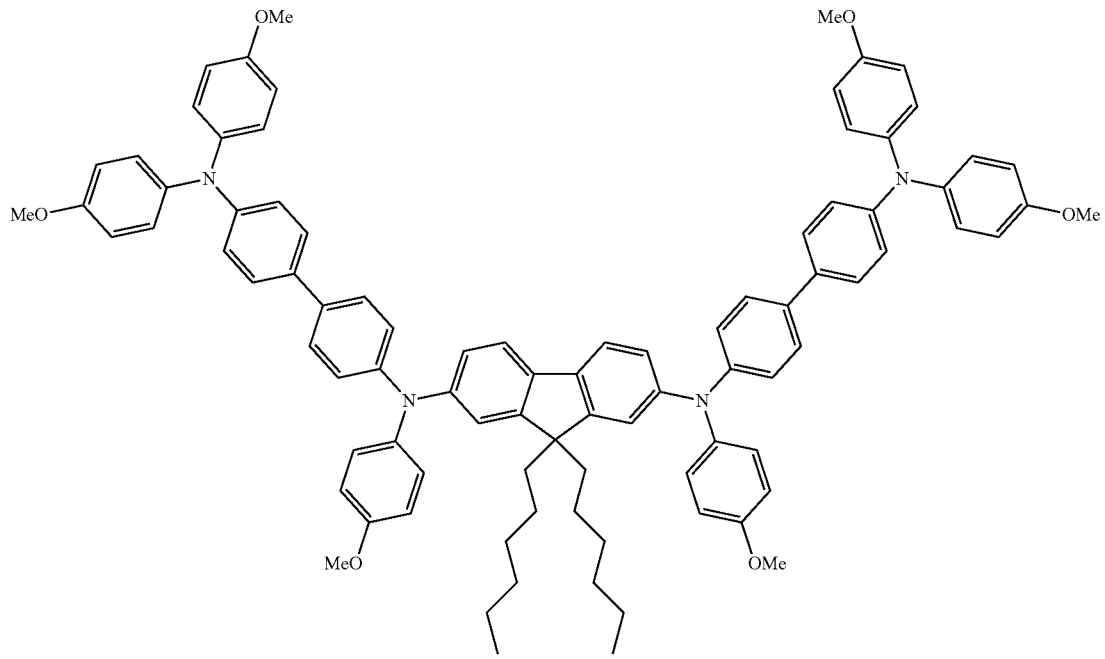 [SMILES: CCCCCCC1(CCCCCC)c2cc(N(c3ccc(OC)cc3)c3ccc(-c4ccc(N(c5ccc(OC)cc5)c5ccc(OC)cc5)cc4)cc3)ccc2-c2ccc(N(c3ccc(OC)cc3)c3ccc(-c4ccc(N(c5ccc(OC)cc5)c5ccc(OC)cc5)cc4)cc3)cc21]
$^1$H NMR (400 MHz, dmso-d$_6$): δ 7.55-7.57 (d, 2H), 7.39-7.45 (m, 8H), 6.99-7.04 (m, 15H), 6.85-6.93 (m, 19H), 6.78-6.80 (d, 4H), 3.72 (s, 18H), 1.68-1.71 (m, 6H), 1.07 (m, 6H), 0.98-0.99 (m, 8H), 0.58 (m, 6H)
Synthesis Example 11
Compound ID452
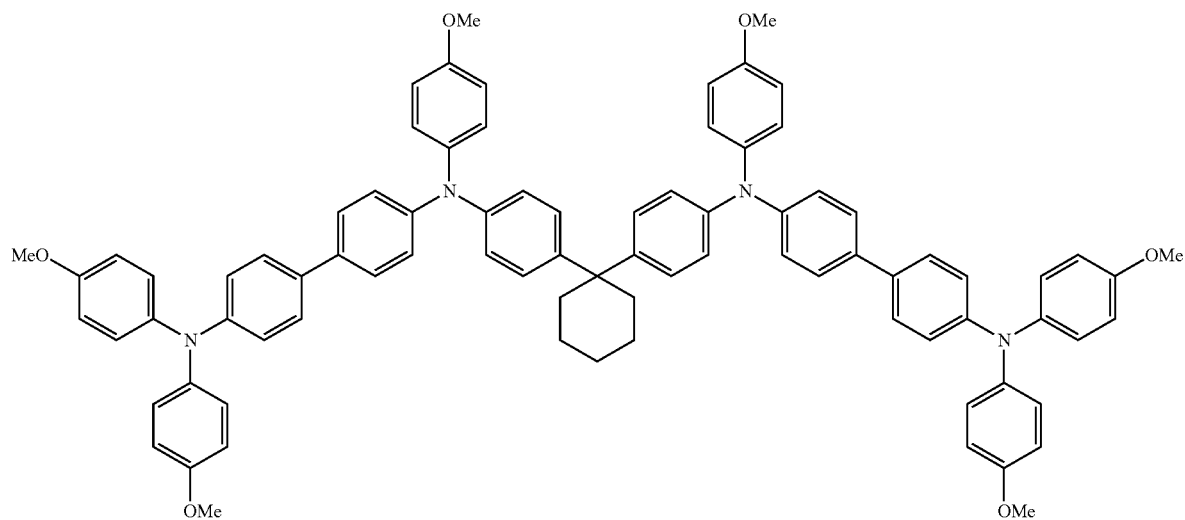 [SMILES: COc1ccc(N(c2ccc(OC)cc2)c2ccc(-c3ccc(N(c4ccc(OC)cc4)c4ccc(C5(c6ccc(N(c7ccc(OC)cc7)c7ccc(-c8ccc(N(c9ccc(OC)cc9)c9ccc(OC)cc9)cc8)cc7)cc6)CCCCC5)cc4)cc3)cc2)cc1]
$^1$H NMR (400 MHz, DMSO-d$_6$): δ 7.38-7.44 (m, 8H), 7.16-7.19 (d, 4H), 6.99-7.03 (m, 12H), 6.85-6.92 (m, 20H), 6.77-6.79 (d, 4H), 3.74 (s, 18H), 2.00-2.25 (m, 4H), 1.25-1.50 (m, 6H)

Synthesis Example 12
Compound ID480
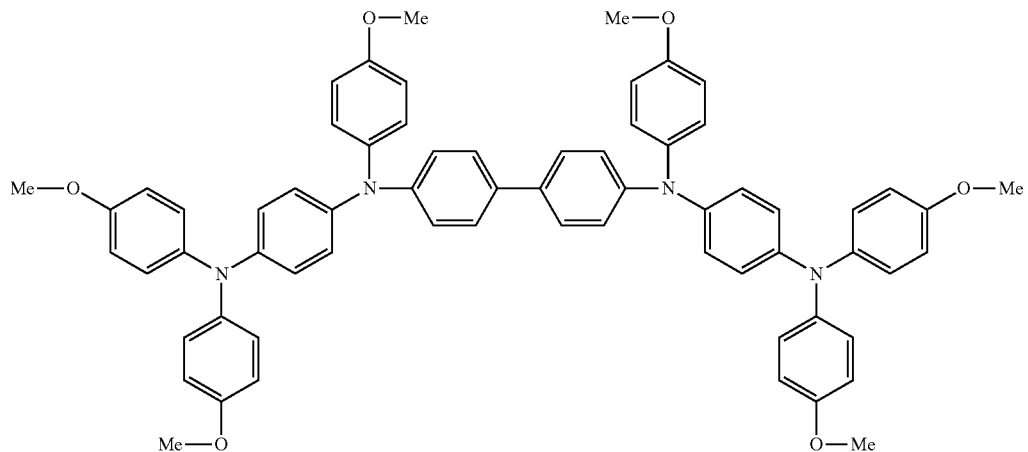 [SMILES: COc1ccc(N(c2ccc(OC)cc2)c2ccc(N(c3ccc(OC)cc3)c3ccc(-c4ccc(N(c5ccc(OC)cc5)c5ccc(N(c6ccc(OC)cc6)c6ccc(OC)cc6)cc5)cc4)cc3)cc2)cc1]
$^1$H NMR (400 MHz, DMSO-$d_6$): δ 7.40-7.42 (d, 4H), 7.02-7.05 (d, 4H), 6.96-6.99 (m, 28H), 6.74-6.77 (d, 4H), 3.73 (s, 6H), 3.71 (s, 12H)
Synthesis Example 13
Compound ID518
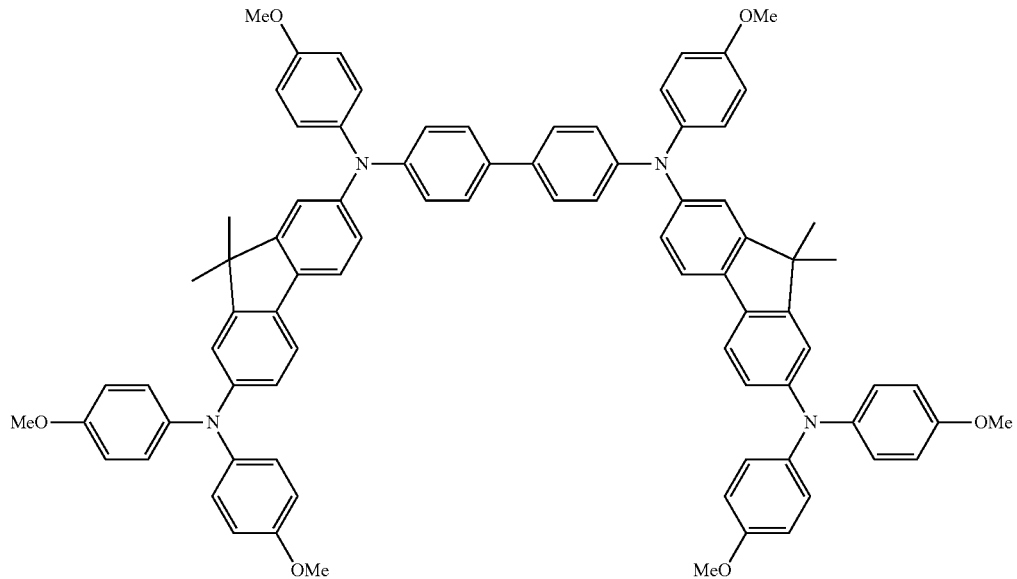 [SMILES: COc1ccc(N(c2ccc(OC)cc2)c2ccc3c(c2)C(C)(C)c2cc(N(c4ccc(OC)cc4)c4ccc(-c5ccc(N(c6ccc(OC)cc6)c6ccc7c(c6)C(C)(C)c6cc(N(c8ccc(OC)cc8)c8ccc(OC)cc8)ccc6-7)cc5)cc4)ccc2-3)cc1]
$^1$H NMR (400 MHz, DMSO-$d_6$): 7.46-7.51 (m, 8H), 7.10-7.12 (d, 2H), 7.05-7.08 (d, 4H), 6.97-7.00 (d, 8H), 6.86-6.95 (m, 20H), 6.69-6.72 (m, 2H), 3.74 (s, 6H), 3.72 (s, 12H), 1.24 (t, 12H)

Synthesis Example 14
Compound ID519
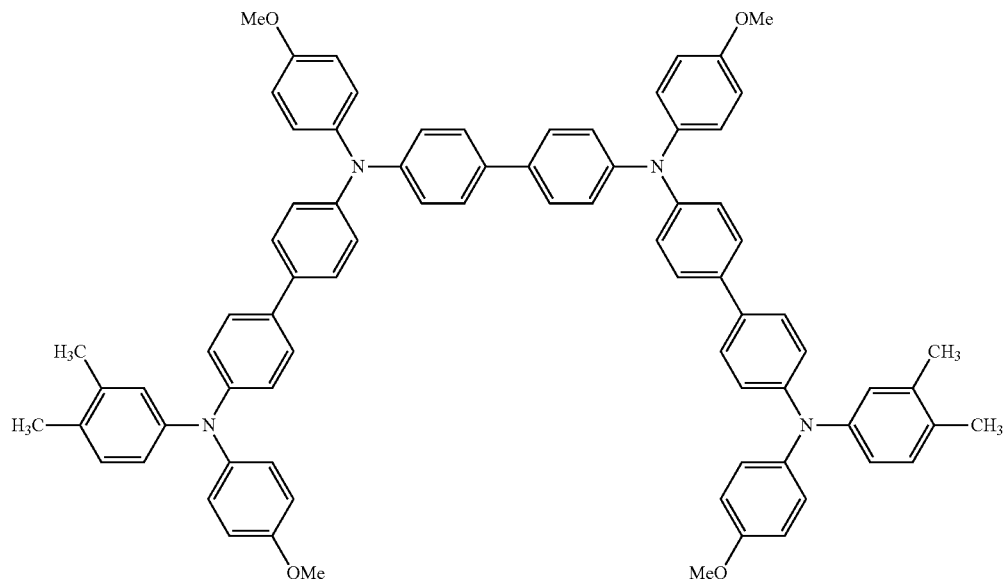
$^1$H NMR (400 MHz, DMSO-d$_6$): 7.44-7.53 (m, 12H), 6.84-7.11 (m, 32H), 6.74-6.77 (d, 2H), 3.76 (s, 6H), 3.74 (s, 6H), 2.17 (s, 6H), 2.13 (s, 6H)
Synthesis Example 15
Compound ID521
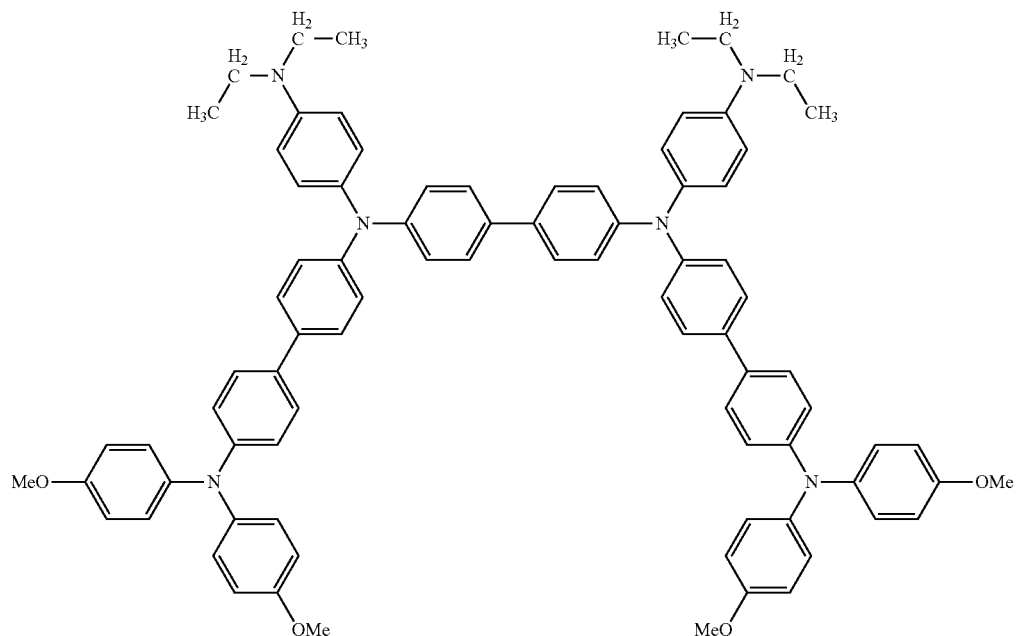 [SMILES: CCN(CC)c1ccc(N(c2ccc(-c3ccc(N(c4ccc(OC)cc4)c4ccc(OC)cc4)cc3)cc2)c2ccc(-c3ccc(N(c4ccc(-c5ccc(N(c6ccc(OC)cc6)c6ccc(OC)cc6)cc5)cc4)c4ccc(N(CC)CC)cc4)cc3)cc2)cc1]
$^1$H NMR (400 MHz, THF-d$_6$): 7.36-7.42 (m, 12H), 6.99-7.07 (m, 20H), 6.90-6.92 (d, 4H), 6.81-6.84 (m, 8H), 6.66-6.69 (d, 4H), 3.74 (s, 12H), 3.36-3.38 (q, 8H), 1.41-1.17 (t, 12H)

Synthesis Example 16
Compound ID522
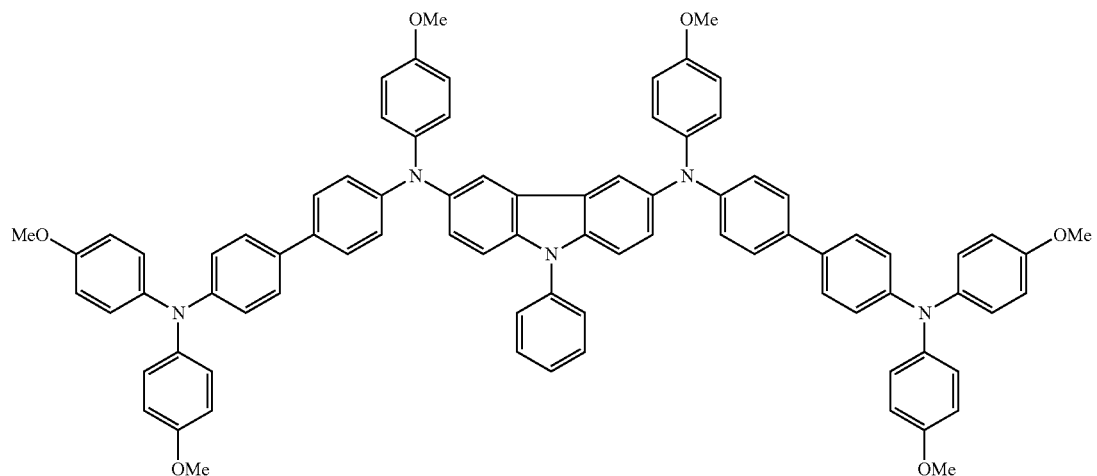 [SMILES: COc1ccc(N(c2ccc(OC)cc2)c2ccc(-c3ccc(N(c4ccc(OC)cc4)c4ccc5c(c4)c4cc(N(c6ccc(OC)cc6)c6ccc(-c7ccc(N(c8ccc(OC)cc8)c8ccc(OC)cc8)cc7)cc6)ccc4n5-c4ccccc4)cc3)cc2)cc1]
$^1$H NMR (400 MHz, DMSO-d$_6$): 7.65 (s, 2H), 7.52-7.56 (t, 2H), 7.44-7.47 (t, 1H), 7.37-7.39 (d, 2H), 7.20-7.22 (m, 10H), 7.05-7.08 (dd, 2H), 6.86-6.94 (m, 8H), 6.79-6.80-6.86 (m, 12H), 6.68-6.73, (dd, 8H), 6.60-6.62 (d, 4H), 3.68 (s, 12H), 3.62 (s, 6H)
Synthesis Example 17
Compound ID523
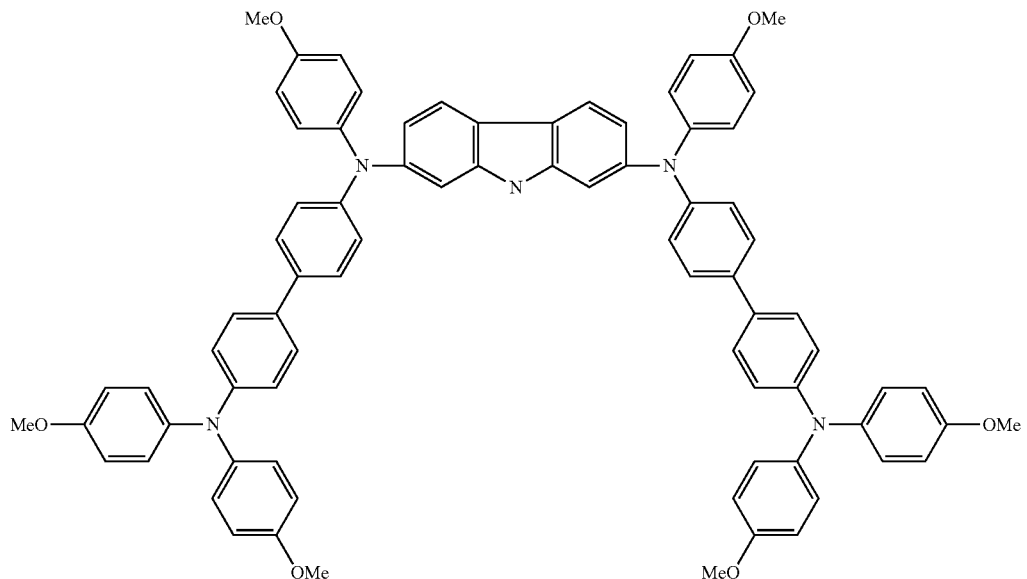 [SMILES: COc1ccc(N(c2ccc(OC)cc2)c2ccc(-c3ccc(N(c4ccc(OC)cc4)c4ccc5c(c4)[nH]c4cc(N(c6ccc(OC)cc6)c6ccc(-c7ccc(N(c8ccc(OC)cc8)c8ccc(OC)cc8)cc7)cc6)ccc45)cc3)cc2)cc1]
$^1$H NMR (400 MHz, THF-d$_8$): 7.54-7.56 (d, 2H), 7.35-7.40 (dd, 8H), 7.18 (s, 2H), 7.00-7.08 (m, 18H), 6.90-6.92 (d, 4H), 6.81-6.86 (m, 12H), 3.75 (s, 6H), 3.74 (s, 12H), 3.69 (s, 2H)

Synthesis Example 18
Compound ID565
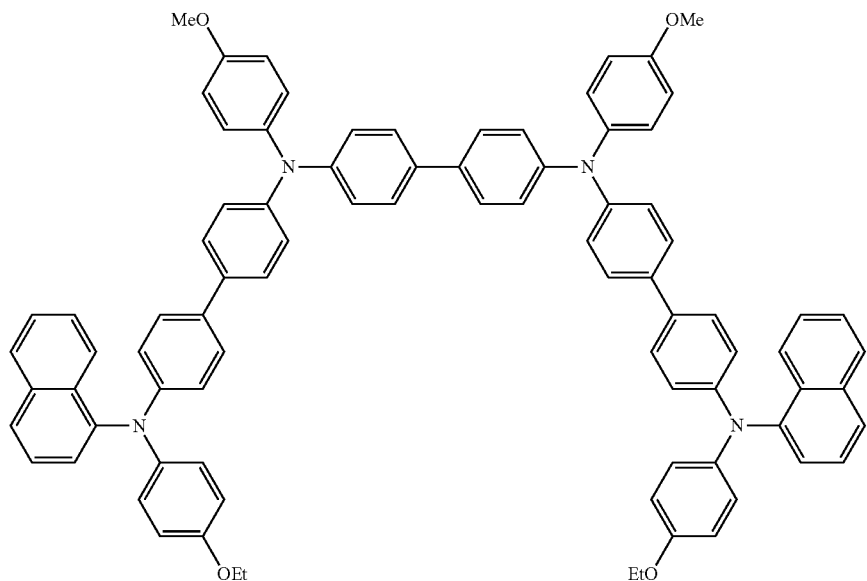 [SMILES: CCOc1ccc(N(c2ccc(-c3ccc(N(c4ccc(OC)cc4)c4ccc(-c5ccc(N(c6ccc(OC)cc6)c6ccc(-c7ccc(N(c8ccc(OCC)cc8)c8cccc9ccccc89)cc7)cc6)cc5)cc4)cc3)cc2)c2cccc3ccccc23)cc1]
$^1$H NMR (400 MHz, THF-d$_8$): 7.97-8.00 (d, 2H), 7.86-7.89 (d, 2H), 7.73-7.76 (d, 2H), 7.28-7.47 (m, 20H), 7.03-7.08 (m, 16H), 6.78-6.90 (m, 12H), 3.93-3.99 (q, 4H), 3.77 (s, 6H), 1.32-1.36 (s, 6H)
Synthesis Example 19
Compound ID568
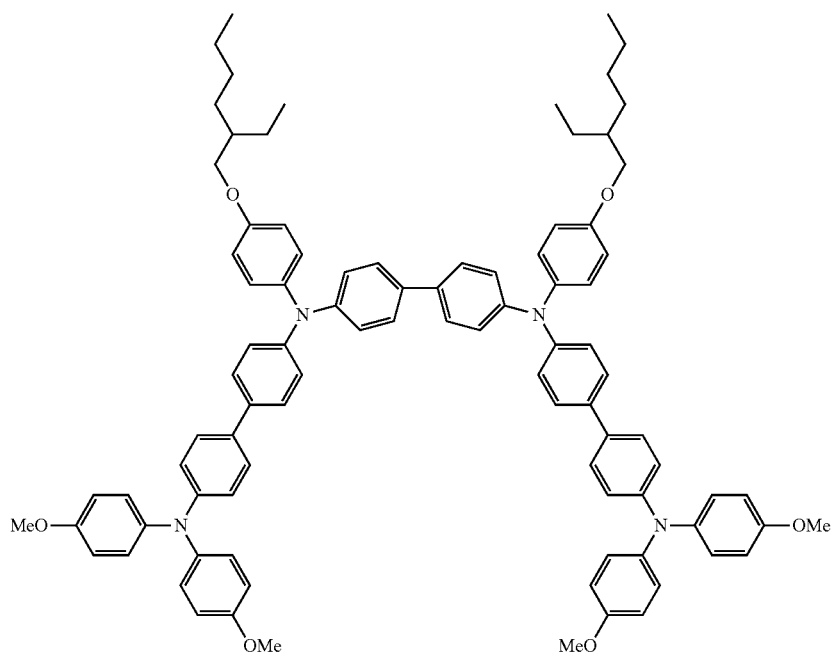 [SMILES: CCCCC(CC)COc1ccc(N(c2ccc(-c3ccc(N(c4ccc(OC)cc4)c4ccc(OC)cc4)cc3)cc2)c2ccc(-c3ccc(N(c4ccc(OCC(CC)CCCC)cc4)c4ccc(-c5ccc(N(c6ccc(OC)cc6)c6ccc(OC)cc6)cc5)cc4)cc3)cc2)cc1]
$^1$H NMR (400 MHz, DMSO-d$_6$): 7.41-7.51 (m, 12H), 6.78-7.06 (m, 36H), 3.82-3.84 (d, 4H), 3.79 (s, 12H), 1.60-1.80 (m, 2H), 0.60-1.60 (m, 28H)

Synthesis Example 20
Compound ID569
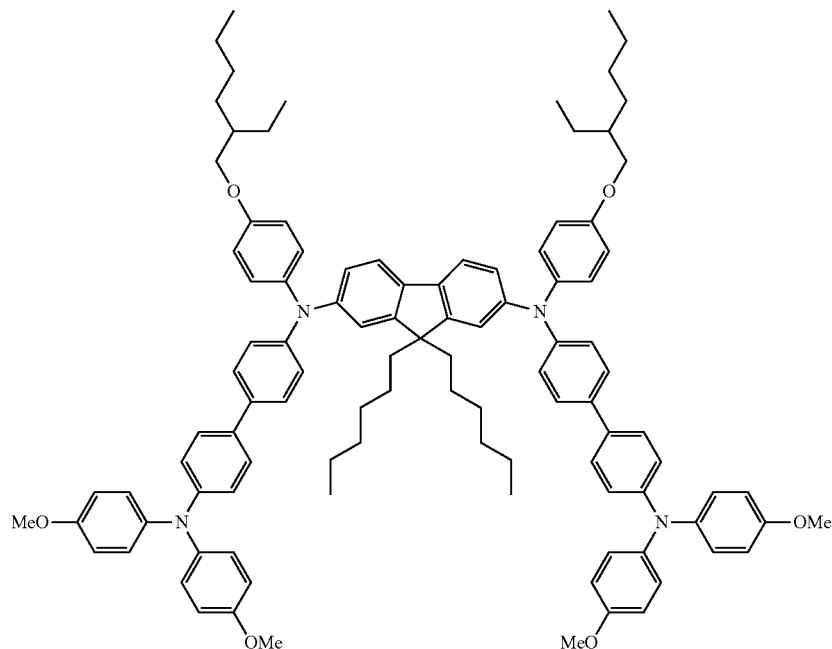 [SMILES: CCCCCCC1(CCCCCC)c2cc(N(c3ccc(OCC(CC)CCCC)cc3)c3ccc(-c4ccc(N(c5ccc(OC)cc5)c5ccc(OC)cc5)cc4)cc3)ccc2-c2ccc(N(c3ccc(OCC(CC)CCCC)cc3)c3ccc(-c4ccc(N(c5ccc(OC)cc5)c5ccc(OC)cc5)cc4)cc3)cc21]
$^1$H NMR (400 MHz, DMSO-d$_6$): 7.40-7.70 (m, 10H), 6.80-7.20 (m, 36H), 3.92-3.93 (d, 4H), 2.81 (s, 12H), 0.60-1.90 (m, 56H)
Synthesis Example 21
Compound ID572
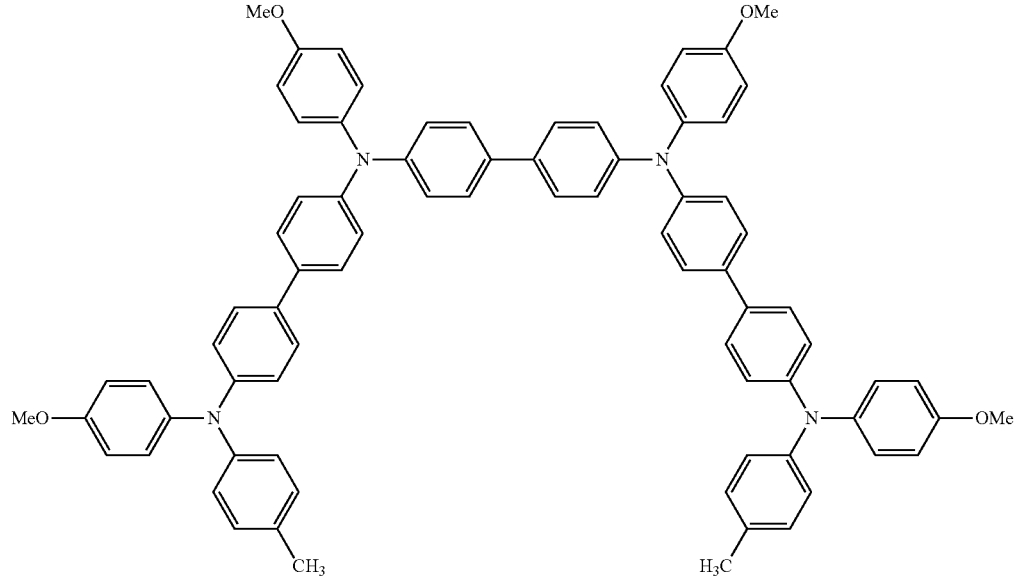 [SMILES: COc1ccc(N(c2ccc(C)cc2)c2ccc(-c3ccc(N(c4ccc(OC)cc4)c4ccc(-c5ccc(N(c6ccc(OC)cc6)c6ccc(-c7ccc(N(c8ccc(C)cc8)c8ccc(OC)cc8)cc7)cc6)cc5)cc4)cc3)cc2)cc1]
$^1$H NMR (400 MHz, THF-d$_8$): 7.39-7.47 (m, 12H), 7.03-7.11 (m, 20H), 6.39-6.99 (m, 8H), 6.83-6.90 (m, 8H), 3.78 (s, 6H), 3.76 (s, 6H), 2.27 (s, 6H)

Synthesis Example 22
Compound ID573
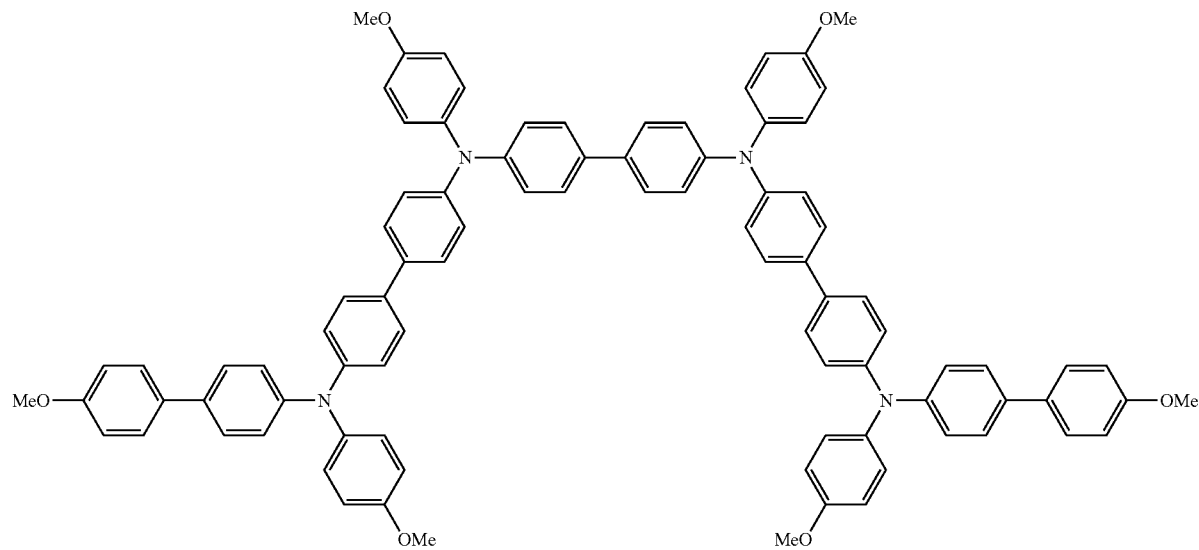 [SMILES: COc1ccc(-c2ccc(N(c3ccc(OC)cc3)c3ccc(-c4ccc(N(c5ccc(OC)cc5)c5ccc(-c6ccc(N(c7ccc(OC)cc7)c7ccc(-c8ccc(N(c9ccc(OC)cc9)c9ccc(-c%10ccc(OC)cc%10)cc9)cc8)cc7)cc6)cc5)cc4)cc3)cc2)cc1]
$^1$H NMR (400 MHz, THF-d$_8$): 7.43-7.51 (m, 20H), 7.05-7.12 (m, 24H), 6.87-6.95 (m, 12H), 3.79 (s, 6H), 3.78 (s, 12H)
Synthesis Example 23
Compound ID575
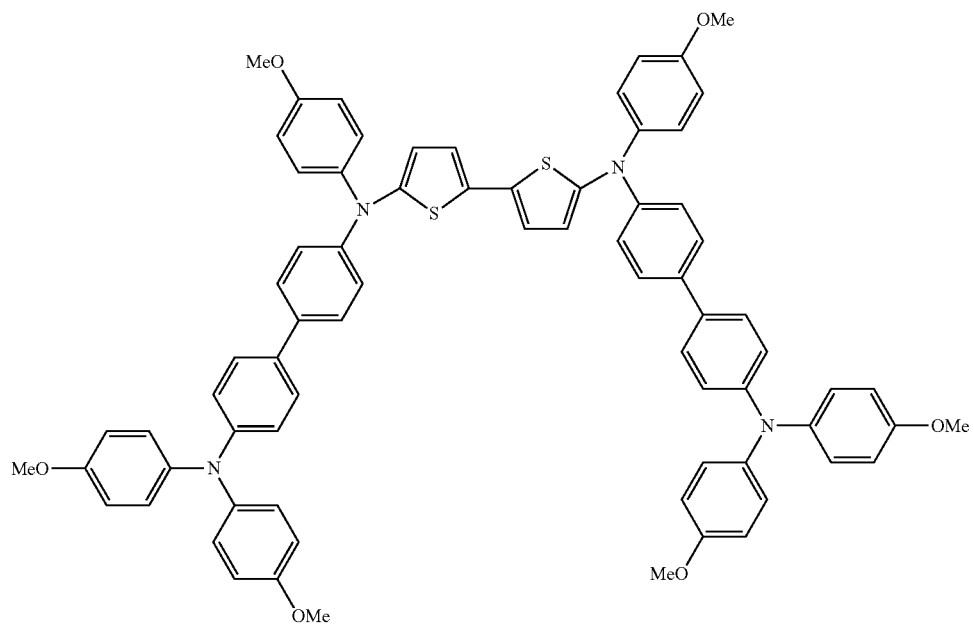 [SMILES: COc1ccc(N(c2ccc(OC)cc2)c2ccc(-c3ccc(N(c4ccc(OC)cc4)c4ccc(-c5ccc(N(c6ccc(OC)cc6)c6ccc(-c7ccc(N(c8ccc(OC)cc8)c8ccc(OC)cc8)cc7)cc6)s5)s4)cc3)cc2)cc1]
$^1$H NMR (400 MHz, DMSO-d$_6$): 7.35-7.55 (m, 8H), 7.15-7.45 (m, 4H), 6.85-7.10 (m, 26H), 6.75-6.85 (d, 4H), 6.50-6.60 (d, 2H), 3.76 (s, 6H), 3.74 (s, 12H)

Synthesis Example 24
Compound ID629
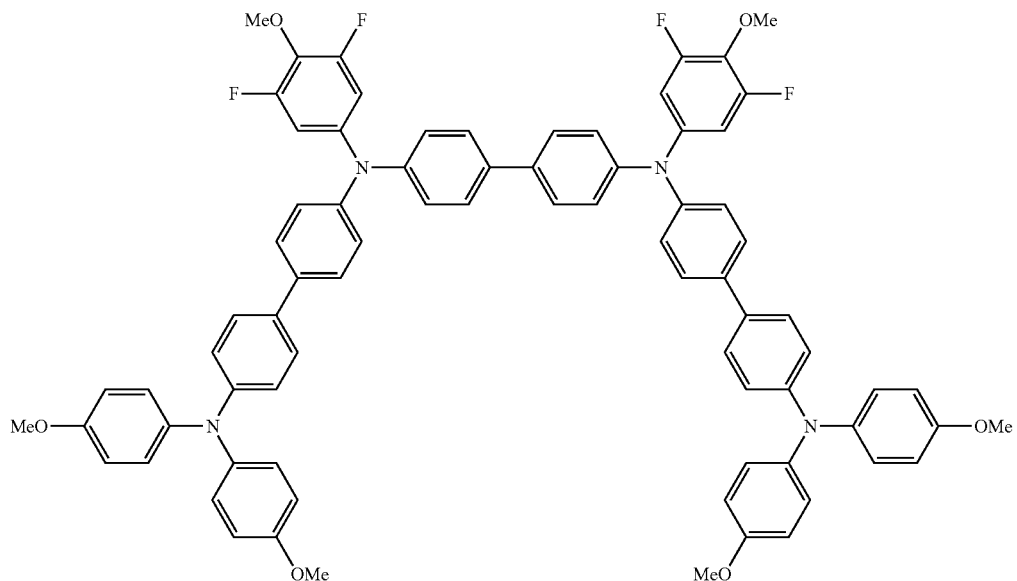 [SMILES: COc1ccc(N(c2ccc(OC)cc2)c2ccc(-c3ccc(N(c4ccc(-c5ccc(N(c6ccc(-c7ccc(N(c8ccc(OC)cc8)c8ccc(OC)cc8)cc7)cc6)c6cc(F)c(OC)c(F)c6)cc5)cc4)c4cc(F)c(OC)c(F)c4)cc3)cc2)cc1]
¹H NMR (400 MHz, THF-d₈): 7.50-7.56 (dd, 8H), 7.38-7.41 (dd, 4H), 7.12-7.16 (d, 8H), 7.02-7.04 (dd, 8H), 6.91-6.93 (d, 4H), 6.82-6.84 (dd, 8H), 6.65-6.68 (d, 4H) 3.87 (s, 6H), 3.74 (s, 12H)
Synthesis Example 25
Compound ID631
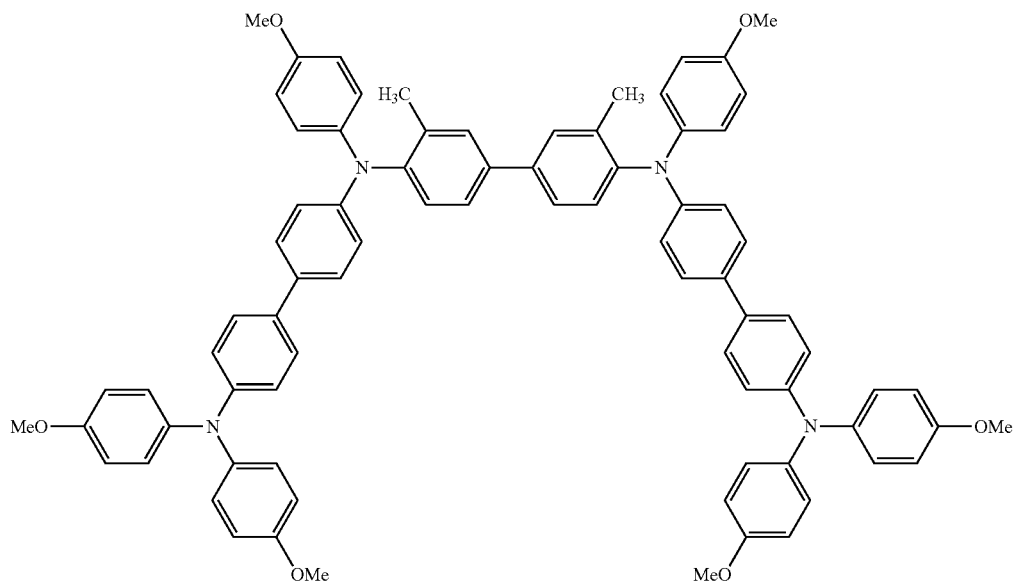 [SMILES: COc1ccc(N(c2ccc(OC)cc2)c2ccc(-c3ccc(N(c4ccc(OC)cc4)c4ccc(-c5ccc(N(c6ccc(OC)cc6)c6ccc(-c7ccc(N(c8ccc(OC)cc8)c8ccc(OC)cc8)cc7)cc6)c(C)c5)cc4C)cc3)cc2)cc1]
¹H NMR (400 MHz, THF-de): 7.52 (d, 2H), 7.43-7.47 (dd, 2H), 7.34-7.38 (m, 8H), 7.12-7.14 (d, 2H), 6.99-7.03 (m, 12H), 6.81-6.92 (m, 20H), 3.74 (s, 18H), 2.10 (s, 6H)

Spectroscopic Determination of the P-Doping of Spiro-MeOTAD in Solution

Finally, studies were carried out as to what extent the above-described p-doping by metal oxides can be detected spectroscopically. For this purpose, 20 mg of spiro-MeO-TAD were added to 628 mg of solvent (cyclohexanone), which corresponds to a concentration of 148 mM/l. The mixture was heated to 60° C. until complete dissolution and then cooled to room temperature. Subsequently, 30 µl of a 0.3 molar LiTFSI solution in cyclohexanone were added. The particular dopant was added to this mixture in portions of 1 to 3 mg with shaking, until a more or less complete solution of the dopant in the particular mixture formed.

Figure 6:
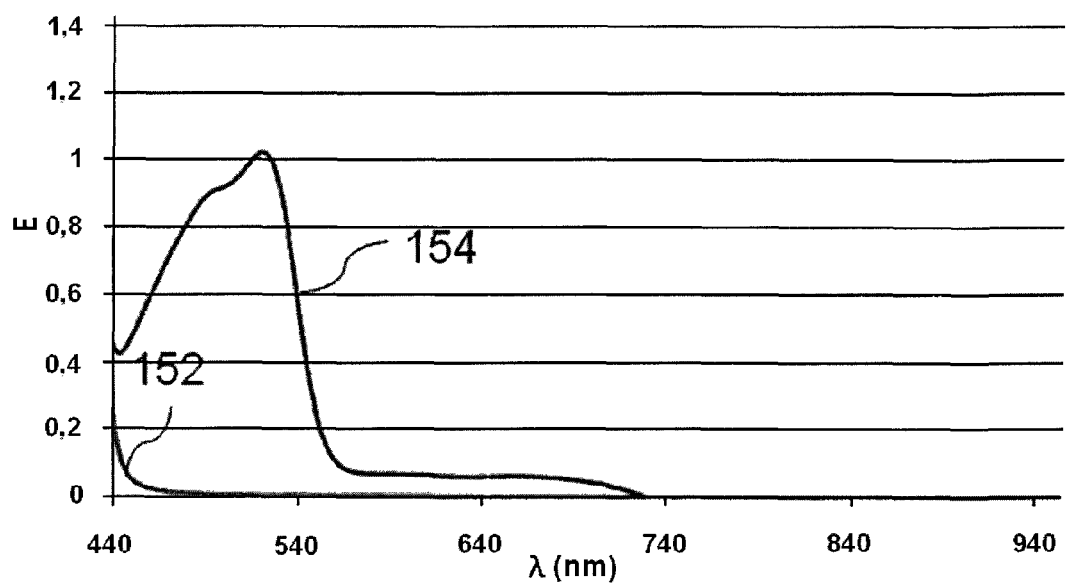
FIG. 6 extinction curves of spiro-MeOTAD solutions with and without metal oxide doping.

The solutions prepared in this way were analyzed spectroscopically. One example of such a spectroscopic measurement is shown in FIG. 6. The absorbance E is plotted on the vertical axis, and the wavelength on the horizontal axis. The curve 152 denotes an absorbance measurement of a sample of the type described above, without addition of a metal oxide as a dopant. The curve 154 denotes an absorbance measurement on a sample in which 3 mg of rhenium oxide have been added according to the above method.

As is discernible from FIG. 6, the sample with the metal oxide doping exhibits a distinct absorbance maximum at approximately 530 nm, in contrast to the undoped sample. It is accordingly possible, for example, to employ the absorbance of the mixtures comprising the oxidized hole conductors at 532 nm or at 1000 nm in a 1 mm cuvette as a quantitative measure of the p-doping of the hole conductor spiro-MeOTAD.

LIST OF REFERENCE NUMERALS

110 Photovoltaic element
112 Dye solar cell
114 Substrate
116 First electrode
118 Blocking layer
120 n-semiconductive material
122 Dye
124 Carrier element
126 p-semiconductor
128 Matrix material
130 Metal oxide
132 Second electrode
134 Layer structure
136 Encapsulation
138 Fermi level
140 HOMO
142 LUMO
144 Characteristic for comparative sample without metal oxide, t=0
146 Characteristic for comparative sample without metal oxide, t=2 days
148 Characteristic for example 1 sample, t=0
150 Characteristic for example 1 sample, t=2 days
152 Solution without rhenium oxide
154 Solution with rhenium oxide

The invention claimed is:

1. A photovoltaic element, comprising:
a first electrode;
an n-semiconductive metal oxide;
an electromagnetic radiation-absorbing;
a solid organic p-semiconductor; and
a second electrode,
wherein
the solid organic p-semiconductor comprises:
a metal oxide;
a lithium salt; and
an organic matrix material;
wherein
in the metal oxide the metal is bonded only to an oxygen or another metal,
the metal oxide is mixed with the organic matrix material; and
a content of the metal oxide in the solid organic p-semiconductor is from 0.5% to 5% by weight, based on a weight of the organic matrix material.

2. The photovoltaic element according to claim 1, wherein the metal oxide is homogeneously distributed in the organic matrix material.

3. The photovoltaic element according to claim 1, wherein the organic matrix material comprises a low molecular weight organic p-semiconductor.

4. The photovoltaic element according to claim 3, wherein the low molecular weight organic p-semiconductor comprises a spiro compound.

5. The photovoltaic element according to claim 3, wherein the low molecular weight organic p-semiconductor is
a spiro compound or
a compound of structural formula:

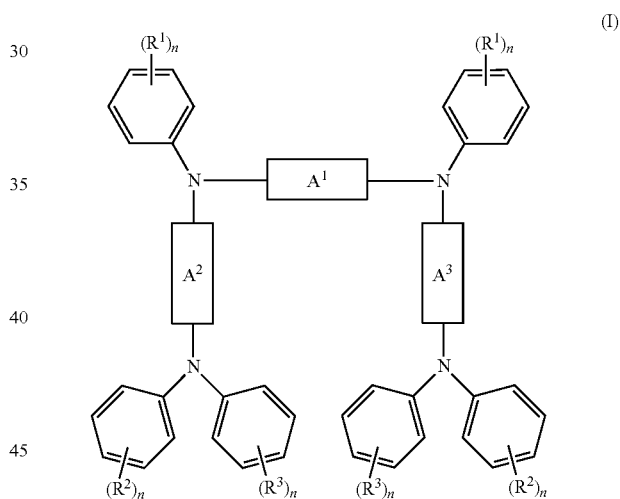

in which
$A^1, A^2, A^3$ are each independently divalent organic units which optionally comprise one, two or three substituted aromatic or heteroaromatic groups, where, when two or three aromatic or heteroaromatic groups are present, two of these groups in each case are joined to one another by a chemical bond, via a divalent alkyl residue, or both;
$R^1, R^2, R^3$ are each independently R, OR, NR$_2$, $A^3$-OR or $A^3$-NR$_2$ substituents;
R is alkyl, aryl or a monovalent organic residue which optionally comprises one, two or three substituted aromatic or heteroaromatic groups, where, when two or three aromatic or heteroaromatic groups are present, two of these groups in each case are joined to one another by a chemical bond, via a divalent alkyl or NR' residue, or both;
R' is alkyl, aryl or a monovalent organic residue which optionally comprises one, two or three substituted aromatic or heteroaromatic groups, where, when two or three aromatic or heteroaromatic groups are present, two of these groups in each case are joined to one another by a chemical bond, via a divalent alkyl residue, or both;

each n is independently a value of 0, 1, 2 or 3, wherein a sum of each n value is at least 2; and at least two of $R^1$, $R^2$ and $R^3$ residues are substituents OR, $NR_2$, or both.

6. The photovoltaic element according to claim 1,
wherein the metal oxide is at least one member selected from the group consisting of: $V_2O_5$; $Nb_2O_5$; $MoO_3$; $MoO_2$; $MoO_x$; $VO_x$; $WO_3$; and $ReO_3$; wherein x in each case is a positive rational number which need not necessarily be an integer.

7. The photovoltaic element according to claim 1, further comprising:
an encapsulation,
wherein the encapsulation shields the photovoltaic element from a surrounding atmosphere.

8. A process for producing a solid organic p-semiconductor of the photovoltaic element according to claim 1, the process comprising:
applying a p-conductive organic matrix material and the metal oxide as a p-dopant together to at least one carrier element from at least one liquid phase.

9. The process according to claim 8,
wherein the p-conductive organic matrix material comprises a low molecular weight organic p-semiconductor.

10. The process according to claim 8,
wherein the liquid phase further comprises a solvent.

11. The process according to claim 8,
wherein the process is performed at least partly in a low-oxygen atmosphere.

12. A process for producing the photovoltaic element according to claim 1, the process comprising:
providing the first electrode, the n-semiconductive metal oxide, the electromagnetic radiation-absorbing dye, the solid organic p-semiconductor and the second electrode.

13. The process according to claim 12,
wherein the solid organic p-semiconductor is produced by a wet chemical process comprising:
applying at least one p-conductive organic matrix material and the metal oxide as a p-dopant together to at least one carrier element from at least one liquid phase; or
by a penetration process comprising:
applying the at least one p-conductive organic matrix material to a carrier element, and
applying the metal oxide to the at least one p-conductive organic matrix material, thereby at least partly penetrating it,
or both by a wet chemical process and a penetration process.

14. The photovoltaic element according to claim 1,
wherein the metal oxide is mixed by dispersing it into the organic matrix material.

15. The photovoltaic element according to claim 1,
wherein the metal oxide is present in the solid organic p-semiconductor from 0.5% to 3%, based on the weight of the organic matrix material.

16. The photovoltaic element according to claim 5,
wherein the spiro compound is a spiro-MeOTAD.

17. The photovoltaic element according to claim 7,
wherein the encapsulation shields at least one selected from the group consisting of the first electrode, the second electrode, and the solid organic p-semiconductor from a surrounding atmosphere.

18. The photovoltaic element according to claim 1, wherein the metal oxide is at least one oxide of at least one transition group metal and is at least one member selected from the group consisting of $ReO_x$; $WO_x$; $CeO_2$; $Ce_2O_3$; $Ce_3O_4$; $C_4CeF_{12}O_{12}S_4$; $CeO_2/Gd$; $CeO_2/Y$; $CrO_3$; $Ta_2O_5$; a CeZr oxide; Ce(IV) tert-butoxide; $Ce(MO_4)_3$; $CeO_4C_{10}H_{36}$; $C_4CeF_{12}S_4$; $CeVO_4$; and $CeO_4Zr$.

19. The photovoltaic element according to claim 1, the lithium salt is an organometallic lithium salt.

20. The photovoltaic element according to claim 1, wherein the lithium salt is $LiN(SO_2CF_3)_2$.

* * * * *